(12) United States Patent
Huang et al.

(10) Patent No.: US 11,854,811 B2
(45) Date of Patent: *Dec. 26, 2023

(54) FINFET DEVICE AND METHOD OF FORMING

(71) Applicant: Taiwan Semiconductor Manufacturing Co., Ltd., Hsinchu (TW)

(72) Inventors: Yi-Min Huang, Tainan (TW); Huai-Tei Yang, Hsinchu (TW); Shih-Chieh Chang, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 190 days.

This patent is subject to a terminal disclaimer.

(21) Appl. No.: 17/230,660

(22) Filed: Apr. 14, 2021

(65) Prior Publication Data
US 2021/0233771 A1    Jul. 29, 2021

Related U.S. Application Data

(63) Continuation of application No. 16/728,918, filed on Dec. 27, 2019, now Pat. No. 11,004,688, which is a
(Continued)

(51) Int. Cl.
*H01L 21/285* (2006.01)
*H01L 21/02* (2006.01)
(Continued)

(52) U.S. Cl.
CPC .. *H01L 21/28518* (2013.01); *H01L 21/02532* (2013.01); *H01L 21/76805* (2013.01);
(Continued)

(58) Field of Classification Search
CPC ......... H01L 21/28518; H01L 21/02532; H01L 21/76805; H01L 21/76895;
(Continued)

(56) References Cited

U.S. PATENT DOCUMENTS 5,744,394 A    4/1998 Iguchi et al.
8,853,060 B1 * 10/2014 Lai .................. H01L 29/165
                                                         438/478

(Continued)

*Primary Examiner* — Herve-Louis Y Assouman
(74) *Attorney, Agent, or Firm* — Slater Matsil, LLP

(57) ABSTRACT

A finFET device and methods of forming are provided. The method includes etching recesses in a substrate on opposite sides of a gate stack. The method also includes epitaxially growing a source/drain region in each recess, where each of the source/drain regions includes a capping layer along a top surface of the respective source/drain region, and where a concentration of a first material in each source/drain region is highest at an interface of the capping layer and an underlying epitaxy layer. The method also includes depositing a plurality of metal layers overlying and contacting each of the source/drain regions. The method also includes performing an anneal, where after the anneal a metal silicide region is formed in each of the source/drain regions, where each metal silicide region extends through the capping layer and terminates at the interface of the capping layer and the underlying epitaxy layer.

20 Claims, 70 Drawing Sheets

Related U.S. Application Data continuation of application No. 15/725,867, filed on Oct. 5, 2017, now Pat. No. 10,522,359.

(60) Provisional application No. 62/427,490, filed on Nov. 29, 2016.

(51) Int. Cl.

| | |
|---|---|
| *H01L 21/768* | (2006.01) |
| *H01L 21/8238* | (2006.01) |
| *H01L 23/535* | (2006.01) |
| *H01L 27/092* | (2006.01) |
| *H01L 29/08* | (2006.01) |
| *H01L 29/161* | (2006.01) |
| *H01L 29/165* | (2006.01) |
| *H01L 29/45* | (2006.01) |
| *H01L 29/66* | (2006.01) |
| *H01L 29/78* | (2006.01) |
| *H01L 23/485* | (2006.01) |

(52) U.S. Cl.
CPC .......... *H01L 21/76895* (2013.01); *H01L 21/823821* (2013.01); *H01L 21/823871* (2013.01); *H01L 23/535* (2013.01); *H01L 27/0924* (2013.01); *H01L 29/0847* (2013.01); *H01L 29/161* (2013.01); *H01L 29/165* (2013.01); *H01L 29/45* (2013.01); *H01L 29/665* (2013.01); *H01L 29/6656* (2013.01); *H01L 29/6659* (2013.01); *H01L 29/66545* (2013.01); *H01L 29/66636* (2013.01); *H01L 29/66795* (2013.01); *H01L 29/7833* (2013.01); *H01L 29/7848* (2013.01); *H01L 29/7851* (2013.01); *H01L 21/76843* (2013.01); *H01L 21/76855* (2013.01); *H01L 21/823814* (2013.01); *H01L 23/485* (2013.01)

(58) Field of Classification Search
CPC ..... H01L 21/823821; H01L 21/823871; H01L 23/535; H01L 27/0924; H01L 29/0847; H01L 29/161; H01L 29/165; H01L 29/45; H01L 29/665; H01L 29/66545; H01L 29/6656; H01L 29/6659; H01L 29/66636; H01L 29/66795; H01L 29/7833; H01L 29/7848; H01L 29/7851; H01L 21/76843; H01L 21/76855; H01L 21/823814; H01L 23/485; H01L 29/785
See application file for complete search history.

(56) References Cited

U.S. PATENT DOCUMENTS

| | | | |
|---|---|---|---|
| 9,209,175 | B2 | 12/2015 | Sung et al. |
| 10,522,359 | B2* | 12/2019 | Huang ............ H01L 21/823871 |
| 2005/0045965 | A1 | 3/2005 | Lin et al. |
| 2007/0187767 | A1 | 8/2007 | Yasutake |
| 2008/0067609 | A1 | 3/2008 | Kim et al. |
| 2008/0116487 | A1 | 5/2008 | Lee et al. |
| 2008/0119025 | A1 | 5/2008 | Kwon et al. |
| 2011/0156107 | A1 | 6/2011 | Bohr et al. |
| 2012/0319203 | A1 | 12/2012 | Cheng et al. |
| 2013/0020612 | A1 | 1/2013 | Wann et al. |
| 2013/0134598 | A1 | 5/2013 | Anderson et al. |
| 2013/0320457 | A1 | 12/2013 | Lim et al. |
| 2015/0021696 | A1 | 1/2015 | Sung et al. |
| 2016/0087078 | A1* | 3/2016 | Li ....................... H01L 29/7848 438/285 |

* cited by examiner

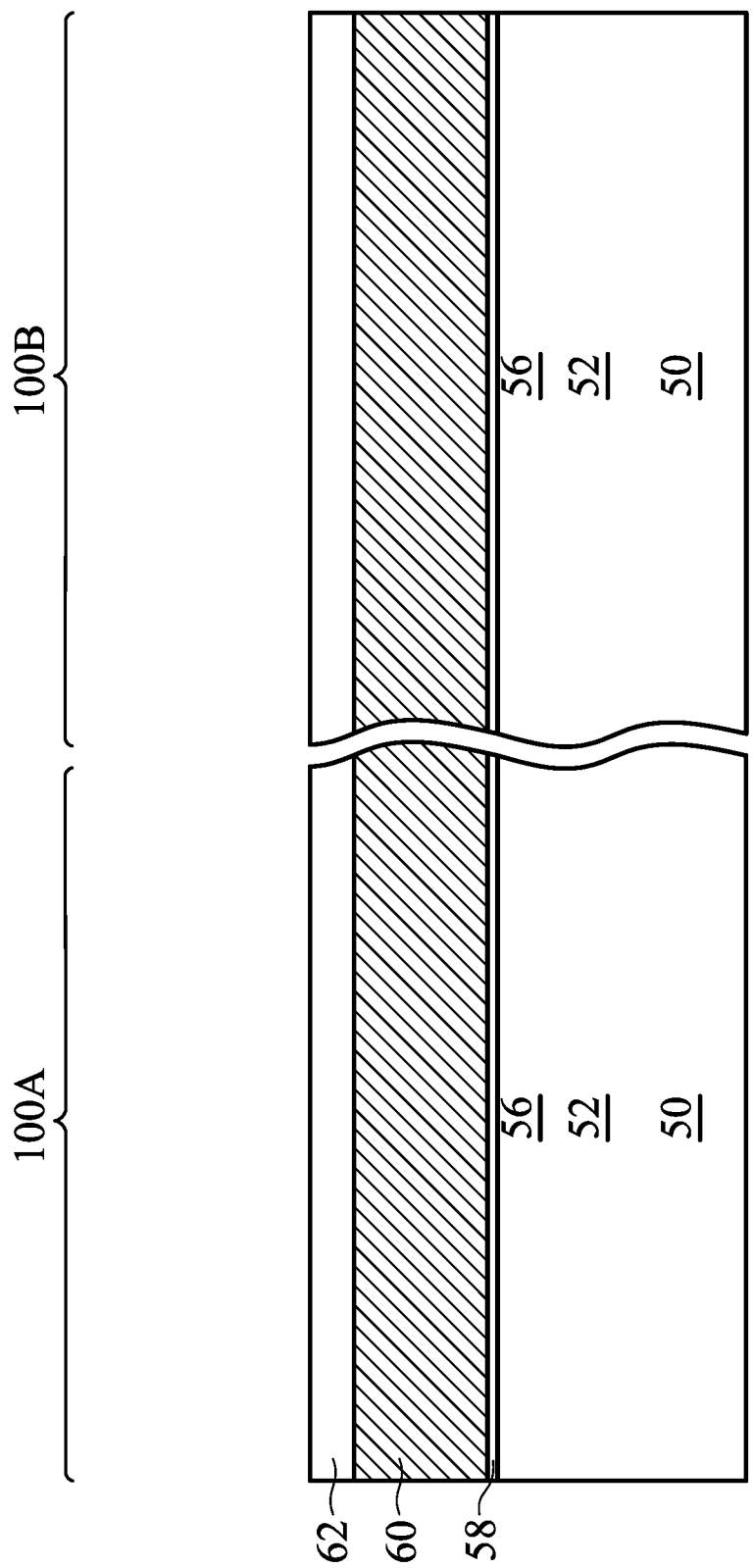

FINFET DEVICE AND METHOD OF FORMING

PRIORITY CLAIM AND CROSS-REFERENCE

This application is a continuation of U.S. patent application Ser. No. 16/728,918, filed Dec. 27, 2019, which is a continuation of Ser. No. 15/725,867, filed on Oct. 5, 2017, now U.S. Pat. No. 10,522,359, issued Dec. 31, 2019, which claims priority to provisional Application No. 62/427,490, filed Nov. 29, 2016, which applications are hereby incorporated by reference in their entireties.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 6A and 6B are cross-sectional views of intermediate stages in the manufacture of a finFET device in accordance with some embodiments.

DETAILED DESCRIPTION

Figure 1:
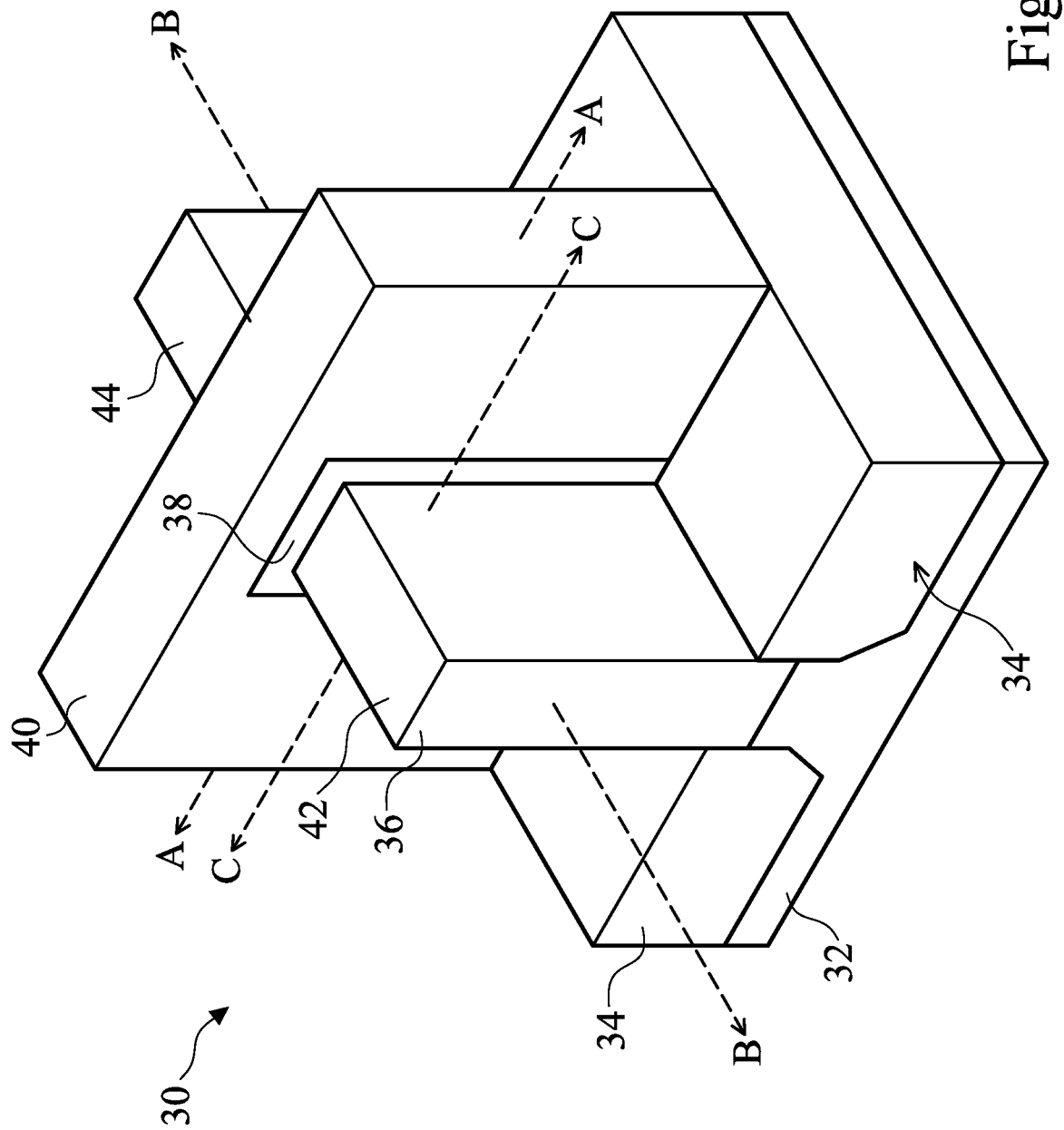
FIG. 1 is a perspective view of a fin field effect transistor ("finFET") device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A fin field effect transistor ("finFET") device with improved source/drain contact regions is provided in accordance with some embodiments.

FIG. 1 illustrates an example of a fin field-effect transistor (finFET) 30 in a three-dimensional view. The finFET 30 comprises a fin 36 on a substrate 32. The finFET also includes isolation regions 34 over substrate 32, and the fin 36 protrudes above and from between neighboring isolation regions 34. A gate dielectric 38 is along sidewalls and over a top surface of the fin 36, and a gate electrode 40 is over the gate dielectric 38. Source/drain regions 42 and 44 are disposed in opposite sides of the fin 36 with respect to the gate dielectric 38 and gate electrode 40. FIG. 1 further illustrates reference cross-sections that are used in later figures. Cross-section A-A is across a channel, gate dielectric 38, and gate electrode 40 of the finFET 30. Cross-section C-C is in a plane that is parallel to cross section A-A and is across fin 36 outside of the channel. Cross-section B-B is perpendicular to cross-section A-A and is along a longitudinal axis of the fin 36 and in a direction of, for example, a current flow between the source/drain regions 42 and 44. Subsequent figures refer to these reference cross-sections for clarity.

Some embodiments discussed herein are discussed in the context of finFETs formed using a gate-last process. In other embodiments, a gate-first process may be used. Also, some embodiments contemplate aspects used in planar devices, such as planar FETs.

FIGS. 2 through 34A-B are cross-sectional views of intermediate stages in the manufacturing of finFETs in accordance with an exemplary embodiment. FIGS. 2 through 5 illustrate reference cross-section A-A illustrated in FIG. 1, except for multiple finFETs. In FIGS. 6 through 15C, 17A through 20D, and 22A through 24A-B, figures ending with an "A" designation are illustrated along a similar cross-section A-A; figures ending with a "B" designation are illustrated along a similar cross-section B-B; and figures ending with a "C" designation are illustrated along a similar cross-section C-C. FIGS. 16 and 21 are illustrated along a similar cross section C-C.

Figure 2:
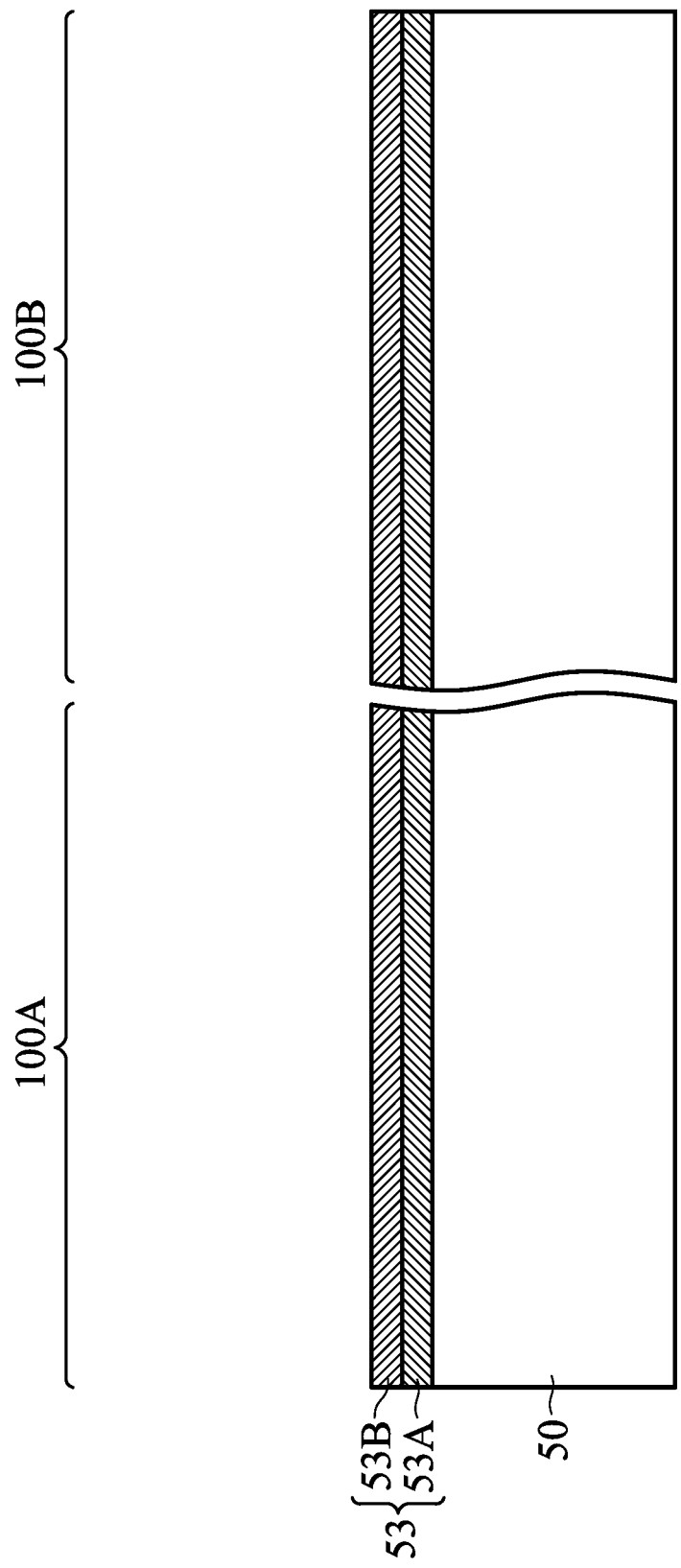
FIGS. 2-5 are cross-sectional views of intermediate stages in the manufacture of a finFET device in accordance with some embodiments.

FIG. 2 illustrates a substrate 50. Substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 has a first region 100A and a second region 100B. The first region 100A can be for forming n-type devices, such as NMOS transistors, such as n-type finFETs. The second region 100B can be for forming p-type devices, such as PMOS transistors, such as p-type finFETs.

FIG. 2 also shows the forming of mask 53 over substrate 50. In some embodiments, mask 53 may be used in a subsequent etching step to pattern substrate 50 (See FIG. 3). As shown in FIG. 2, mask 53 may include first mask layer 53A and second mask layer 53B. Mask layer 53A may be a hard mask layer, such as silicon nitride or the like, and may be formed using any suitable process, such as a deposition, atomic layer deposition (ALD) or physical vapor deposition (PVD). Mask layer 53A may be used to prevent or minimize an etching of substrate 50 underlying mask layer 53A in the subsequent etch step (See FIG. 3). Mask layer 53B may comprise photoresist, and in some embodiments may be used to pattern mask layer 53A for use in the subsequent etching step discussed above. Mask layer 53B can be formed by using a spin-on technique and can be patterned using acceptable photolithography techniques. In some embodiments, three or more masks 53 may be used.

Figure 3:
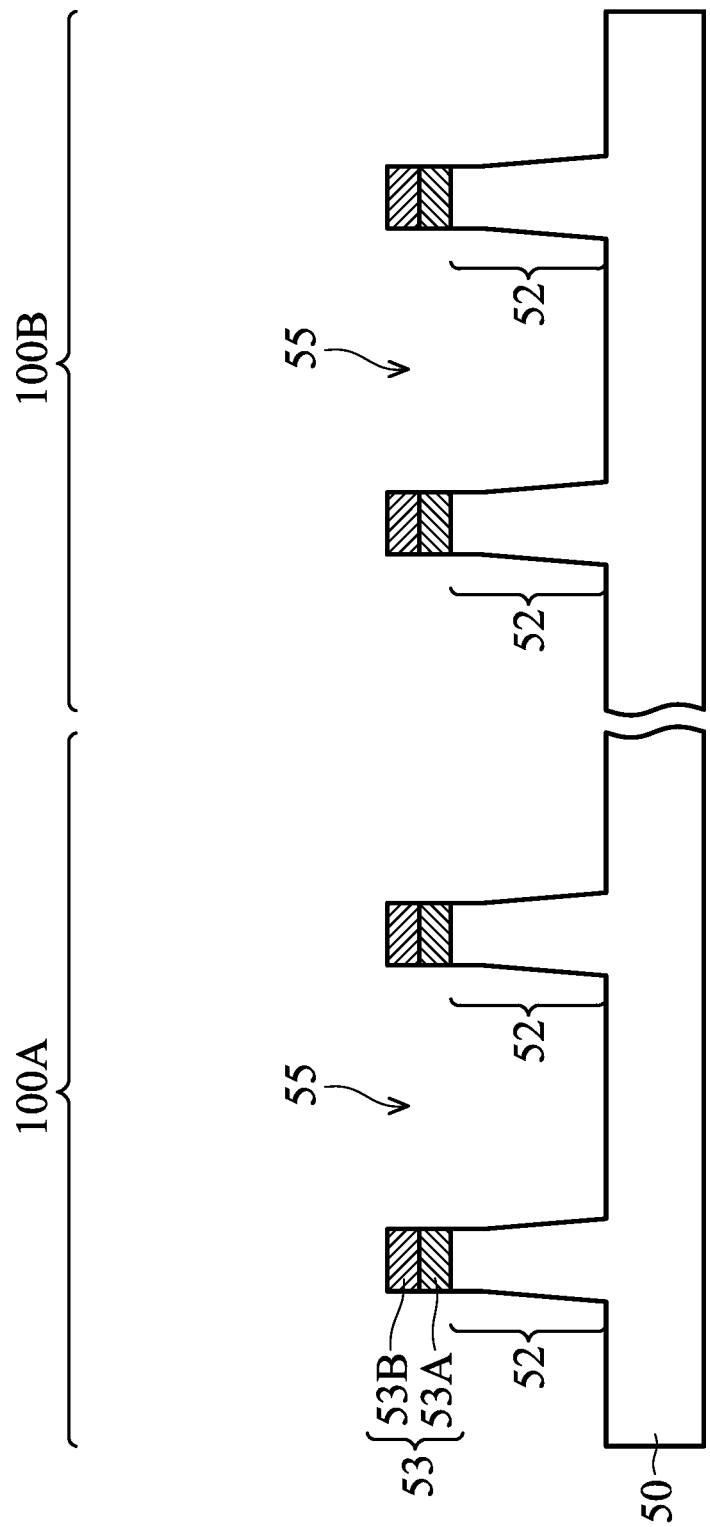

FIG. 3 illustrates the formation of semiconductor strips 52 in the substrate 50. First, mask layers 53A and 53B may be patterned, where openings in mask layers 53A and 53B expose areas of substrate 50 where trenches will be formed. Next, an etching process may be performed, where the etching process creates trenches in substrate 50 through openings in mask 53. The remaining sections of substrate 50 underlying patterned mask 53 form a plurality of semiconductor strips 52. The etching may be any acceptable etch process, such as a reactive ion etch (RIE), neutral beam etch (NBE), the like, or a combination thereof. The etch may be anisotropic.

In some embodiments, the masks 53A and 53B may be patterned using a multiple-patterning process, such as a self-aligned double patterning (SADP) process, a self-aligned quadruple patterning (SAQP) process, or the like, that allows for forming features having a reduced critical dimension (CD) and pitch. In such embodiments, one or more additional mask layers, one or more mandrel layers, and one or more spacer layers (not shown) may be formed over the mask 53. The one or more additional mask layers, the one or more mandrel layers, and the one or more spacer layers may be patterned to form desired patterns, which are transferred to the mask 53.

Figure 4:
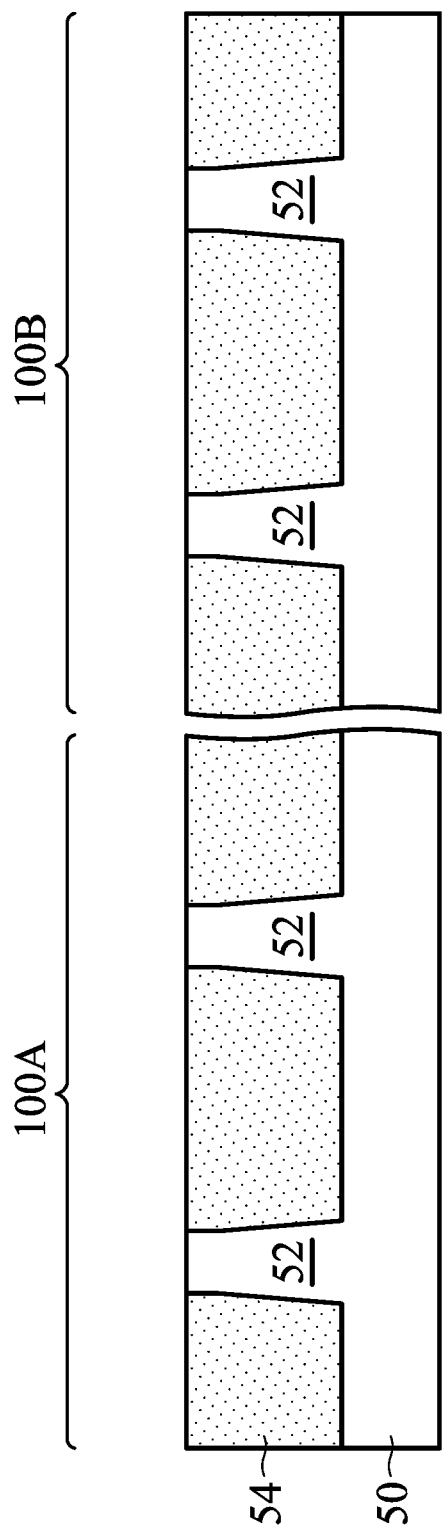

In FIG. 4 an insulation material is formed between neighboring semiconductor strips 52 to form isolation regions 54. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used.

Furthermore, in some embodiments, isolation regions 54 may include a conformal liner (not illustrated) formed on sidewalls and a bottom surface of trenches 55 (see FIG. 3) prior to the filling of trenches 55 with an insulation material of isolation regions 54. In some embodiments, the liner may comprise a semiconductor (e.g., silicon) nitride, a semiconductor (e.g., silicon) oxide, a thermal semiconductor (e.g., silicon) oxide, a semiconductor (e.g., silicon) oxynitride, a polymer dielectric, combinations thereof, and the like. The formation of the liner may include any suitable method, such as, ALD, CVD, high density plasma (HDP) CVD, PVD, and the like. In such embodiments, the liner may prevent (or at least reduce) the diffusion of semiconductor material from semiconductor strips 52 (e.g., Si and/or Ge) into the surrounding isolation regions 54 during the annealing of isolation regions 54.

An anneal process may be performed once the insulation material is formed. In the illustrated embodiment, the insulation material is silicon oxide formed by a FCVD process. The insulating material may be referred to as isolation regions 54. Further in FIG. 4, a planarization process, such as a chemical mechanical polish (CMP), may remove any excess insulation material and form top surfaces of the isolation regions 54 and top surfaces of the semiconductor strips 52 that are coplanar. In some embodiments, the CMP may also remove mask 53. In other embodiments mask 53 may be removed using a wet cleaning process.

Figure 5:
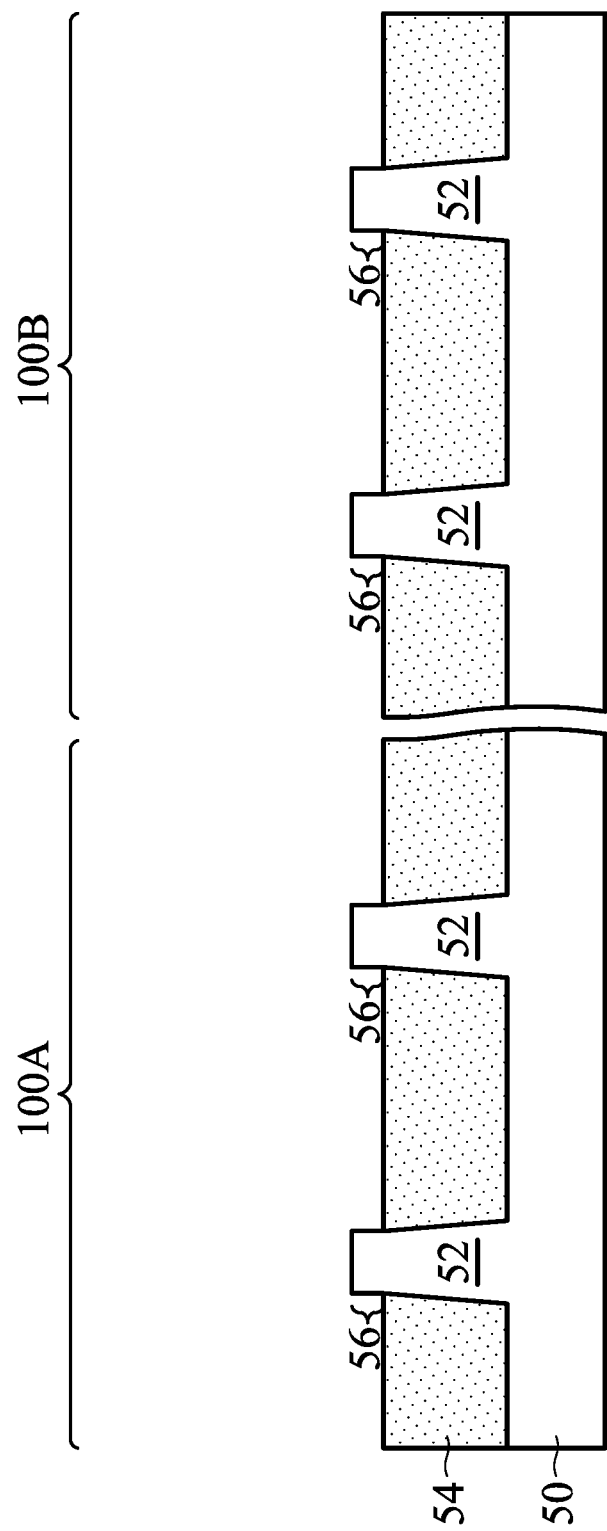

FIG. 5 illustrates the recessing of the isolation regions 54 to form Shallow Trench Isolation (STI) regions 54. The isolation regions 54 are recessed such that fins 56 in the first region 100A and in the second region 100B protrude from between neighboring isolation regions 54. Further, the top surfaces of the isolation regions 54 may have a flat surface as illustrated, a convex surface, a concave surface (such as dishing), or a combination thereof. The top surfaces of the isolation regions 54 may be formed flat, convex, and/or concave by an appropriate etch. The isolation regions 54 may be recessed using an acceptable etching process, such as one that is selective to the material of the isolation regions 54. For example, a chemical oxide removal using a CERTAS® etch or an Applied Materials SICONI tool or dilute hydrofluoric (dHF) acid may be used.

A person having ordinary skill in the art will readily understand that the process described with respect to FIGS. 2 through 5 is just one example of how fins 56 may be formed. In other embodiments, a dielectric layer can be formed over a top surface of the substrate 50; trenches can be etched through the dielectric layer; homoepitaxial structures can be epitaxially grown in the trenches; and the dielectric layer can be recessed such that the homoepitaxial structures protrude from the dielectric layer to form fins. In still other embodiments, heteroepitaxial structures can be used for the fins. For example, the semiconductor strips 52 in FIG. 4 can be recessed, and a material different from the semiconductor strips 52 may be epitaxially grown in their place. In an even further embodiment, a dielectric layer can be formed over a top surface of the substrate 50; trenches can be etched through the dielectric layer; heteroepitaxial structures can be epitaxially grown in the trenches using a material different from the substrate 50; and the dielectric layer can be recessed such that the heteroepitaxial structures protrude from the dielectric layer to form fins 56. In some embodiments where homoepitaxial or heteroepitaxial structures are epitaxially grown, the grown materials may be in situ doped during growth, which may obviate prior and subsequent implantations although in situ and implantation doping may be used together. Still further, it may be advantageous to epitaxially grow a material in an NMOS region different from the material in a PMOS region. In various embodiments, the fins 56 may comprise silicon germanium ($Si_xGe_{1-x}$, where x can be between approximately 0 and 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 6A:
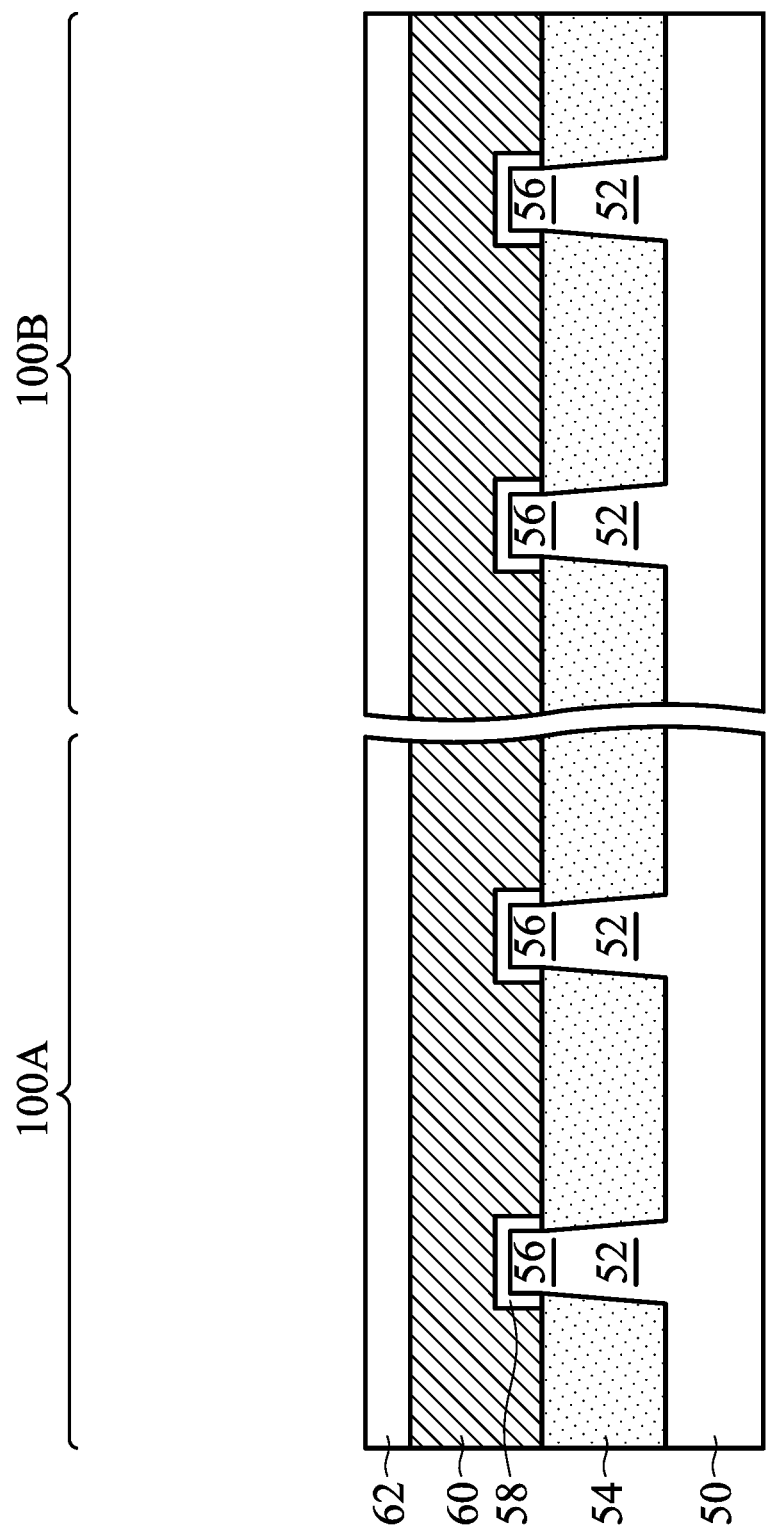

In FIGS. 6A and 6B, a dummy dielectric layer 58 is formed on the fins 56. The dummy dielectric layer 58 may be, for example, silicon oxide, silicon nitride, a combination thereof, or the like, and may be deposited (using, for example, CVD, PVD, or the like) or thermally grown (for example, using thermal oxidation or the like) according to acceptable techniques. A dummy gate layer 60 is formed over the dummy dielectric layer 58, and a mask layer 62 is formed over the dummy gate layer 60. The dummy gate layer 60 may be deposited over the dummy dielectric layer 58 and then planarized, such as by a CMP. The mask layer 62 may be deposited over the dummy gate layer 60. The dummy gate layer 60 may be made of, for example, polysilicon, although other materials that have a high etching selectivity from the etching of isolation regions 54 may also be used. The mask layer 62 may include, for example, silicon nitride or the like. In this example, a single dummy gate layer 60 and a single mask layer 62 are formed across the first region 100A and the second region 100B. In other embodiments, separate dummy gate layers may be formed in the first region 100A and the second region 100B and separate mask layers may be formed in the first region 100A and the second region 100B.

Figure 7A:
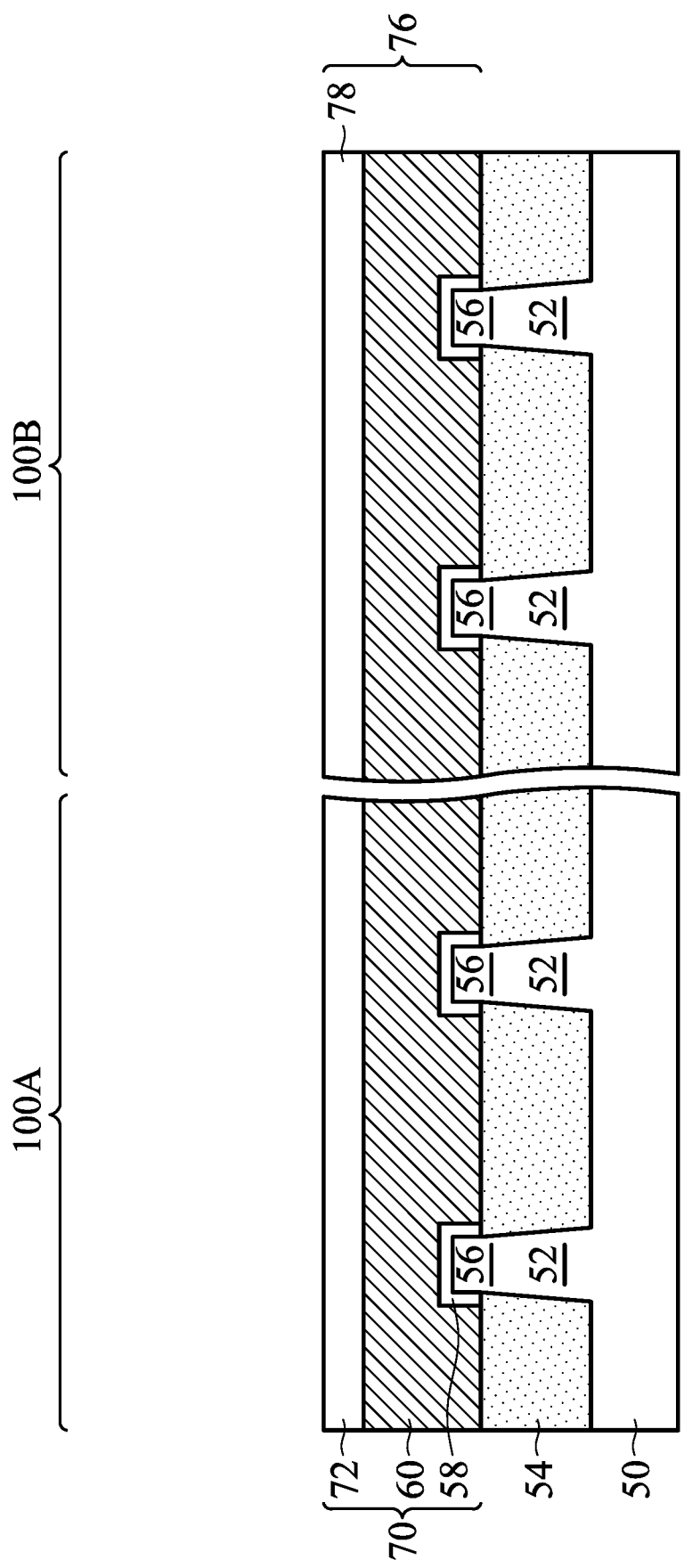
FIGS. 7A, 7B and 7C are cross-sectional views of intermediate stages in the manufacture of a finFET device in accordance with some embodiments.
Figure 7B:
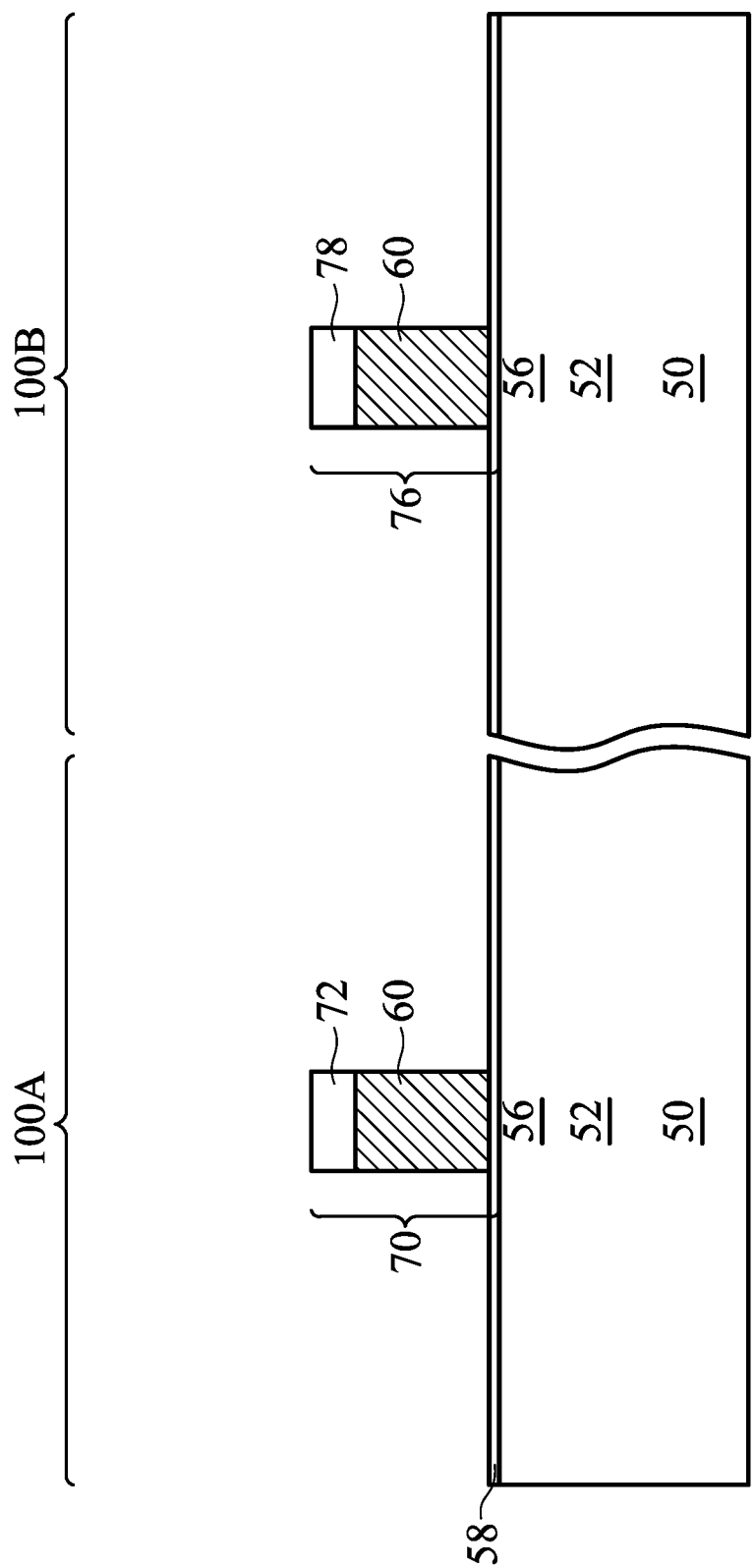
Figure 7C:
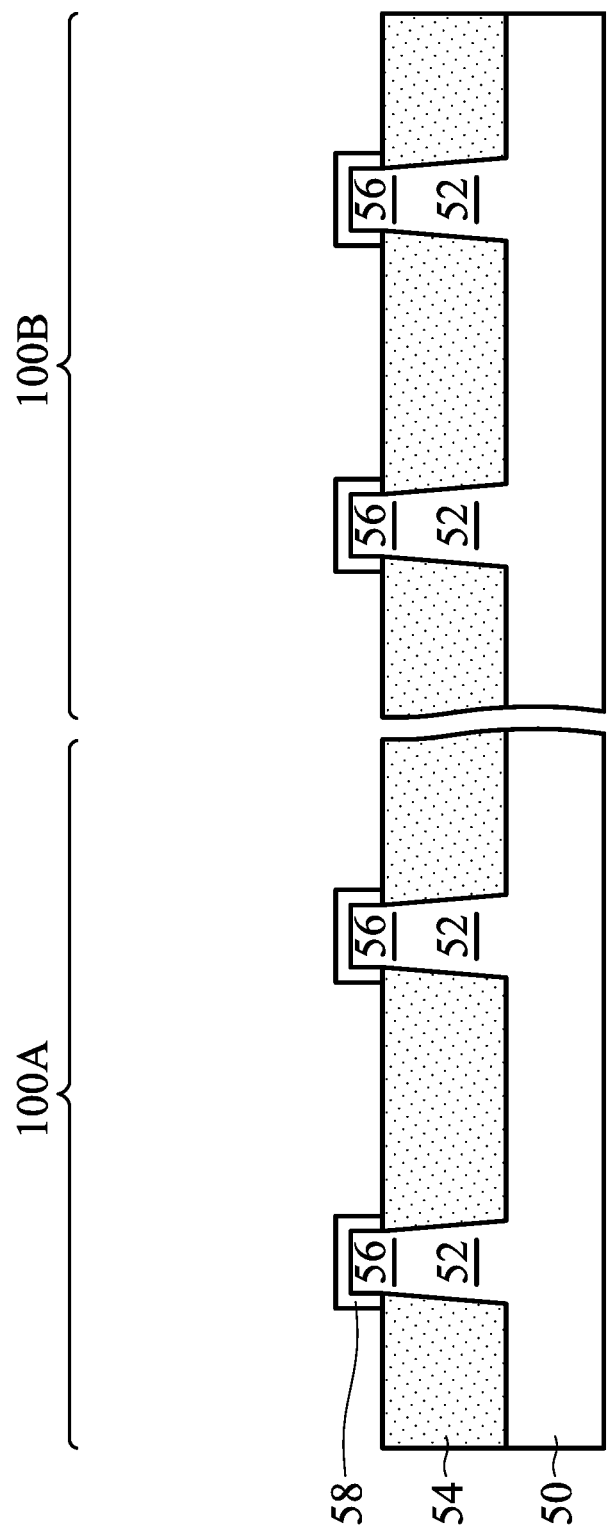

In FIGS. 7A, 7B, and 7C, the mask layer 62 may be patterned using acceptable photolithography and etching techniques to form mask 72 in the first region 100A and mask 78 in the second region 100B. The pattern of the masks 72 and 78 then may be transferred to the dummy gate layer 60 by an acceptable etching technique to form dummy gates 70 in the first region 100A and dummy gates 76 in the second region 100B. Optionally, the pattern of masks 72 and 78 may similarly be transferred to dummy dielectric layer 58. The dummy gates 70 and 76 cover respective channel regions of the fins 56. The dummy gates 70 and 76 may also have a lengthwise direction substantially perpendicular to the lengthwise direction of respective epitaxial fins. A size of the dummy gates 70 and 76, and a pitch between dummy gates 70 and 76, may depend on a region of a die in which the dummy gates are formed. In some embodiments, dummy gates 70 and 76 may have a larger size and a larger pitch when located in an input/output region of a die than when located in a logic region of a die.

In FIGS. 7A, 7B and 7C, appropriate wells (not shown) may be formed in the fins 56, semiconductor strips 52, and/or substrate 50. For example, a P well may be formed in the first region 100A, and an N well may be formed in the second region 100B.

The different implant steps for the different regions 100A and 100B may be achieved using a photoresist or other masks (not shown). For example, a photoresist is formed over the fins 56 and the isolation regions 54 in the second region 100B. The photoresist is patterned to expose the second region 100B of the substrate 50, such as a PMOS region. The photoresist can be formed by using a spin-on technique and can be patterned using acceptable photolithography techniques. Once the photoresist is patterned, an n-type impurity implant is performed in the second region 100B, and the photoresist may act as a mask to substantially prevent n-type impurities from being implanted into the first region 100A, such as an NMOS region. The n-type impurities may be phosphorus, arsenic, or the like implanted in the first region to a concentration of equal to or less than $10^{18}$ $cm^{-3}$, such as in a range from about $10^{17}$ $cm^{-3}$ to about $10^{18}$ $cm^{-3}$. After the implant, the photoresist is removed, such as by an acceptable ashing process.

Following the implanting of the second region 100B, a photoresist is formed over the fins 56 and the isolation regions 54 in the second region 100B. The photoresist is patterned to expose the first region 100A of the substrate 50, such as the NMOS region. The photoresist can be formed by using a spin-on technique and can be patterned using acceptable photolithography techniques. Once the photoresist is patterned, a p-type impurity implant may be performed in the first region 100A, and the photoresist may act as a mask to substantially prevent p-type impurities from being implanted into the second region, such as the PMOS region. The p-type impurities may be boron, $BF_2$, or the like implanted in the first region to a concentration of equal to or less than $10^{18}$ $cm^{-3}$, such as in a range from about $10^{17}$ $cm^{-3}$ to about $10^{18}$ $cm^{-3}$. After the implant, the photoresist may be removed, such as by an acceptable ashing process.

After the implants of the first region 100A and the second region 100B, an anneal may be performed to activate the p-type and n-type impurities that were implanted. The implantations may form a p-well in the first region 100A, e.g., the NMOS region, and an n-well in the second region 100B, e.g., the PMOS region. In some embodiments, the grown materials of epitaxial fins may be in situ doped during growth, which may obviate the implantations, although in situ and implantation doping may be used together.

Figure 8A:
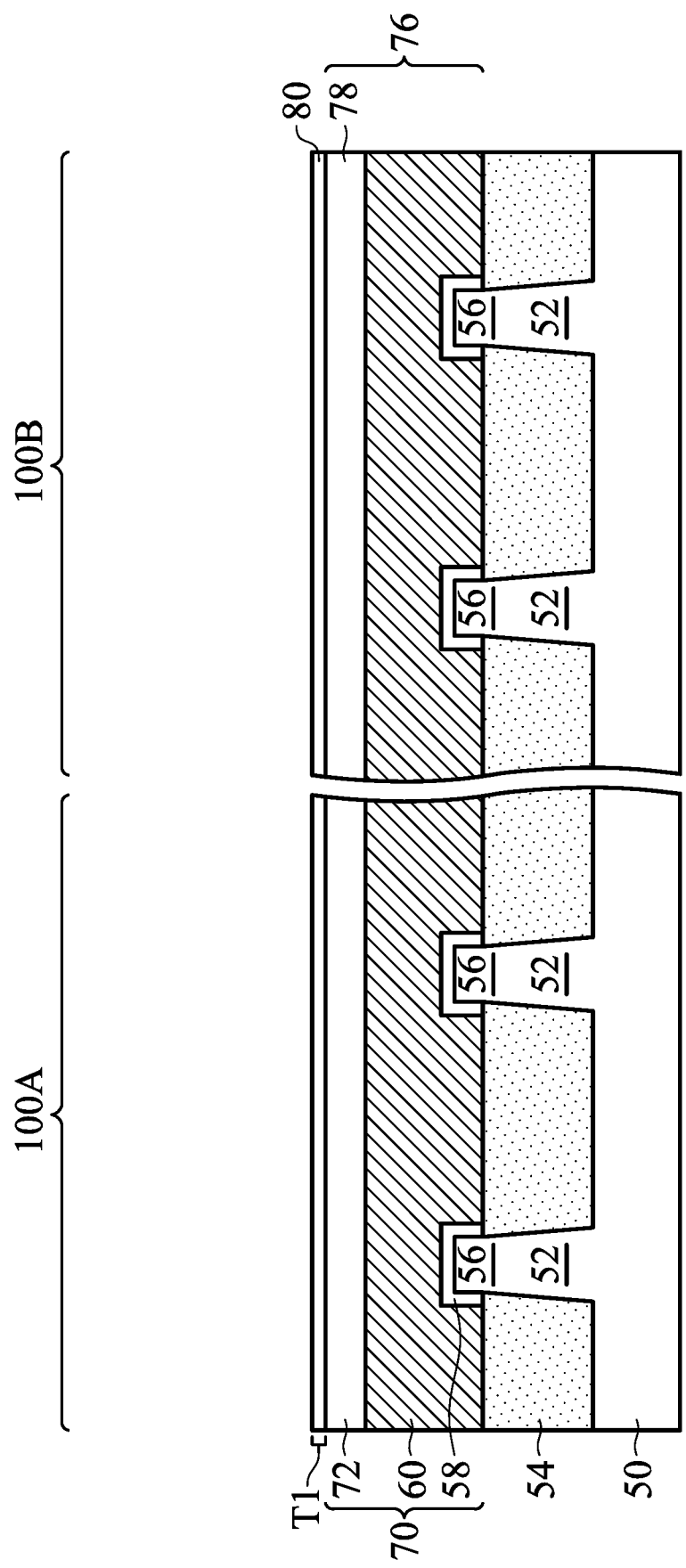
FIGS. 8A, 8B and 8C are cross-sectional views of intermediate stages in the manufacture of a finFET device in accordance with some embodiments.
Figure 8B:
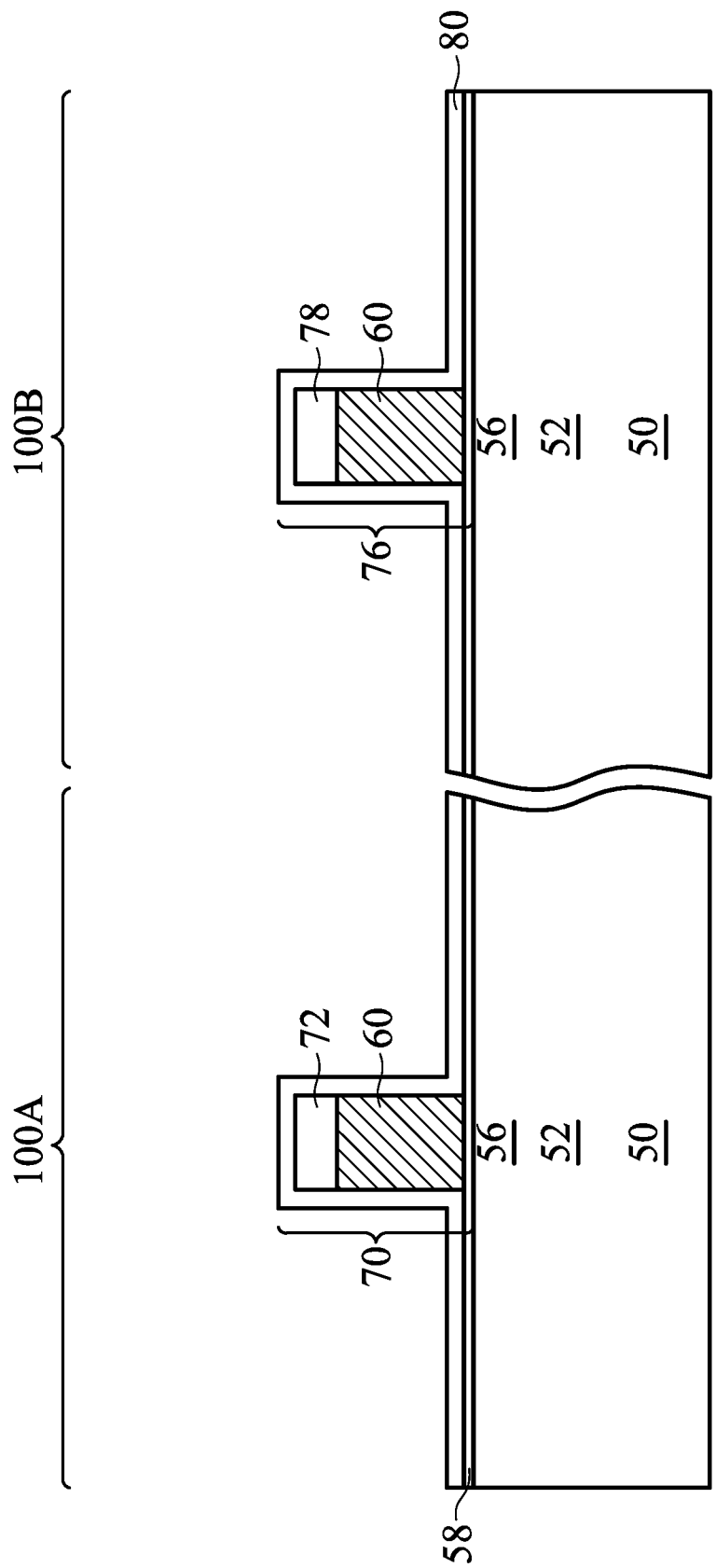
Figure 8C:
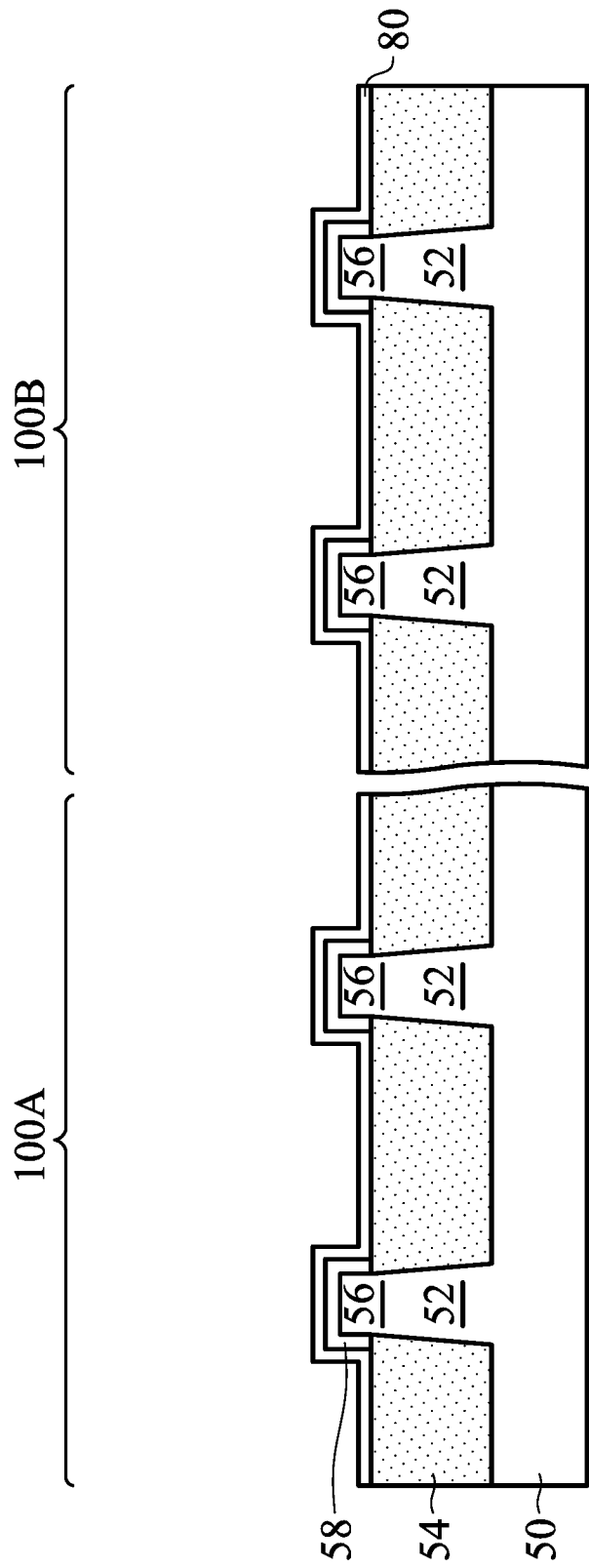

In FIGS. 8A, 8B, and 8C, a first gate spacer 80 is formed on exposed surfaces of respective dummy gates 70 and 76 (FIGS. 8A and 8B) and/or dummy dielectric layer 58 over fins 56 (FIG. 8C). Any suitable methods of forming gate spacers 80 may be used. In some embodiments, a deposition (such as CVD, ALD or the like) may be used form the first gate spacer 80. In some embodiments, as shown in FIG. 8A, first gate spacer may have a thickness T1 of about 30 Å. First gate spacer 80 may comprise any suitable material. In some embodiments, first gate spacer may comprise SiOCN.

Figure 9A:
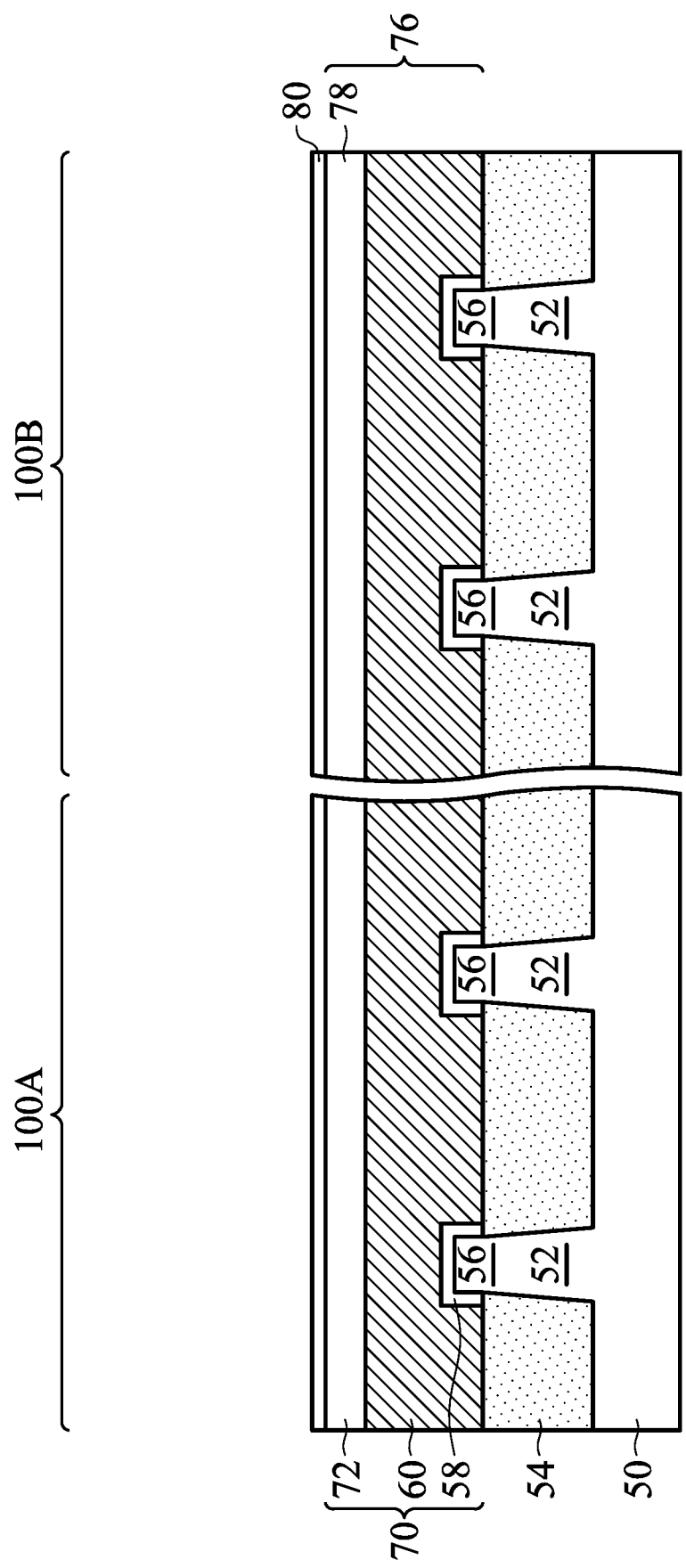
FIGS. 9A, 9B and 9C are cross-sectional views of intermediate stages in the manufacture of a finFET device in accordance with some embodiments.
Figure 9B:
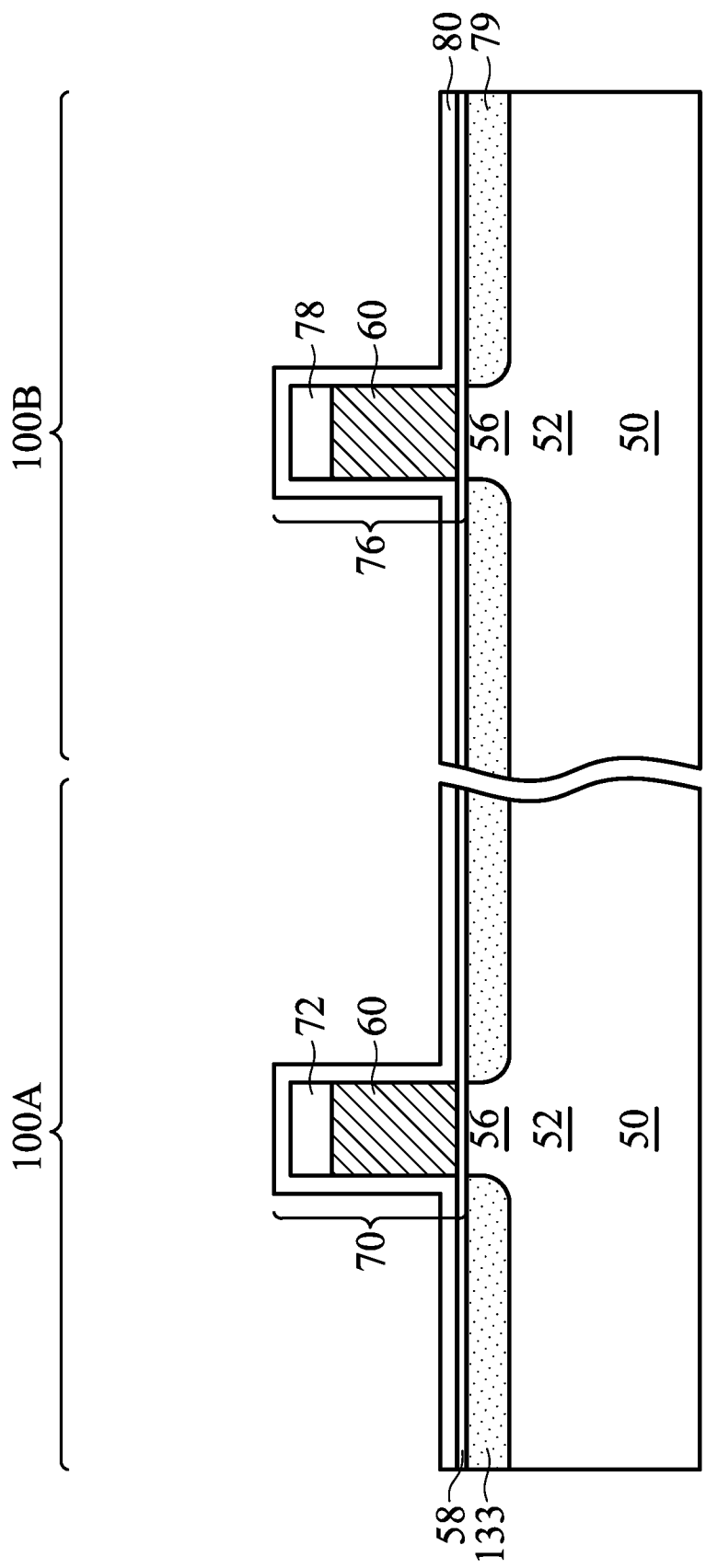
Figure 9C:
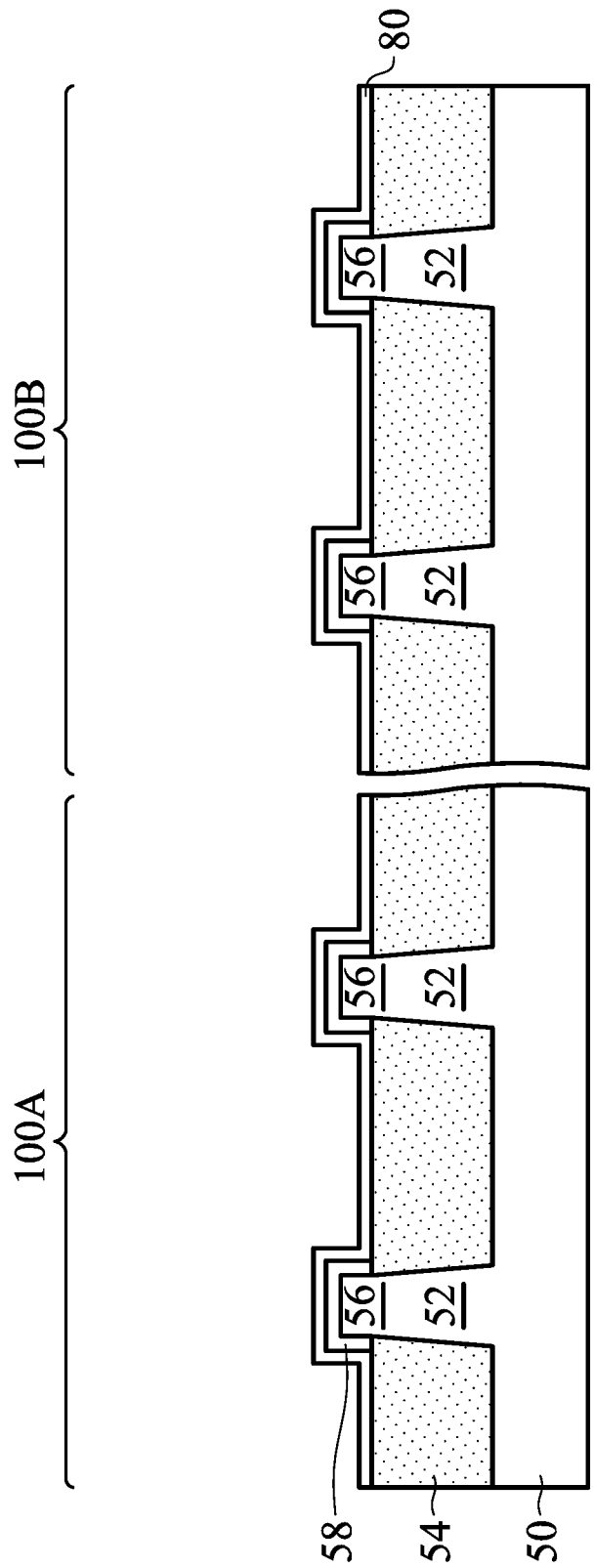

In FIGS. 9A, 9B and 9C, implants for lightly doped source/drain (LDD) regions 130 and 79 may be performed. Similar to the implants discussed above in FIGS. 7A, 7B and 7C, a mask (not shown), such as a photoresist, may be formed over the first region 100A, e.g., NMOS region, while exposing the second region 100B, e.g., PMOS region, and p-type impurities may be implanted into the exposed fins 56 in the second region 100B to created LDD regions 79. The mask may then be removed. Subsequently, a mask (not shown), such as a photoresist, may be formed over the second region 100B while exposing the first region 100A, and n-type impurities may be implanted into the exposed fins 56 in the first region 100A to create LDD regions 133. The mask may then be removed. The n-type impurities may be the any of the n-type impurities previously discussed, and the p-type impurities may be the any of the p-type impurities previously discussed. The LDD regions 133 and 79 may each have a concentration of impurities of from about $10^{15}$ $cm^{-3}$ to about $10^{16}$ $cm^{-3}$. An anneal may be used to activate the implanted impurities.

Figure 10A:
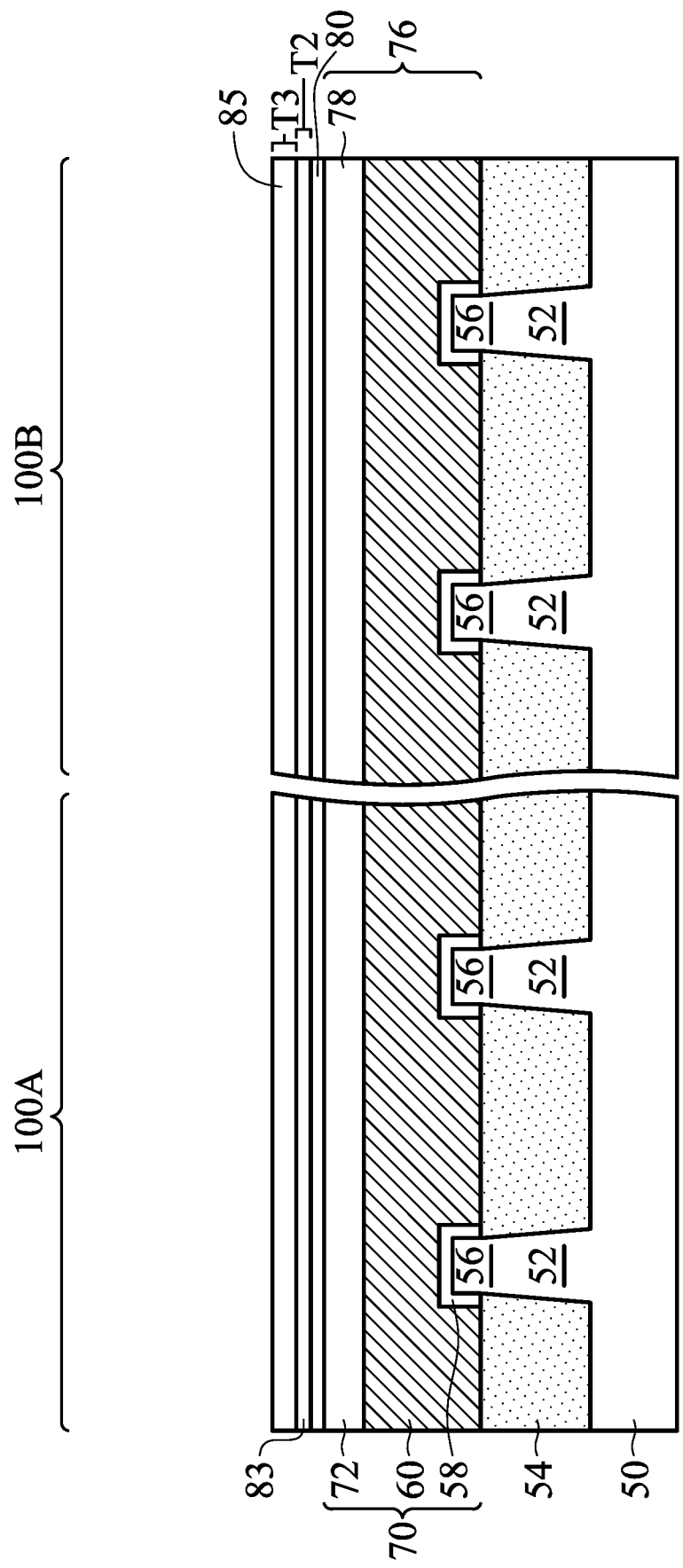
FIGS. 10A, 10B and 10C are cross-sectional views of intermediate stages in the manufacture of a finFET device in accordance with some embodiments.
Figure 10B:
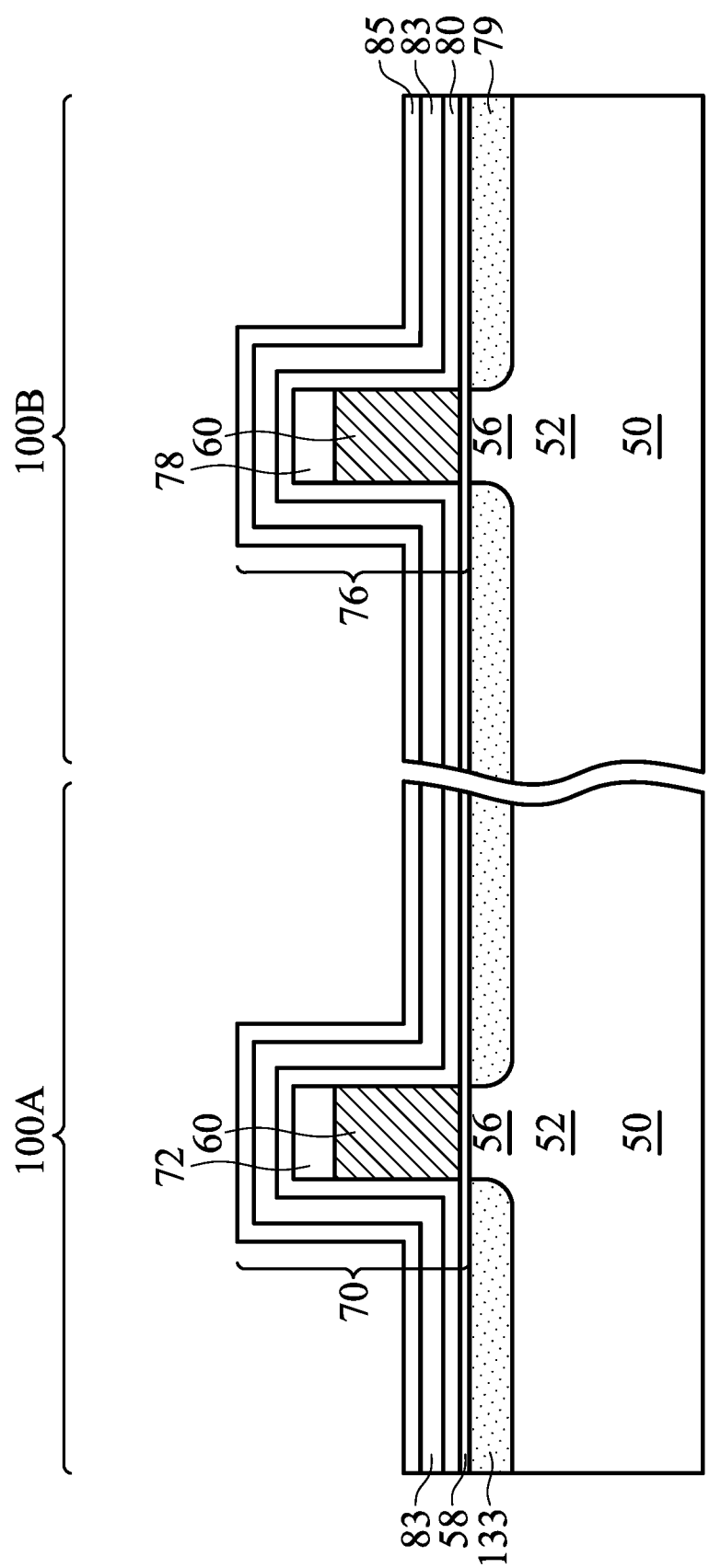
Figure 10C:
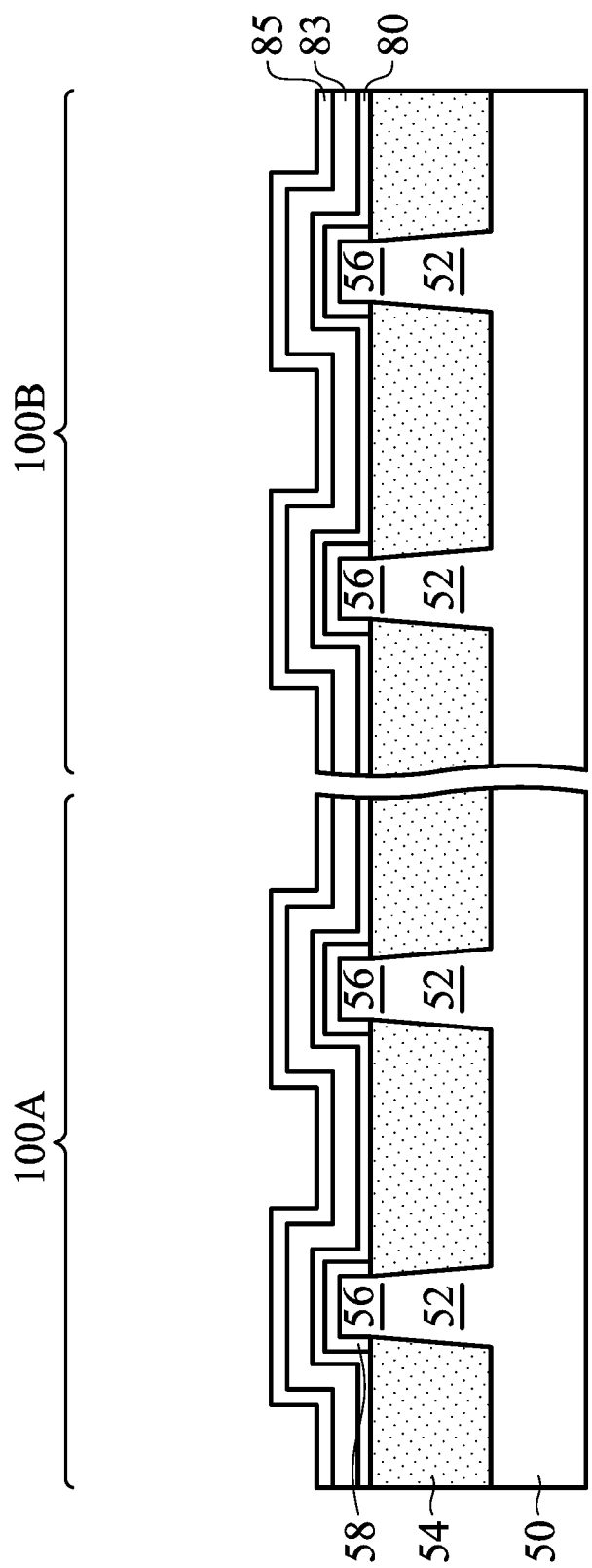

Referring to FIGS. 10A-C, additional gate spacers may be formed over gate spacer 80. First, second gate spacer 83 may be formed over first gate spacer 80. Any suitable methods of forming second gate spacer 83 may be used. In some embodiments, a deposition (such as ALD, CVD, or the like) may be used to form second gate spacer 83. Any suitable material may be used to form second gate spacer 83. In some embodiments, second gate spacer 83 may comprise SiOCN. As shown in FIG. 10A, in some embodiments, second gate spacer 83 may have a thickness T2 of about 30 Å. After second gate spacer 83 is formed, third gate spacer 85 is formed over second gate spacers 83. Any suitable methods of forming third gate spacer 85 may be used. In some embodiments, a deposition (such as ALD, CVD, or the like) may be used form third gate spacers 85. Any suitable material may be used to form third gate spacer 85. In some embodiments, third gate spacer 85 may comprise SiN. Third gate spacer 85 may have a thickness T3 of about 40 Å in some embodiments, as shown in FIG. 10A. More or less spacers may be formed in some embodiments.

Figure 11A:
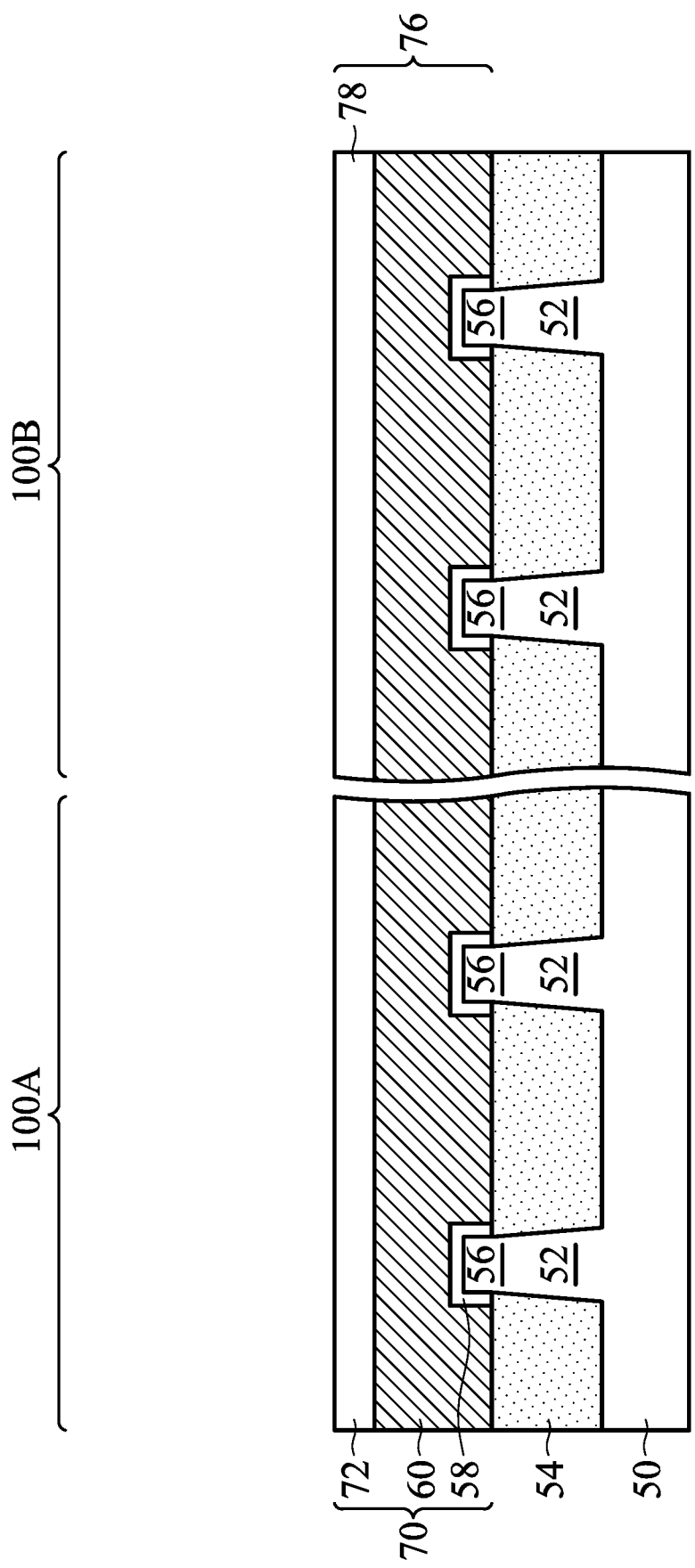
FIGS. 11A, 11B and 11C are cross-sectional views of intermediate stages in the manufacture of a finFET device in accordance with some embodiments.
Figure 11B:
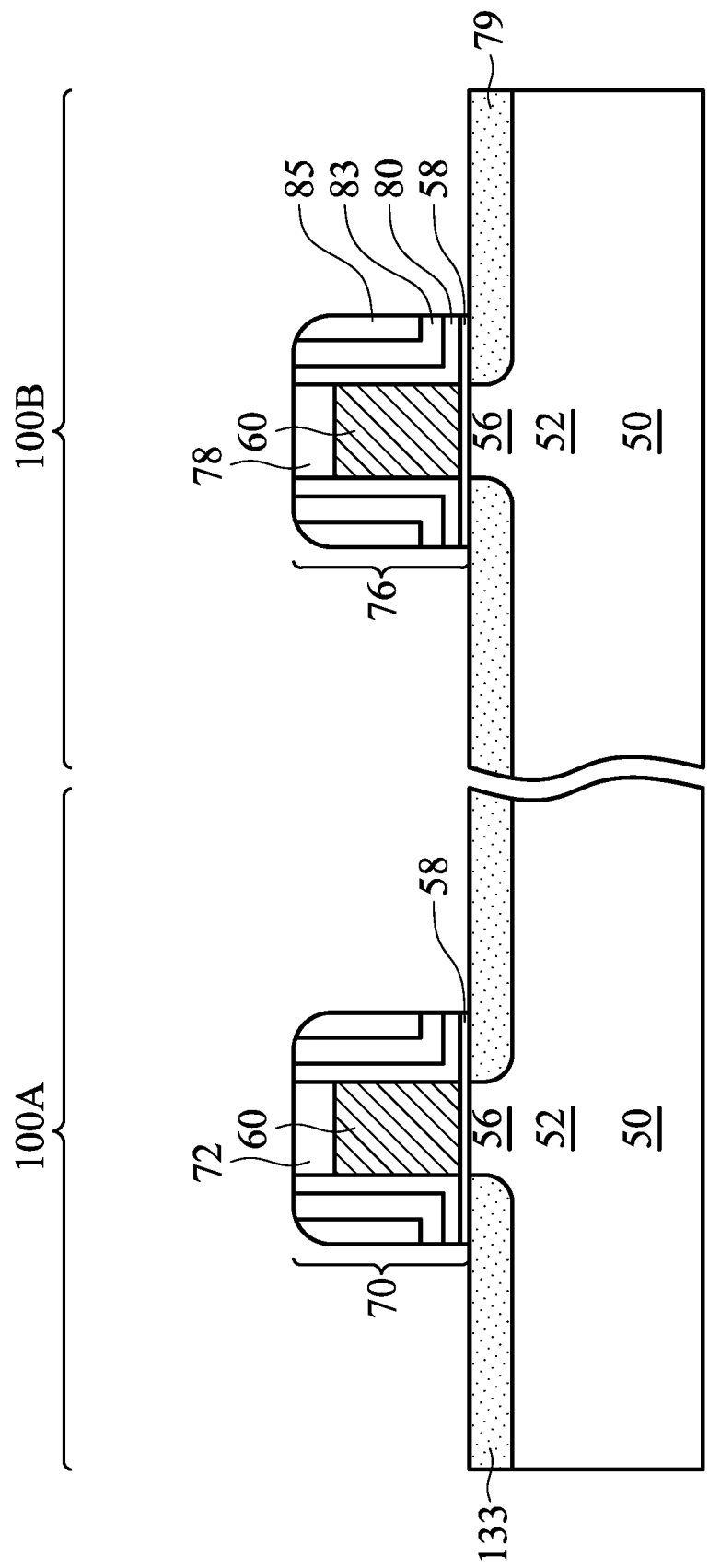
Figure 11C:
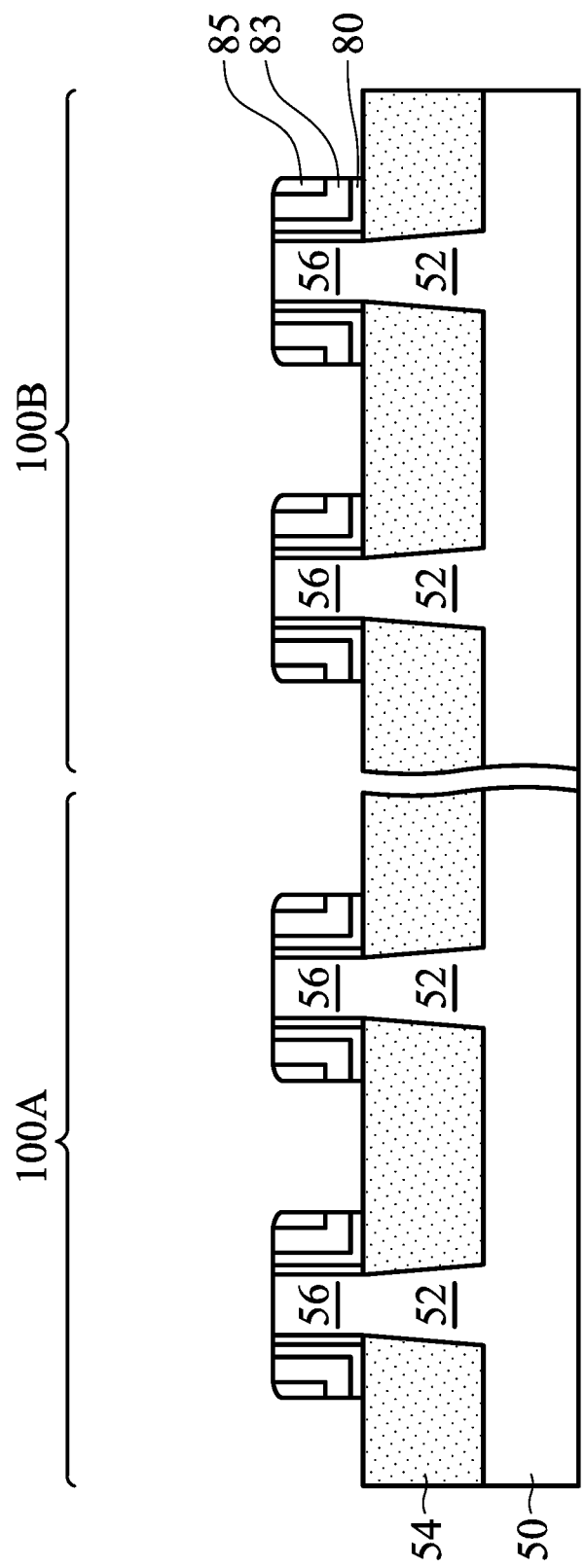

Next, a patterning process is performed to remove excess sections of first gate spacer 80, second gate spacer 83 and third gate spacer 85. Any acceptable patterning process may be used. In some embodiments a photoresist may be deposited (not shown) and patterned using acceptable lithograph techniques, where openings in the photo resist expose sections of first gate spacer 80, second gate spacer 83 and third gate spacer 85 to be removed. An etching process may be performed using the photoresist as a mask. The etching process may be anisotropic. After the etching, sections of first gate spacer 80, second gate spacer 83 and third gate spacer 85 over LDD regions and over isolation regions 54 may be removed. The resulting structure is depicted in FIGS. 11A-C.

FIGS. 12A-C through 21 depict the formation of epitaxial source/drain regions 82 and 84 in first region 100A and second region 100B (See FIGS. 15A-C, 16, 20A-C and 21 depicting epitaxial source/drain regions 82 and 84). In some embodiments, epitaxial source/drain regions 82 in first region 100A may be formed before epitaxial source/drain regions 84 are formed in second region 100B. It is also possible to form epitaxial source/drain regions 84 in second region 100B before forming epitaxial source/drain regions 82 in first region 100A.

FIGS. 12A-C through 16 depict the formation of an epitaxial source/drain region 82 in first region 100A. During the formation of the epitaxial source/drain region 82 in first region 100A, e.g., the NMOS region, the second region 100B, e.g., the PMOS region may be masked (not shown).

Figure 12A:
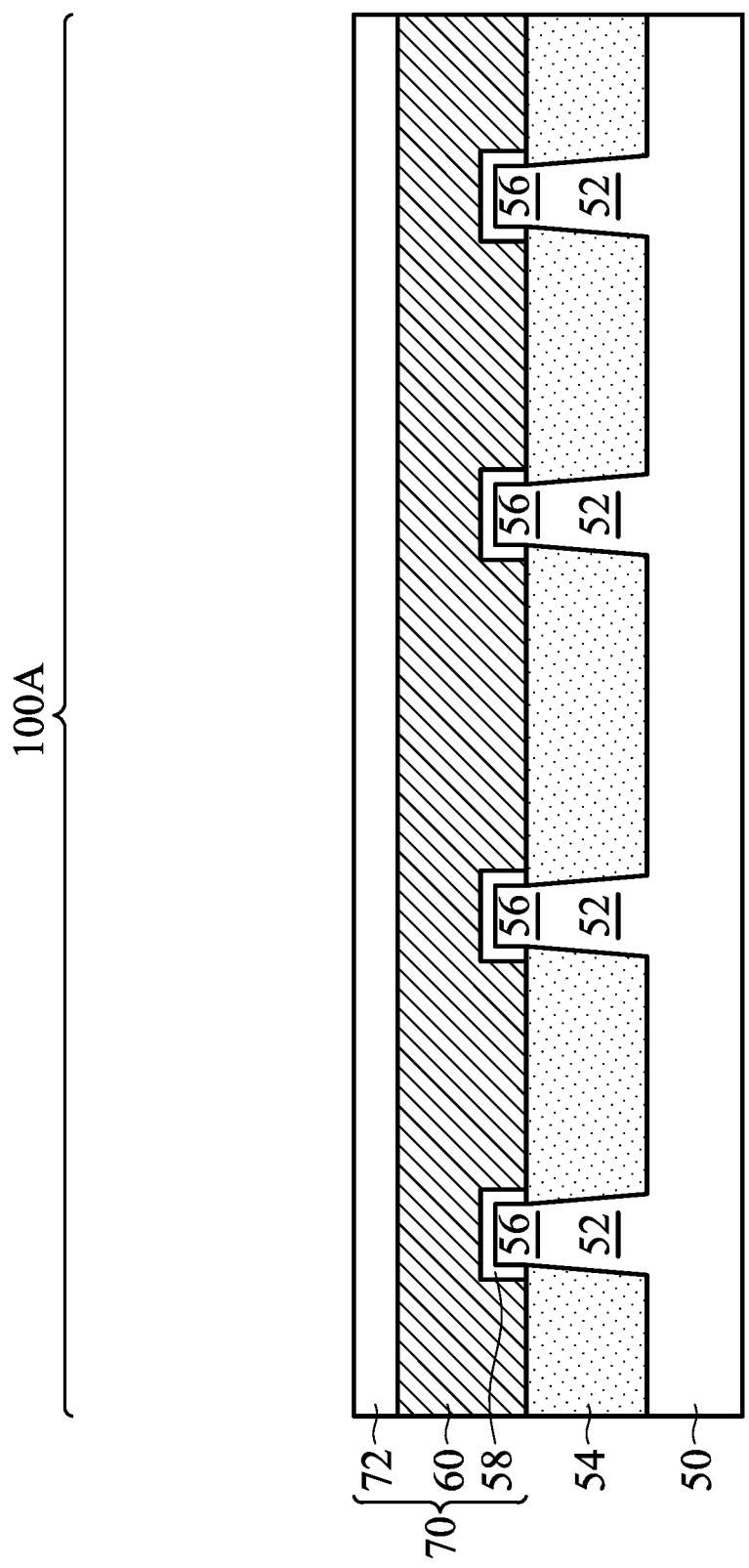
FIGS. 12A and 12B are cross-sectional views of intermediate stages in the manufacture of a finFET device in accordance with some embodiments.
Figure 12B:
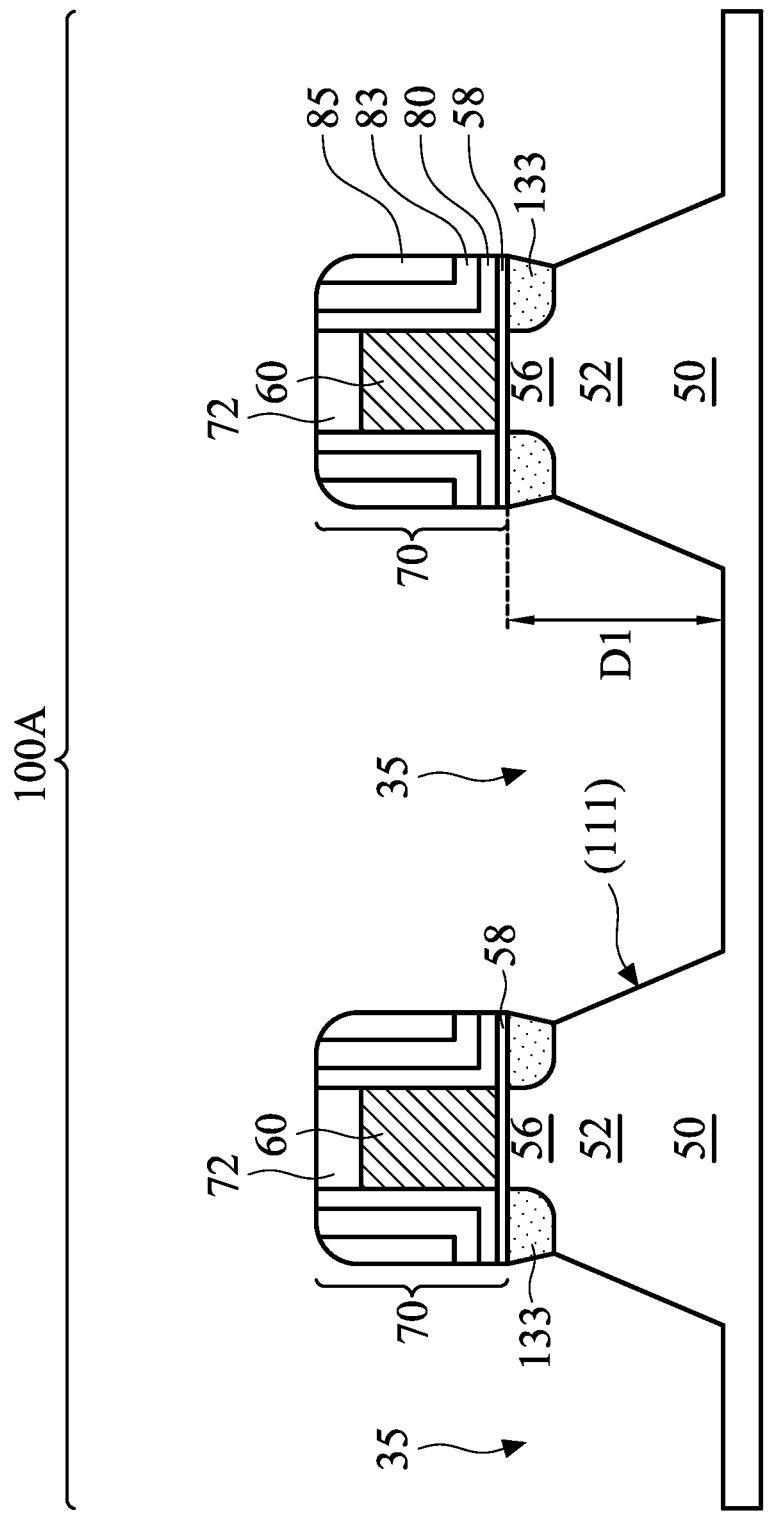

Referring to FIGS. 12A-B, source/drain regions of the fins 56 in the first region 100A are etched to form openings 35. The etching may be performed in a manner that an opening 35 is formed between neighboring dummy gates 70. Any acceptable etching process may be used. In some embodiments, a plurality of etching processes may be performed to form openings 35 in substrate 50. For example, an isotropic etch may be performed first. The isotropic etch may be a dry etch, wherein the etching gas may be selected from $CF_4$, $Cl_2$, $NF_3$, $SF_6$, and combinations thereof. An initial depth D1 of openings 35 may be between about 150 Å and about 500 Å, after the isotropic etch, for example.

Next, in some embodiments a wet etch may be performed to expand openings 35. The wet etching may be performed, for example, using Tetra-Methyl Ammonium Hydroxide (TMAH), a potassium hydroxide (KOH) solution, or the like. In some exemplary embodiments, the TMAH solution has a concentration of between about 1 percent and about 30 percent. During the wet etch, the temperature of the TMAH may be between about 20° C. and about 100° C. After the wet etching, facets may be formed in openings 35, which facets include (111) planes of substrate 50. In some exemplary embodiments, after the wet etching, depth D1 of openings 35 may be between about 300 Å and about 800 Å, for example. The resulting structure is shown in FIGS. 12A-B.

Figure 13A:
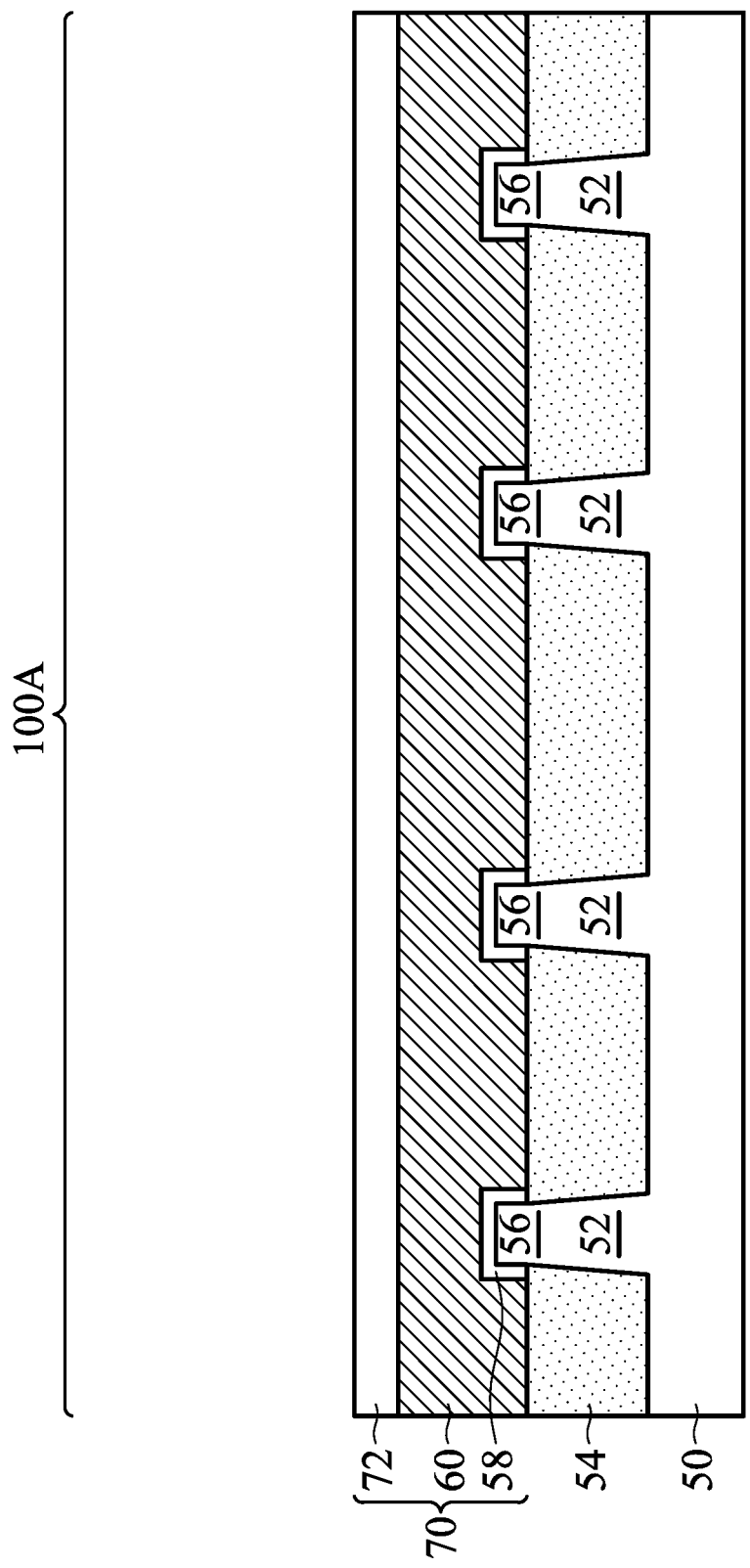
FIGS. 13A and 13B are cross-sectional views of intermediate stages in the manufacture of a finFET device in accordance with some embodiments.
Figure 13B:
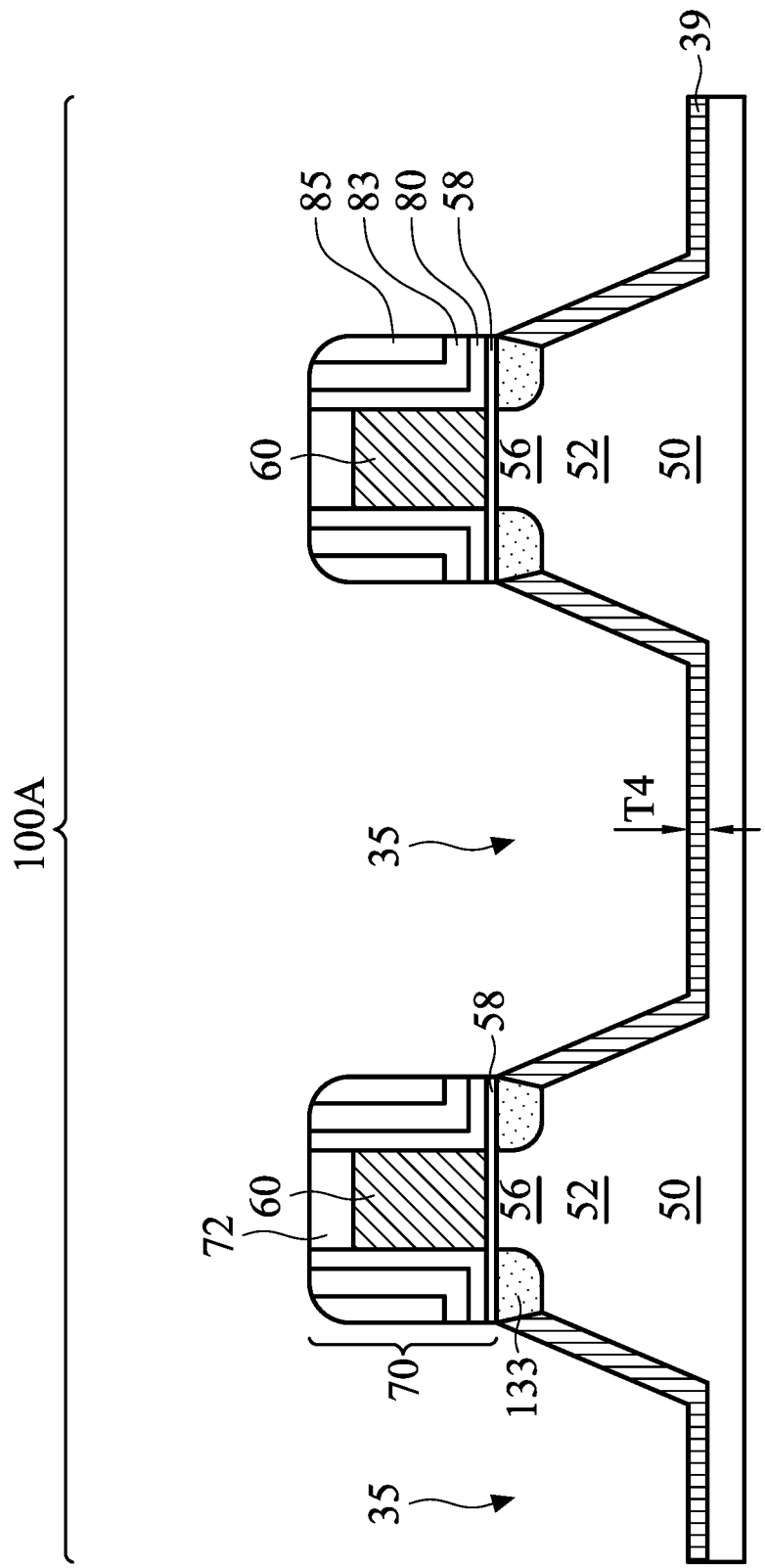

Next, as shown in FIGS. 13A-B, epitaxy layers 39 are formed. Before the epitaxy, a pre-clean may be performed, for example, using an HF-based gas or a SiCoNi-based gas. The pre-clean may remove any undesirable silicon oxide that is formed as a result of the nature oxidation of the exposed surfaces in openings 35. In some embodiments, a high-temperature baking is performed. In alternative embodiments, the baking step is skipped. The high-temperature baking may be performed with or without the presence of HCl gas. The baking temperature may be between about 700° C. and about 900° C. The pressure of baking may be between about 10 torr and about 200 torr. The baking duration may be between about 30 seconds and about 4 minutes, for example. The high-temperature baking may also remove the native oxide on the exposed surfaces of substrate 50, which exposed surfaces are in openings 35.

Next, a semiconductor material is epitaxially grown in openings 35 through Selective Epitaxial Growth (SEG), forming epitaxy layers 39. The epitaxy layers 39 may include any acceptable material, such as any material that is appropriate for n-type finFETs. For example, if the fin 56 is silicon, the epitaxial source/drain regions 82 may include silicon, SiC, SiCP, SiP, or the like. The temperature of the epitaxy may be between about 600° C. and about 900° C. In some embodiments, an etching gas is added to promote the selective growth on the exposed surfaces of substrate 50, but not on dielectrics such as gate spacers 80, 83, and 85 and mask 72. The etching gas may include $H_2$, HCl, $SiCl_2$, $GeCl_2$, or the like. The pressure of the process gases may be between about 10 torr and about 200 torr. The resulting thickness T4 of epitaxy layers 39 may be between about 10 Å and about 200 Å, for example.

During the epitaxy, desired n-type impurities may be doped while the growth proceeds. In some embodiments, the impurity concentration of n-type impurities such as phosphorous in epitaxy layers 39 is lower than about $1E21/cm^3$, and may be between about $1E18/cm^3$ and about $1E22/cm^3$. In alternative embodiments, during the epitaxy of layers 39, no n-type impurity is added.

Figure 14A:
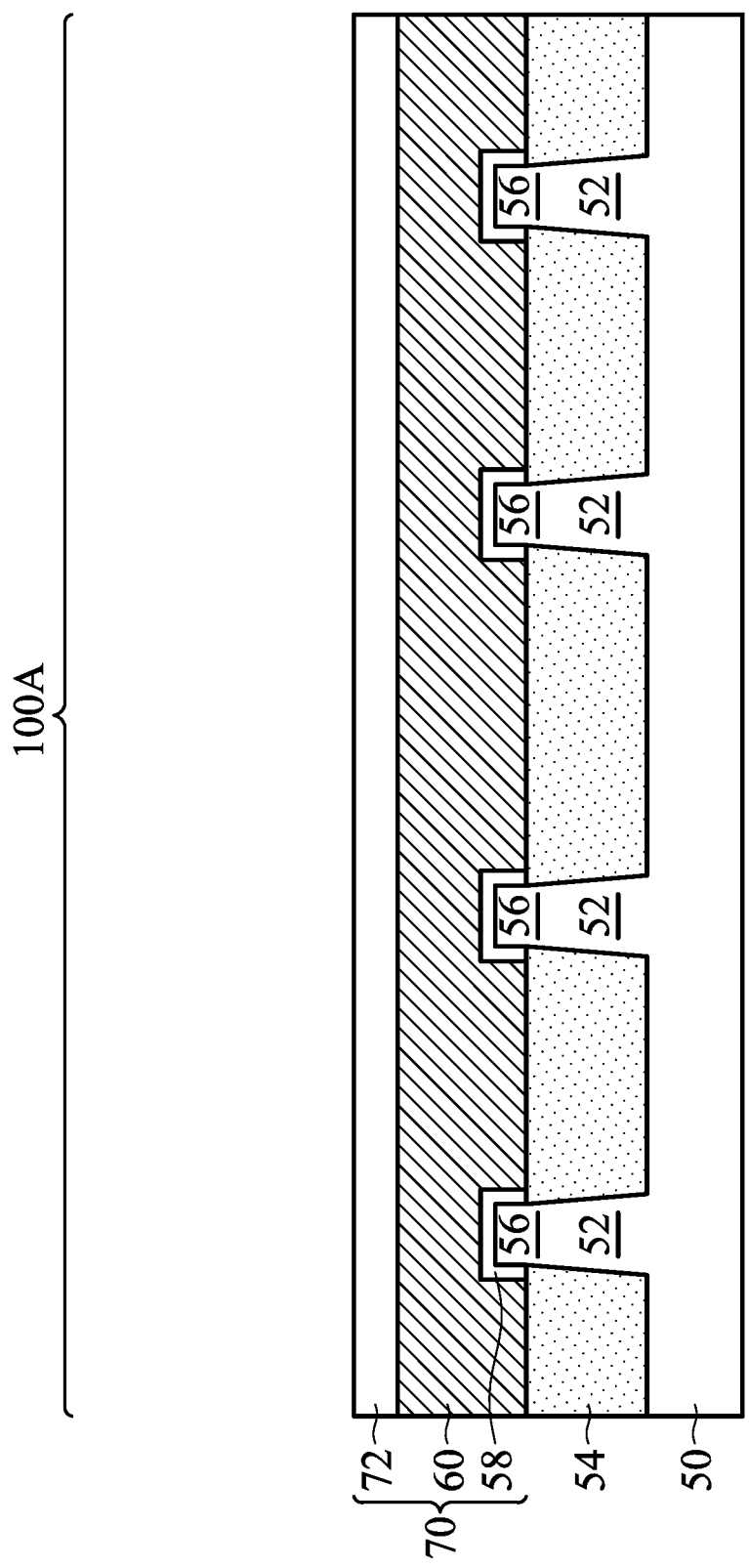
FIGS. 14A and 14B are cross-sectional views of intermediate stages in the manufacture of a finFET device in accordance with some embodiments.
Figure 14B:
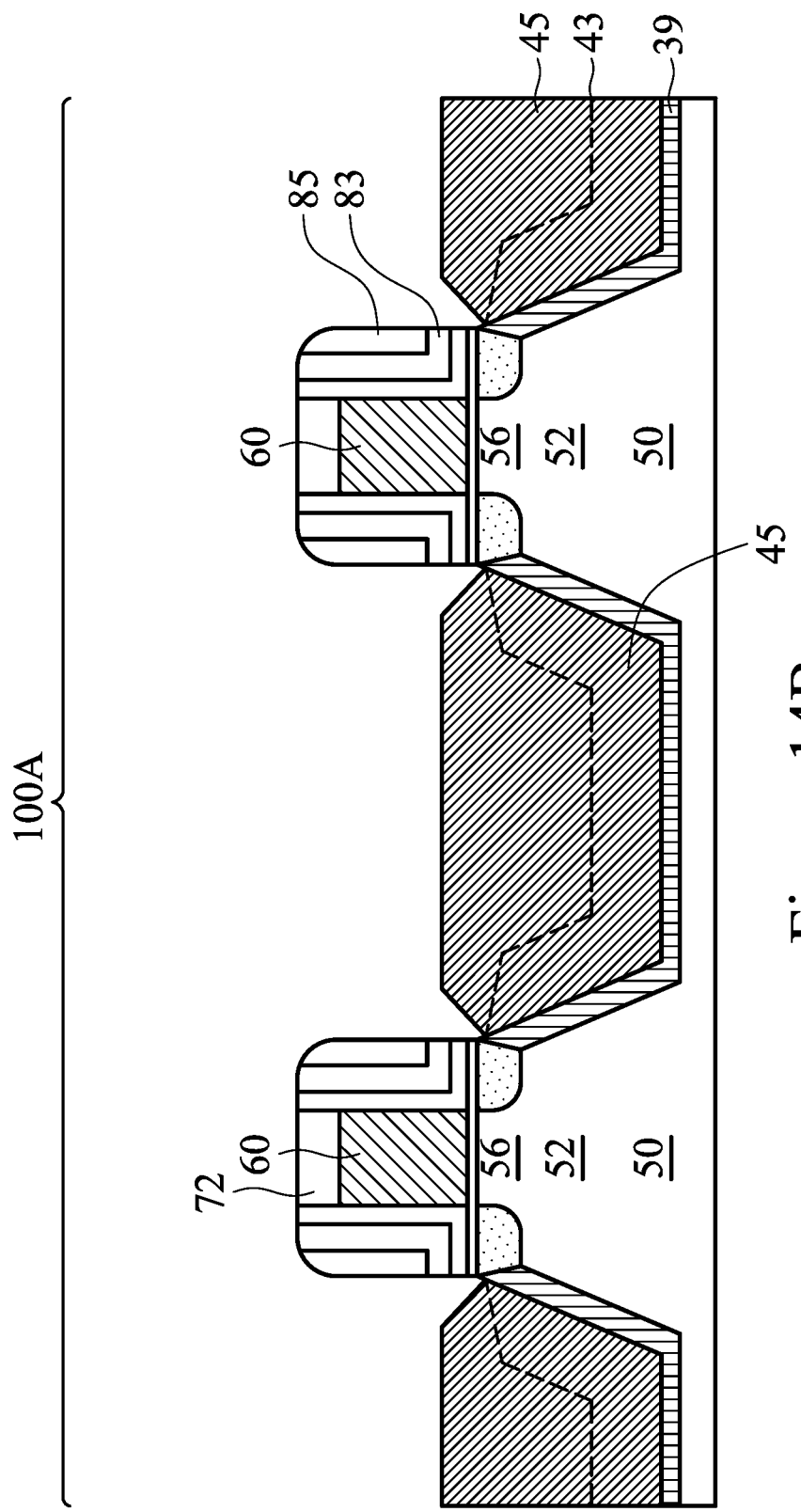

Referring to FIGS. 14A-B, epitaxy layers 45 are grown over epitaxy layers 39 through an epitaxy process. Epitaxy layers 45 may have a composition (the elements contained therein and the percentages of the elements) different from the composition of epitaxy layers 39. The process conditions for forming epitaxy layers 45 may be similar to the process conditions for forming epitaxy layers 39, except that the ratios of process gases are adjusted. Furthermore, during the epitaxy of epitaxy layers 45, an n-type impurity such as phosphorous may be in-situ doped with the proceeding of the epitaxy. The n-type impurity concentration in epitaxy layers 45 may be higher than the n-type impurity concentration in epitaxy layers 39. For example, the n-type impurity concentration in epitaxy layers 45 is between about $1E20/cm^3$ and about $8E20/cm^3$.

Epitaxy layers 45 may also include a lower layer and an upper layer with different material compositions. FIG. 14B schematically illustrates dashed lines 43 to mark the interface between the upper and the lower layer of epitaxy layers 45. In other embodiments, epitaxy layers 45 may have a substantially uniform material composition throughout epitaxy layers 45.

Figure 15A:
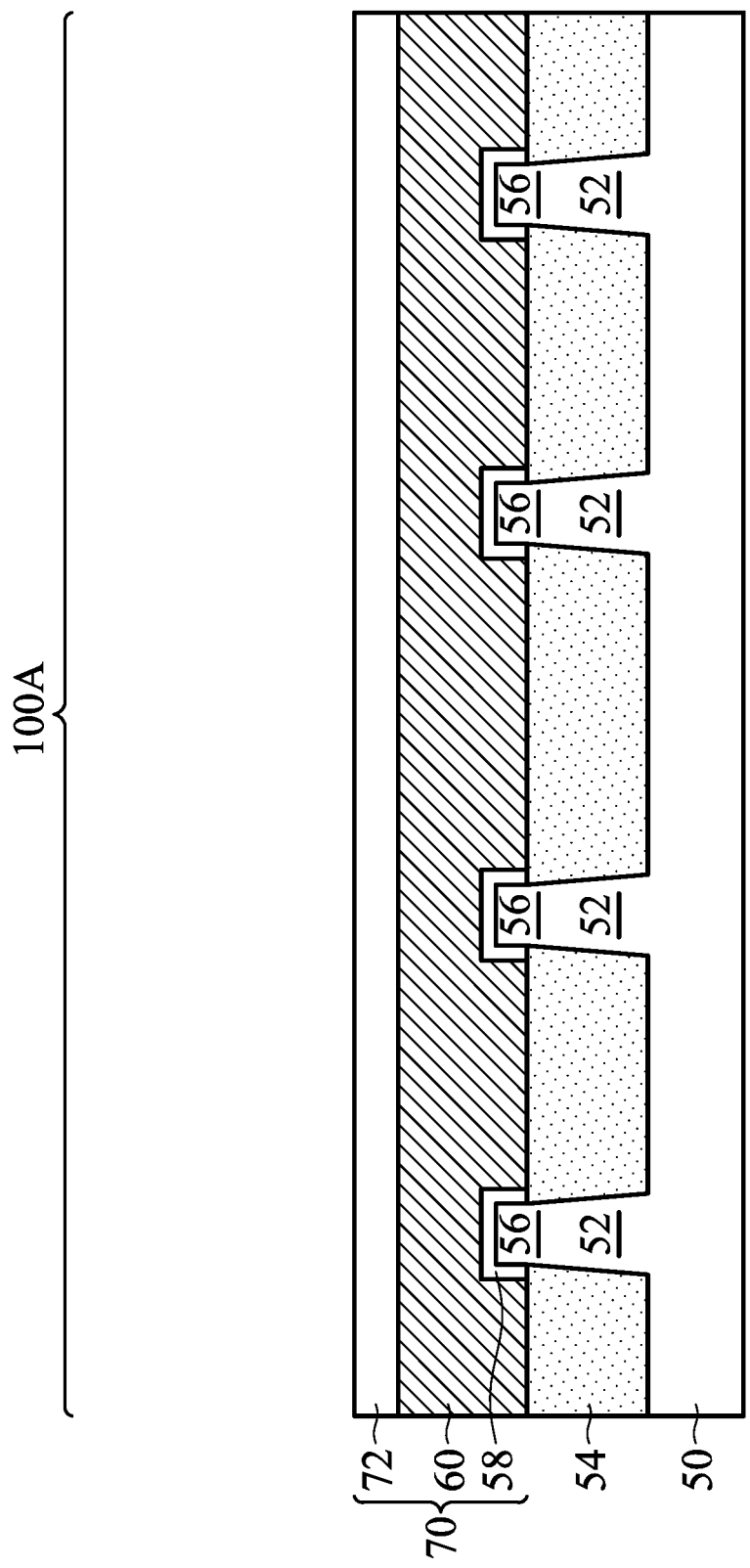
FIGS. 15A, 15B and 15C are cross-sectional views of intermediate stages in the manufacture of a finFET device in accordance with some embodiments.
Figure 15B:
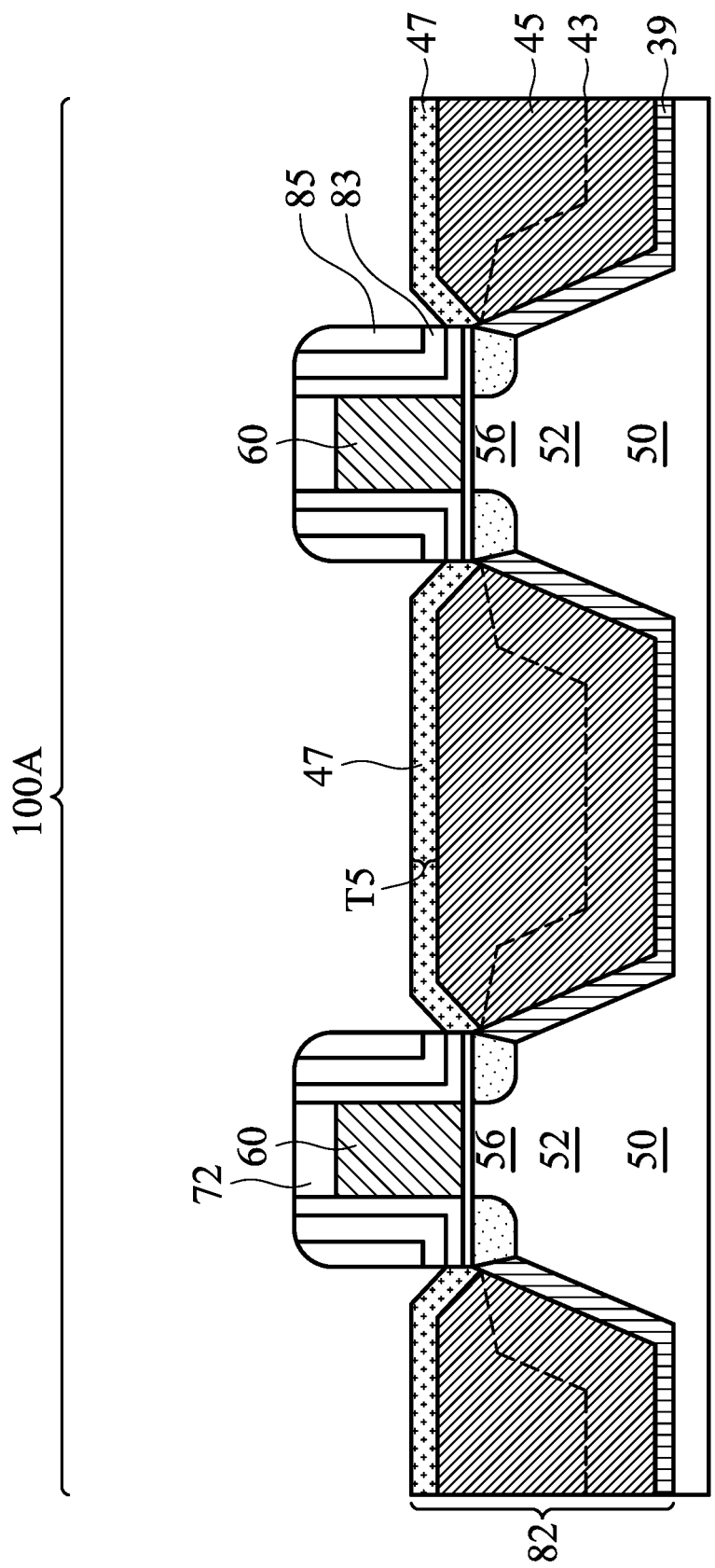
Figure 16:
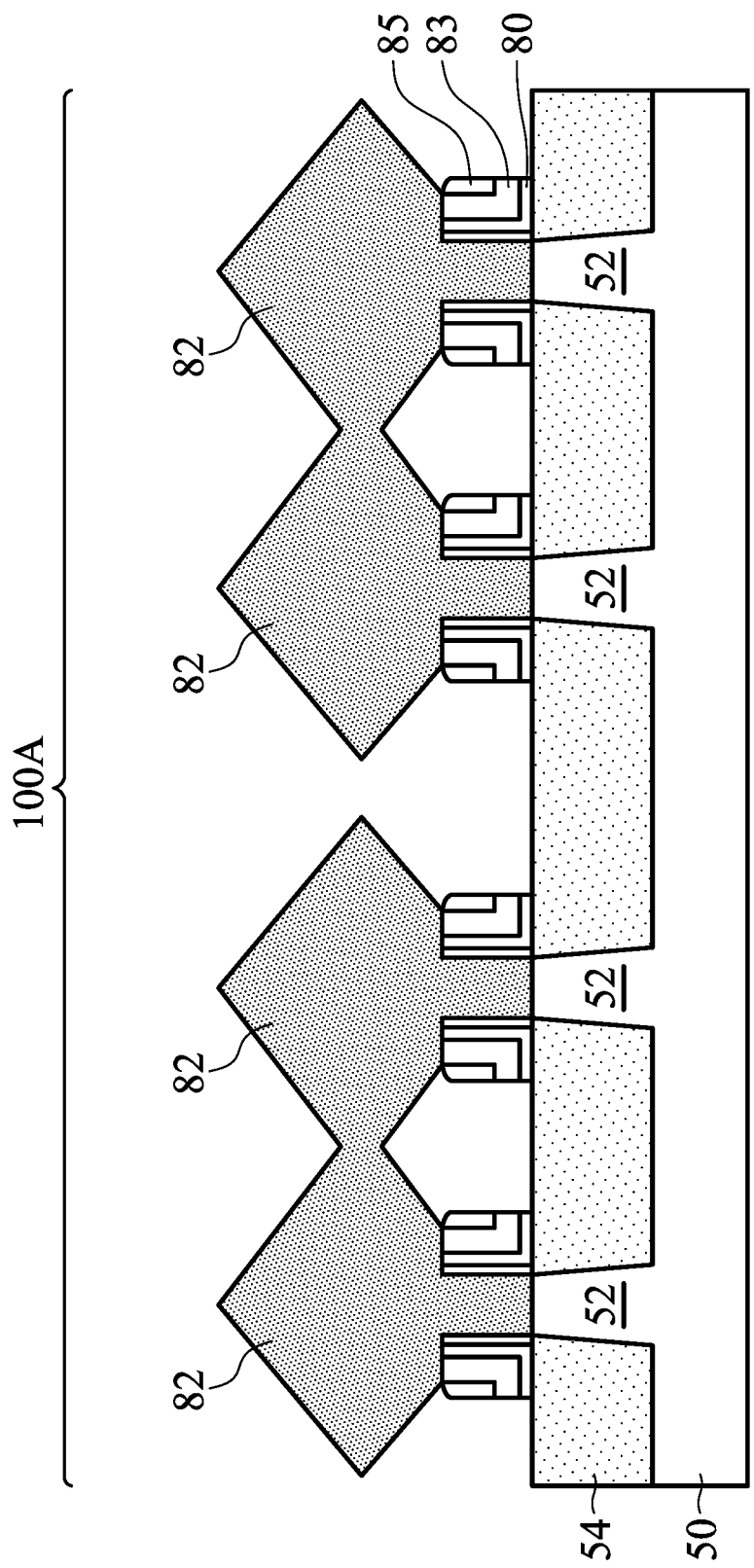
FIG. 16 is a cross-sectional view of an intermediate stage in the manufacture of a finFET device in accordance with some embodiments.

After the formation of epitaxy layers 45, capping layers 47 are formed through epitaxy, as shown in FIGS. 15A-B. Capping layers 47 may have a composition (including the elements contained therein and the percentages of the elements) different from the composition of epitaxy layers 45. Capping layers 47 may have a thickness T5 of about 10 Å to about 200 Å in some embodiments.

During the epitaxy of capping layer 47, an n-type impurity such as phosphorous may be in-situ doped with the proceeding of the epitaxy process. In some embodiments, the concentration of the n-type impurity in capping layers 47 is higher than the n-type impurity concentration in epitaxy layers 45 and 39. The growth of epitaxy layers 39, 45, and 47 may be in-situ performed in a same chamber, with no vacuum break therein.

Figure 15C:
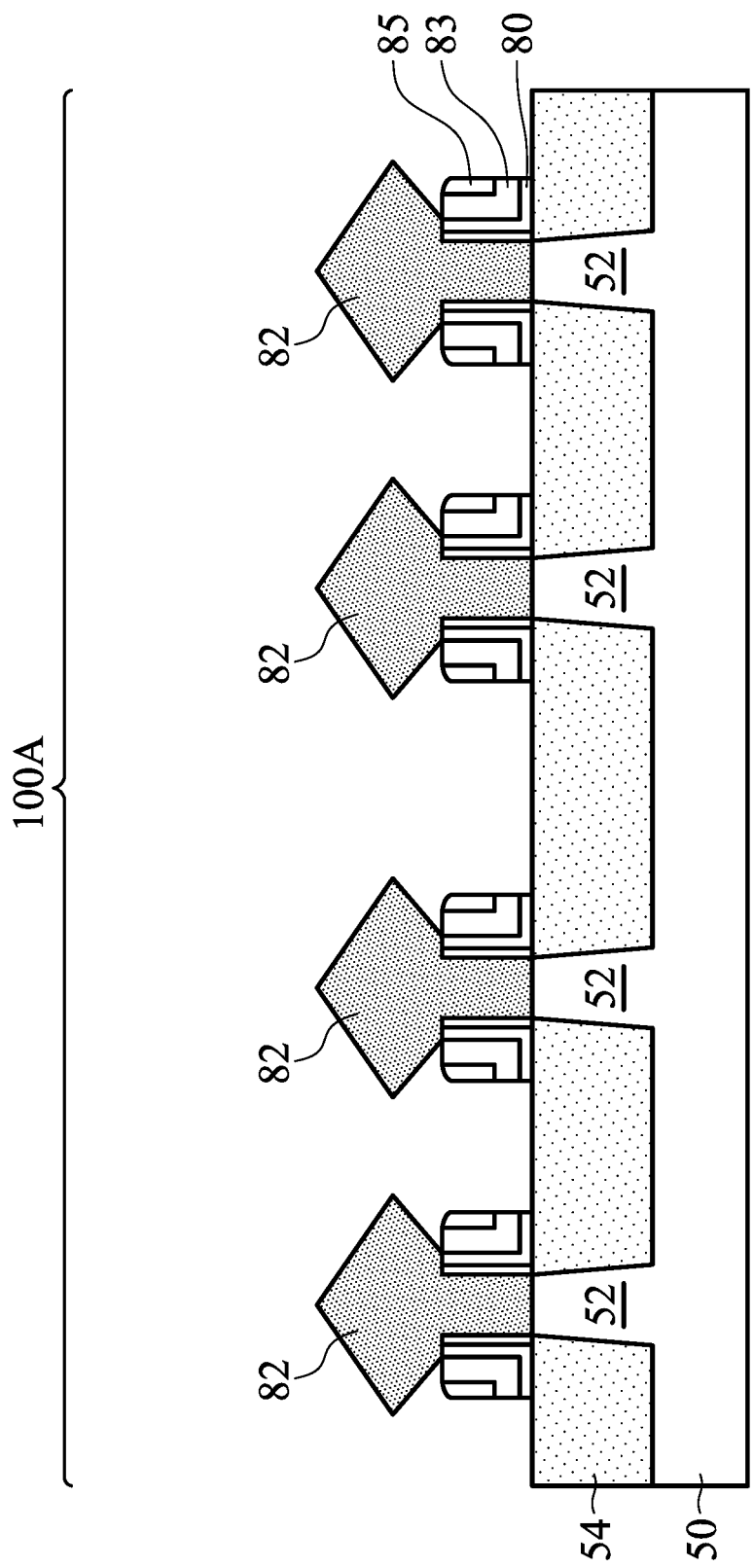

Epitaxial source/drain regions 82 in region 100A may include epitaxy layers 39, epitaxy layers 45, and capping layers 47. FIGS. 15A-C depict embodiments of epitaxial source/drain regions 82 in which each source/drain region 82 is physically separate from other source/drain regions 82. In some embodiments, two or more adjacent source/drain regions 82 may be merged. An embodiment of a finFET having merged source/drain regions is depicted in FIG. 16, which is taken along the C-C cross-section of FIG. 1. In FIG. 16, two adjacent source/drain regions 82 are merged. In some embodiments, more than two adjacent source/drain regions 82 may be merged.

Figure 17A:
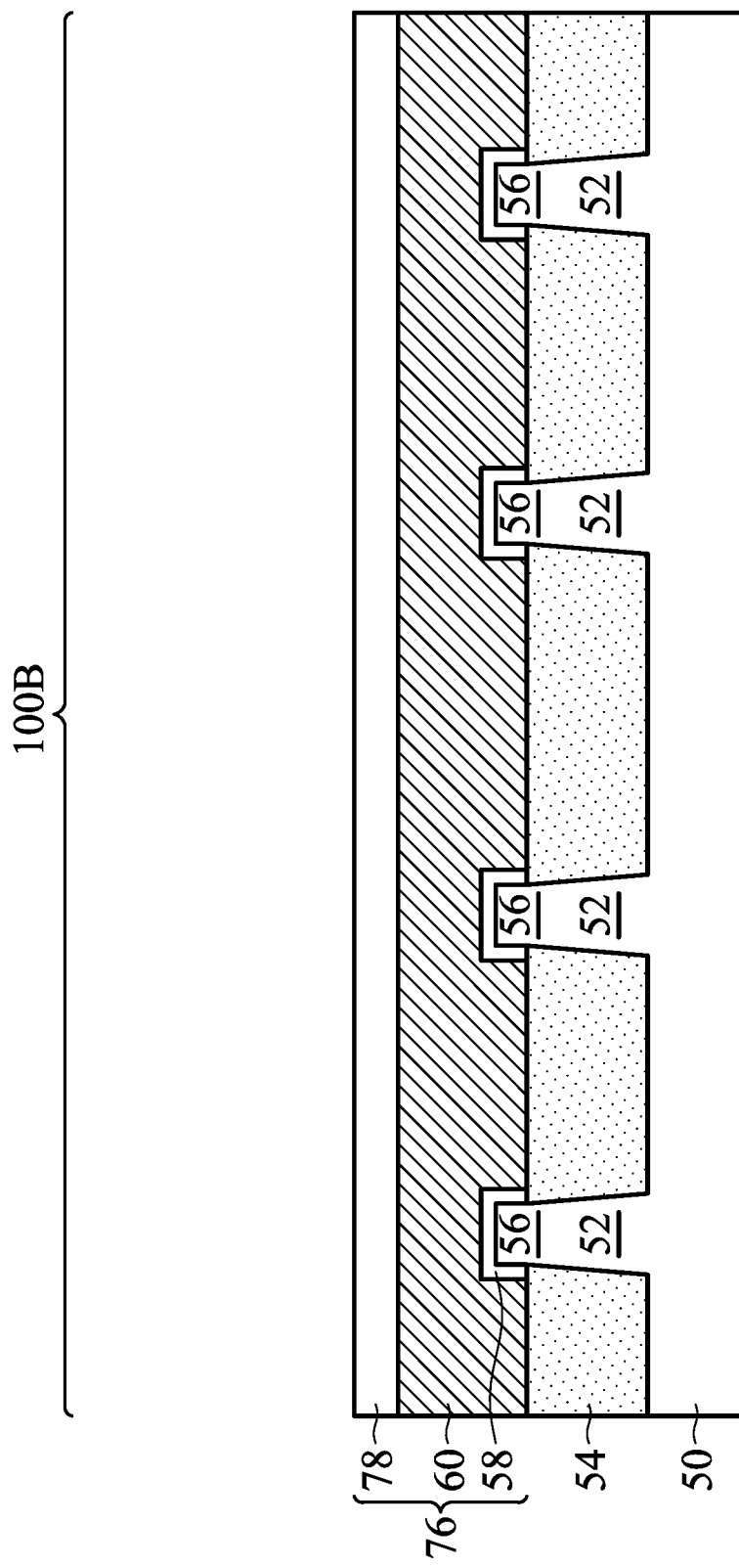
FIGS. 17A and 17B are cross-sectional views of intermediate stages in the manufacture of a finFET device in accordance with some embodiments.
Figure 17B:
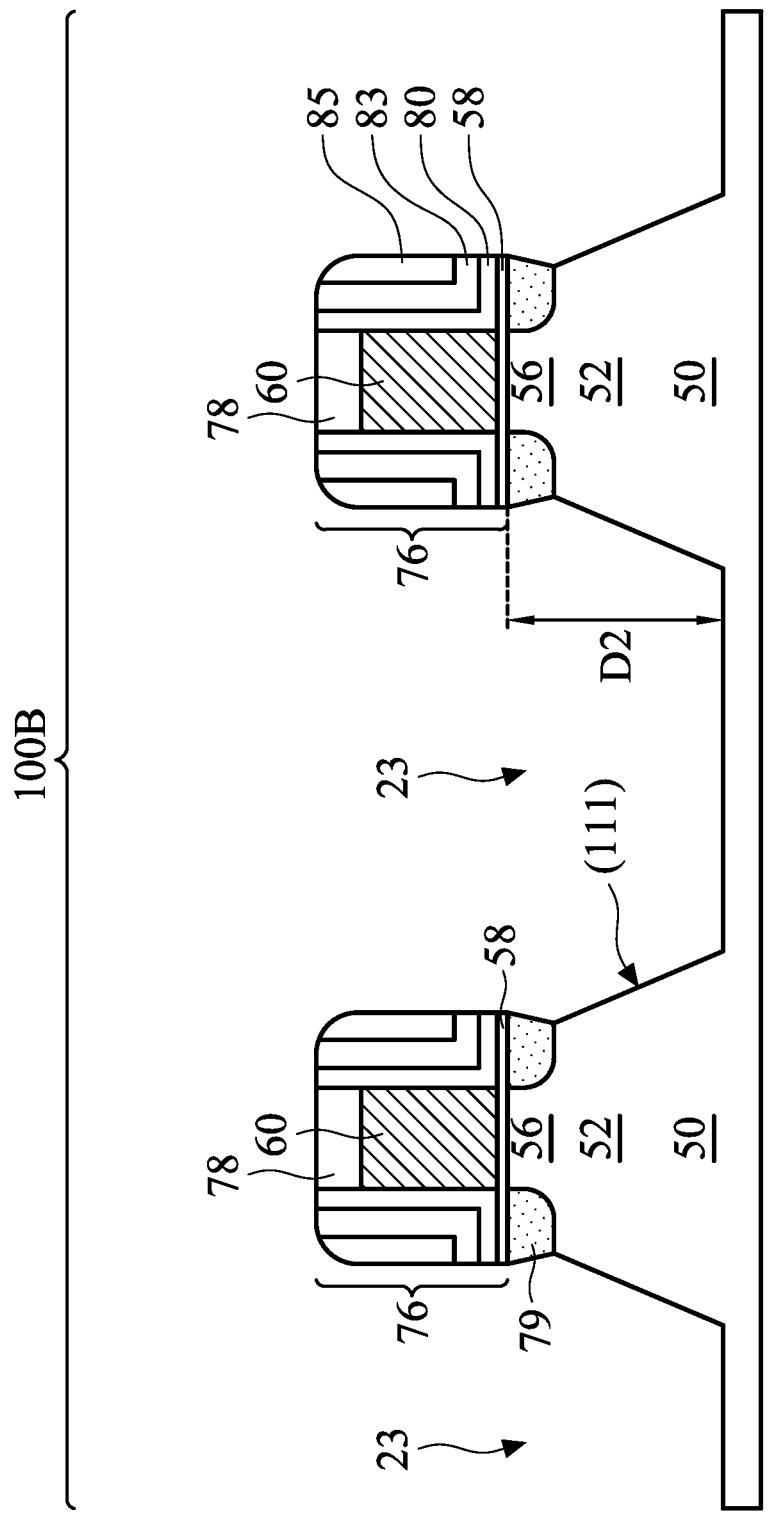

FIGS. 17A-B through 21 depict the formation of epitaxial source/drain regions 84 in second region 100B. During the formation of the epitaxial source/drain regions 84 in second region 100B, e.g., the PMOS region, the first region 100A, e.g., the NMOS region may be masked (not shown).

Referring first to FIGS. 17A-B, source/drain regions of the epitaxial fins in the second region 100B are etched to form openings 23. The etching may be performed in a manner that an opening 23 is formed between neighboring dummy gates 76, as shown in FIG. 17B. Any acceptable etching process may be used.

In some embodiments, an isotropic etch is performed to form openings 23 in substrate 50. The isotropic etch may be a dry etch, wherein the etching gas may be selected from $CF_4$, $Cl_2$, $NF_3$, $SF_6$, and combinations thereof. Depth D2 of openings 23 after the isotropic etch may be between about 150 Å and about 500 Å, for example.

Next, a wet etch may performed to expand openings 23. The wet etching may be performed, for example, using Tetra-Methyl Ammonium Hydroxide (TMAH), a potassium hydroxide (KOH) solution, or the like. In some exemplary embodiments, the TMAH solution has a concentration of between about 1 percent and about 30 percent. During the wet etch, the temperature of the TMAH may be between about 20° C. and about 100° C. After the wet etching, facets may be formed in openings 23, which facets include (111) planes of substrate 50. In some exemplary embodiments, after the wet etching, depth D2 of opening 23 may be between about 300 Å and about 800 Å, for example. The resulting structure is shown in FIGS. 17A-B.

Figure 18A:
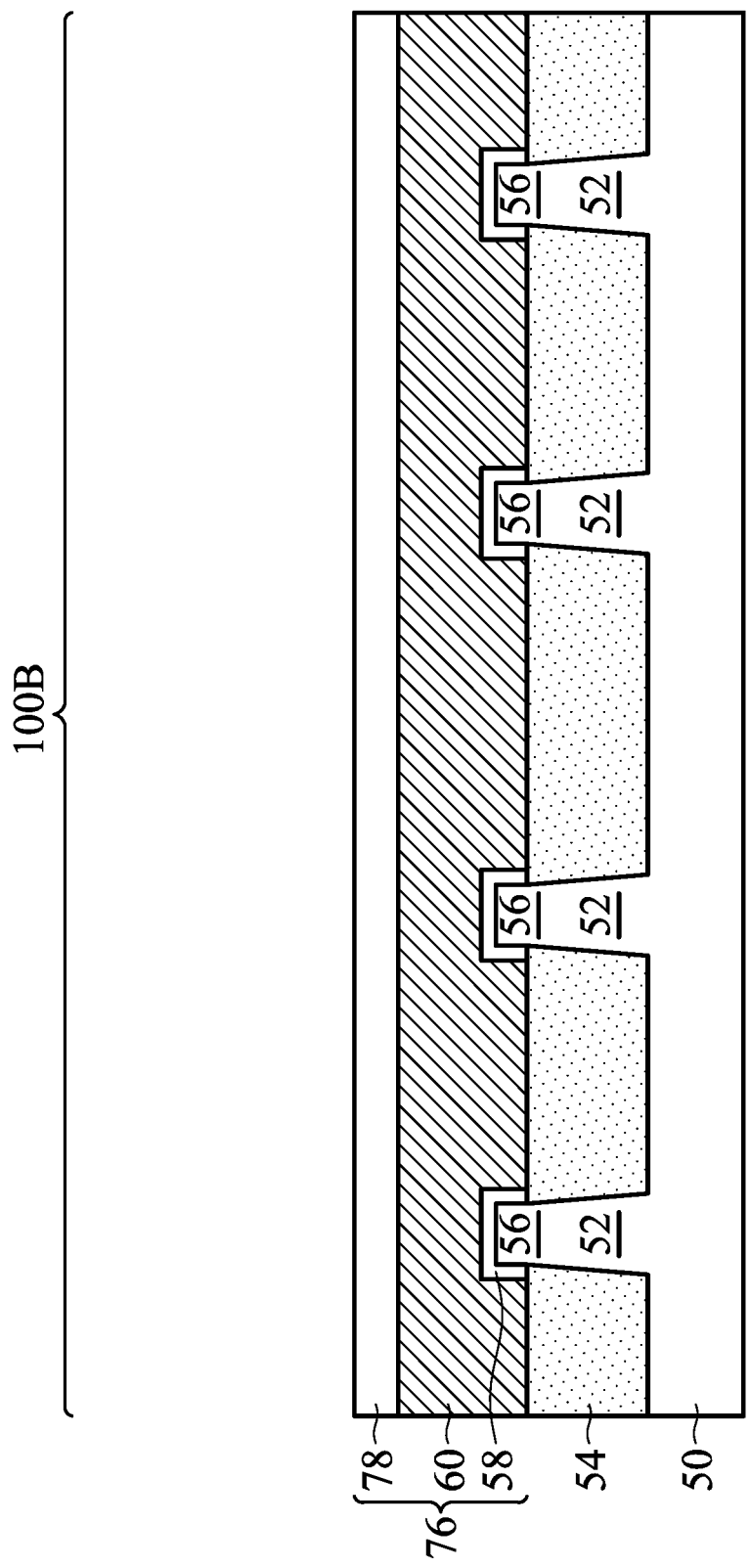
FIGS. 18A and 18B are cross-sectional views of intermediate stages in the manufacture of a finFET device in accordance with some embodiments.
Figure 18B:
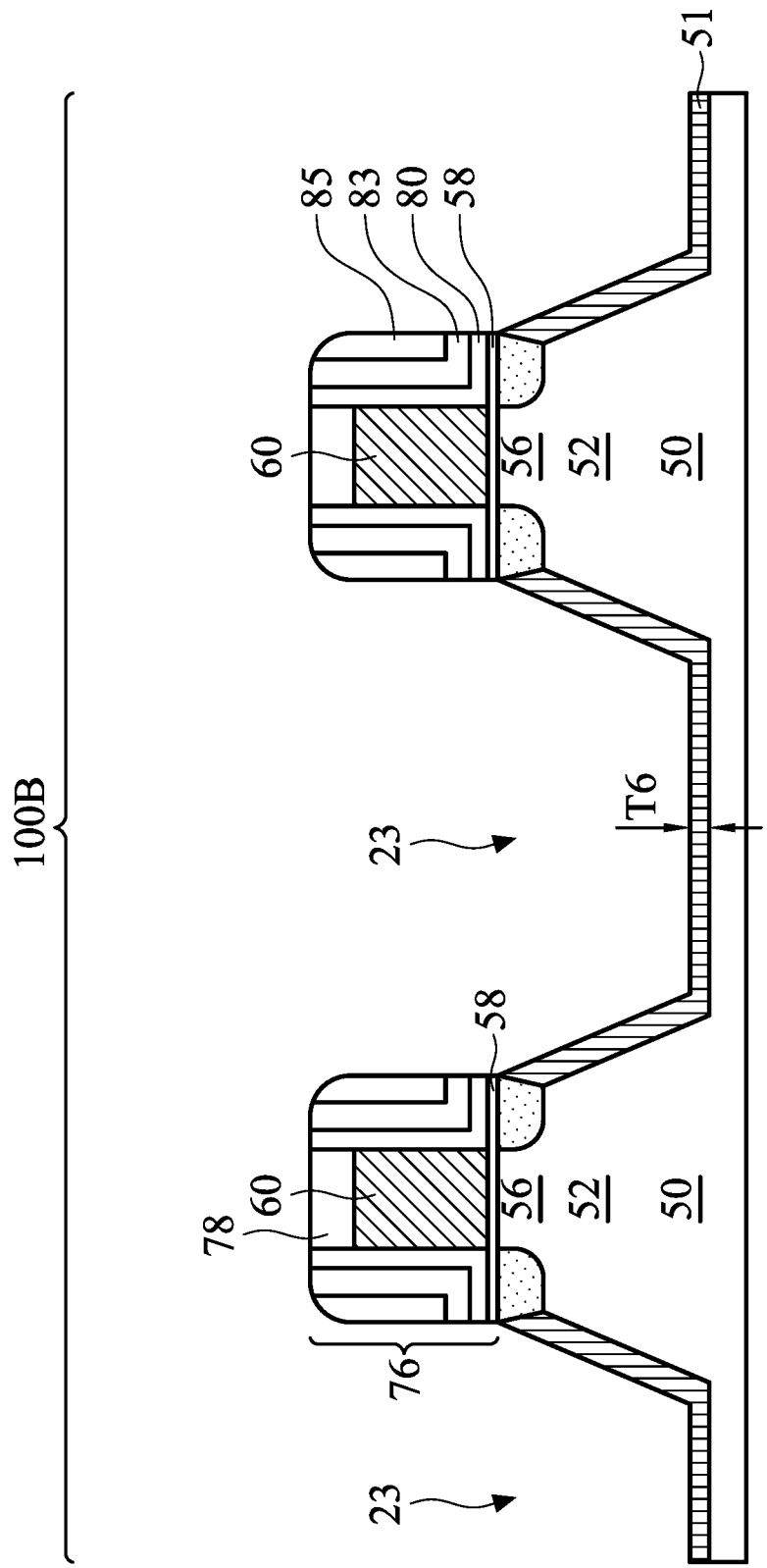

FIGS. 18A-B illustrates the formation of epitaxy layers 51. Before the epitaxy, a pre-clean may be performed, for example, using an HF-based gas or a SiCoNi-based gas. The pre-clean may remove any undesirable silicon oxide that is formed as a result of the nature oxidation of the exposed surfaces in openings 35. In some embodiments, a high-temperature baking is performed. In alternative embodiments, the baking step is skipped. The high-temperature baking may be performed with or without the presence of HCl gas. The baking temperature may be between about 700° C. and about 900° C. The pressure of baking may be between about 10 torr and about 200 torr. The baking duration may be between about 30 seconds and about 4 minutes, for example. The high-temperature baking may also remove the native oxide on the exposed surfaces of substrate 50, which exposed surfaces are in openings 23.

As shown in FIGS. 18A-B, a semiconductor material, such as silicon germanium (SiGe), is epitaxially grown in openings 23 through Selective Epitaxial Growth (SEG), forming epitaxy layers 51. Hence, throughout the description, epitaxy layers 51 are also referred to as SiGe layers 51. The process gases may include $H_2$, $N_2$, dichloro-silane (DCS), $SiH_4$, $GeH_4$, and/or the like. The temperature of the epitaxy may be between about 600° C. and about 900° C. In some embodiments, an etching gas is added to promote the selective growth on the exposed surfaces of substrate 50, but not on dielectrics such as gate spacers 80, 83 and 85 and mask 78. The pressure of the process gases may be between about 10 torr and about 200 torr. The resulting thickness T7 of SiGe layers 51 may be between about 100 Å and about 400 Å, for example.

During the epitaxy of epitaxy layers 51, desired p-type impurities may be doped while the growth proceeds. For example, when boron is to be doped, $B_2H_6$ may be included in the process gases. In some embodiments, the impurity concentration of p-type impurities such as boron in epitaxy layers 51 is lower than about $1E19/cm^3$, and may be between about $1E18/cm^3$ and about $1E20/cm^3$. In alternative embodiments, during the epitaxy of layers 51, no p-type impurity is added. Epitaxy layers 51 may have a first germanium atomic percentage between about 10 percent and about 30 percent, for example, although different germanium percentages may also be used.

Figure 19A:
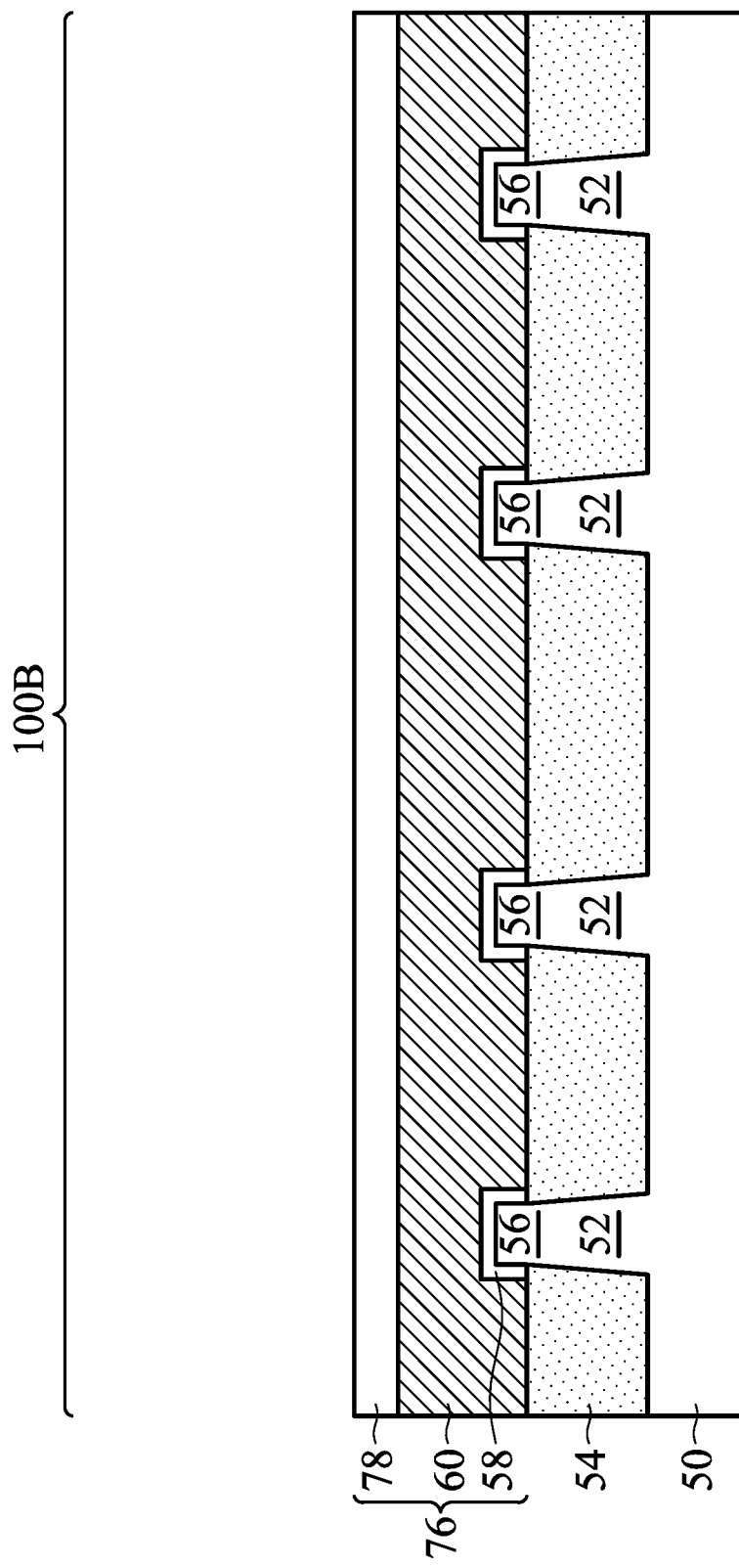
FIGS. 19A and 19B are cross-sectional views of intermediate stages in the manufacture of a finFET device in accordance with some embodiments.
Figure 19B:
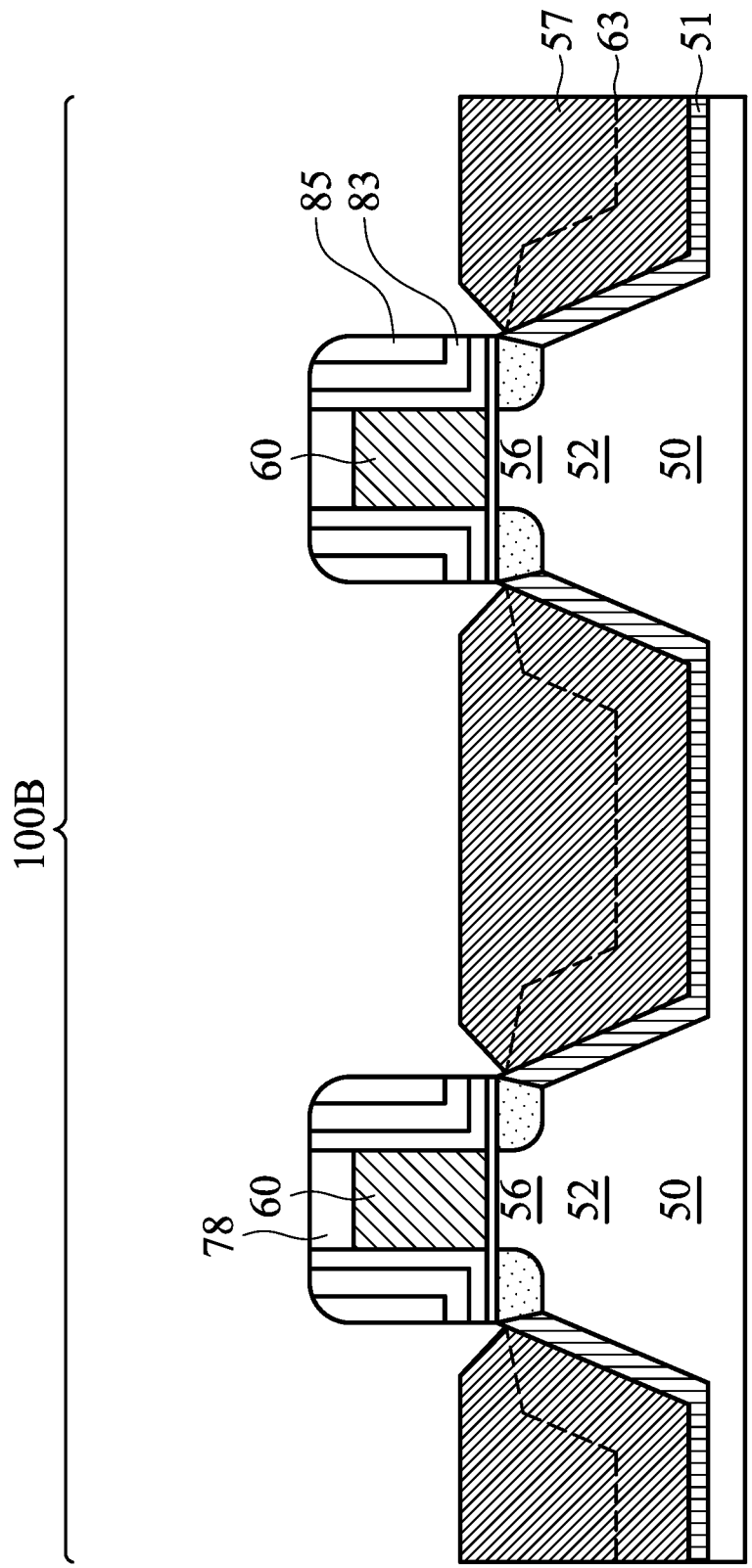

Referring to FIGS. 19A-B, epitaxy layers 57 are grown through an epitaxy. Epitaxy layers 57 may have a composition (the elements contained therein and the percentages of the elements) different from the composition of epitaxy layers 51. In some embodiments, epitaxy layers 57 are SiGe layers, which have a germanium percentage higher than the germanium percentage in epitaxy layers 51. For example, epitaxy layers 57 may have a second germanium atomic percentage between about 30 percent and about 60 percent. The process conditions for forming epitaxy layers 57 may be similar to the process conditions for forming epitaxy layers 51, except that the ratios of silicon containing gases and germanium containing gases are adjusted.

Furthermore, during the epitaxy, a p-type impurity such as boron may be in-situ doped with the proceeding of the epitaxy. The p-type impurity concentration in epitaxy layers 57 may be higher than the p-type impurity concentration in epitaxy layers 51. For example, the p-type impurity concentration in epitaxy layers 57 is between about $1E20/cm^3$ and about $8E20/cm^3$.

Epitaxy layers 57 may also include a lower layer and an upper layer with different germanium percentages, wherein each of the lower layer and the upper layer has a substantially uniform germanium percentage. FIG. 19B schematically illustrate dashed lines 63 to mark the interface between the upper and the lower layer of epitaxy layers 57. Furthermore, the germanium percentage in the upper layer may be higher than the germanium percentage in the lower layer. For example, the germanium percentage in the upper layer may be greater than about 45 percent, and the germanium percentage difference in the upper layer and the lower layer may be greater than about 10 percent in some embodiments.

In some embodiments, in each of epitaxy layers 51 and 57, the germanium percentage is substantially uniform. In alternative embodiments, either one or both of epitaxy layers 51 and 57 has a gradually and continuously changed germanium percentage. During the respective epitaxy, the flow rate of the germanium-containing precursor (such as $GeH_4$) may be gradually and continuously increased. In these embodiments, in the layer in which the germanium percentage gradually changes, the lower portions of the layer have germanium percentages lower than the germanium percentages of the upper layers.

Figure 20A:
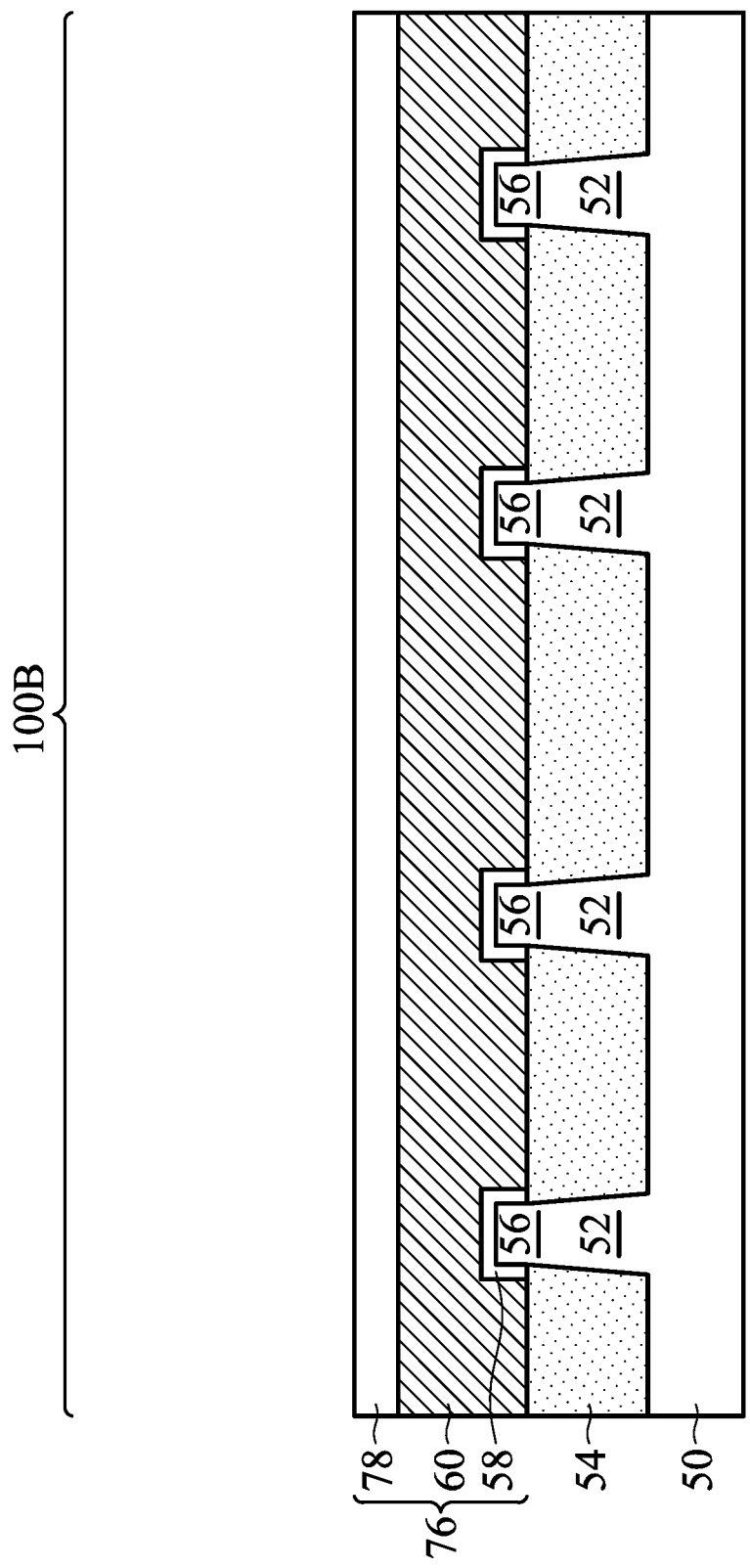
FIGS. 20A, 20B and 20C are cross-sectional views of intermediate stages in the manufacture of a finFET device in accordance with some embodiments.
Figure 20B:
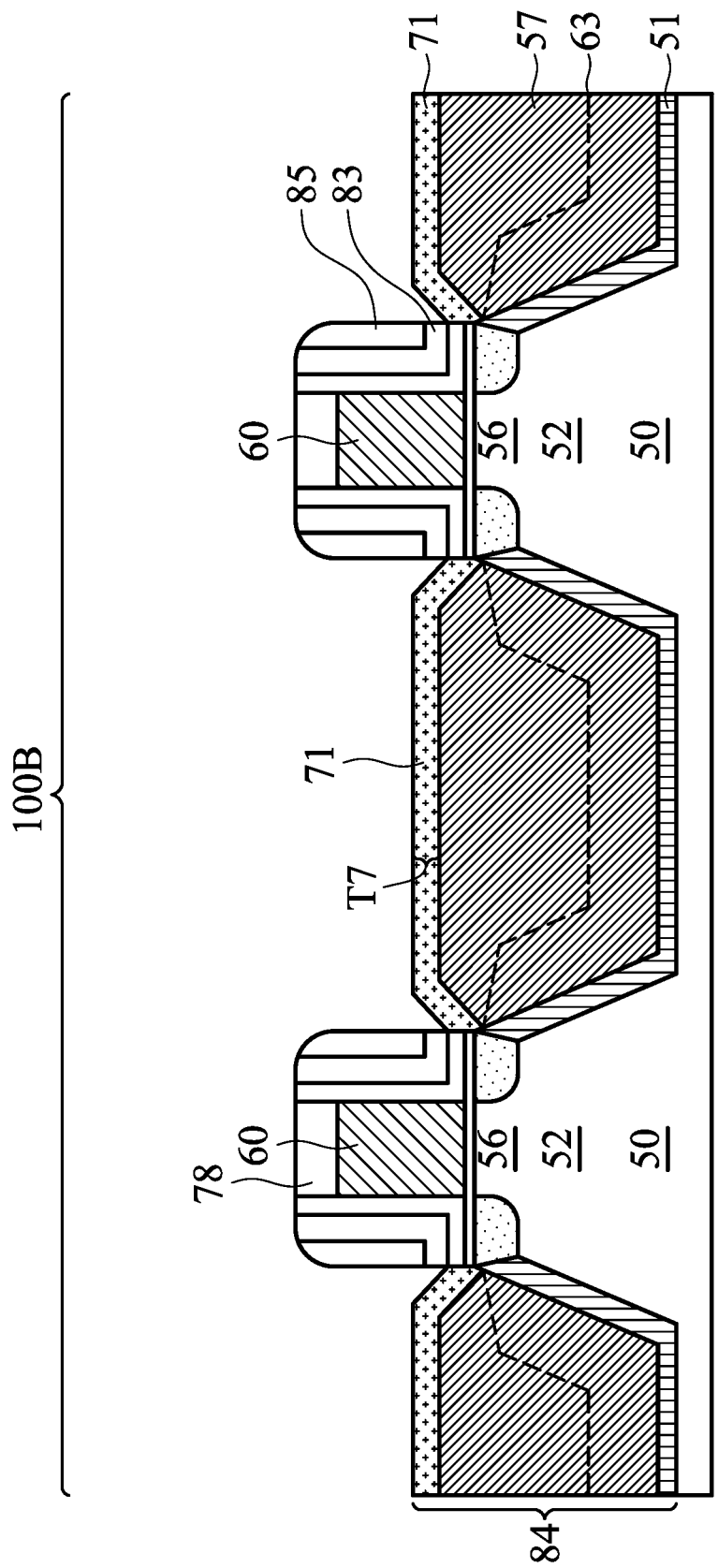
Figure 20C:
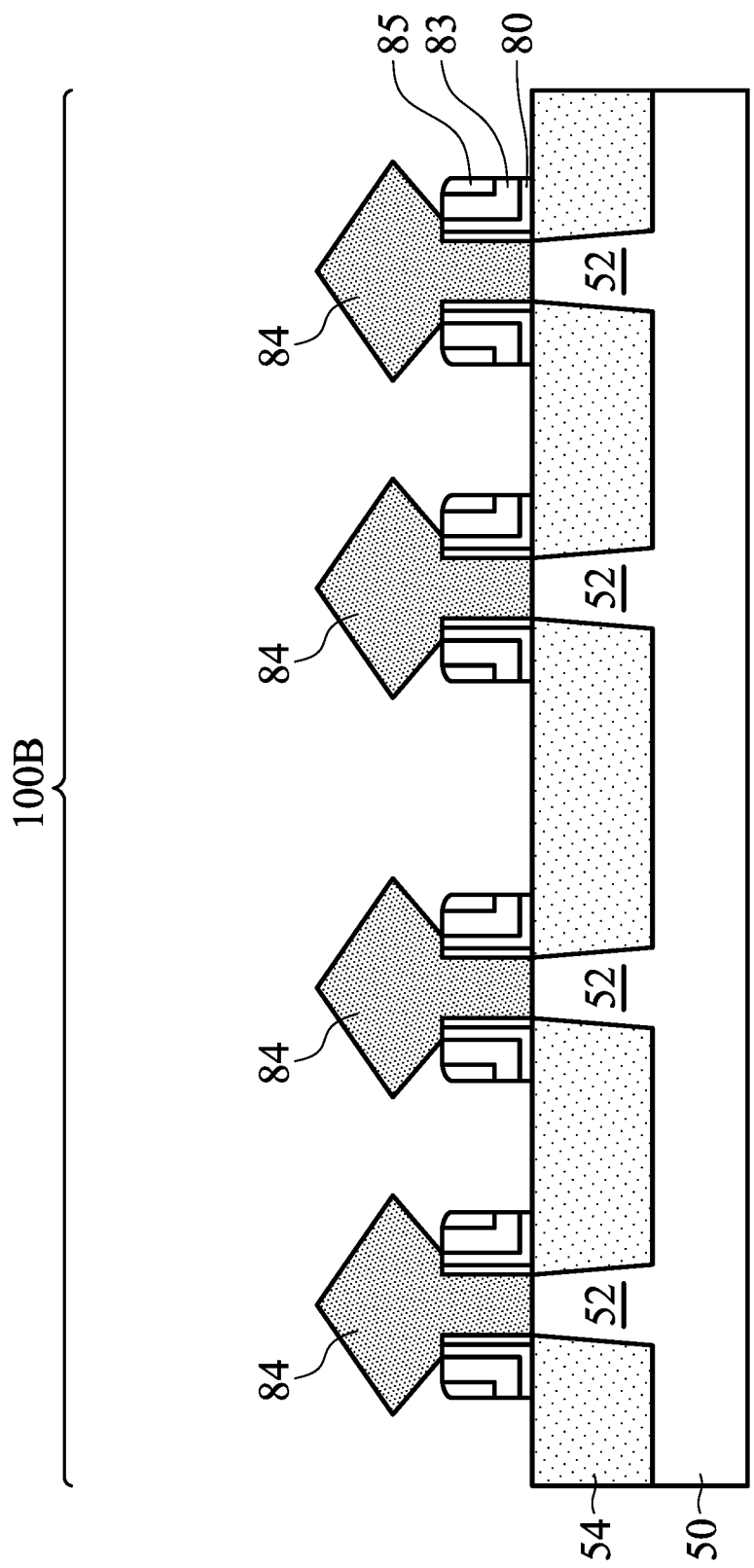
Figure 21:
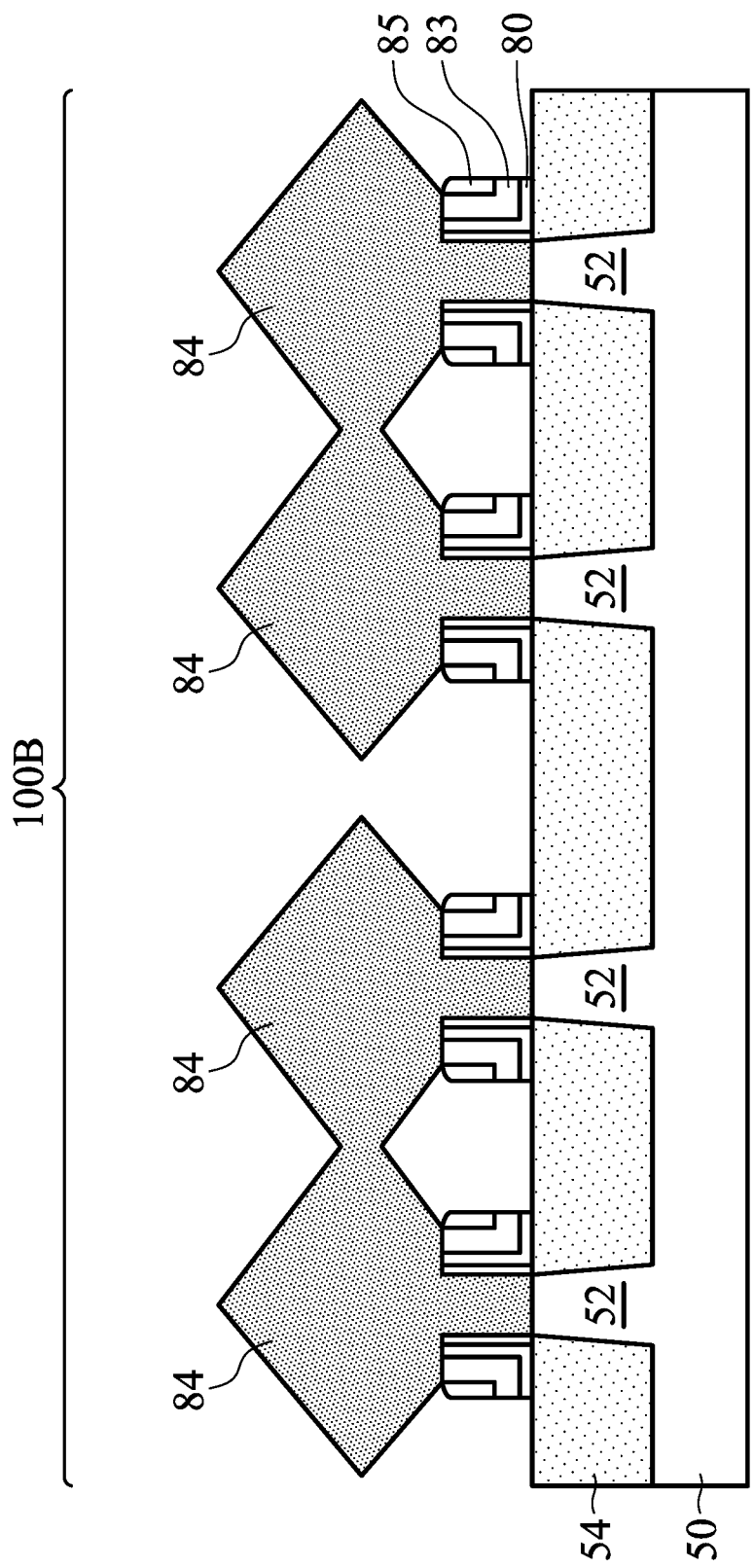
FIG. 21 is a cross-sectional view of an intermediate stage in the manufacture of a finFET device in accordance with some embodiments.

After the formation of epitaxy layers 57, capping layers 71 are formed through an epitaxy process, as shown in FIGS. 20A-C. Capping layers 71 may have a composition (including the elements contained therein and the percentages of the elements) different from the composition of epitaxy layers 57. Capping layers 71 may also be SiGe layers, with the germanium concentration in capping layers 71 lower than the germanium concentration in epitaxy layers 57. The top portion of epitaxy layer 57 that is in contact with capping layer 71 may have the highest germanium percentage in all portions of epitaxy layers 51, 57 and capping layer 71. Capping layers 71 may have a thickness T7 of about 10 Å to about 200 Å in some embodiments.

During the epitaxy of capping layer 71, a p-type impurity such as boron may be in-situ doped with the proceeding of the epitaxy. In some embodiments, the concentration of the p-type impurity in capping layers 71 is higher than the p-type impurity concentration in epitaxy layers 57 and 51. In some embodiments, a ratio of the p-type impurity concentration in capping layers 71 to the p-type impurity concentration in epitaxy layers 57 is greater than about 10. A ratio of the p-type impurity concentration in capping layer 71 to the p-type impurity concentration in epitaxy layer 57 may also be between about 5 and about 15. In some embodiments, the p-type impurity concentration in capping layer 71 is between about 1E21 and about $8E21/cm^3$. The growth of epitaxy layers 51, 57, and capping layers 71 may be in-situ performed in a same chamber, with no vacuum break therein.

As shown in FIGS. 20A-C, epitaxial source/drain regions 84 include epitaxy layers 51 and 57 and capping layers 71. FIGS. 20A-C depict embodiments of epitaxial source/drain regions 84 in which each source/drain region 84 is physically separate from other source/drain regions 84. In some embodiments, two or more adjacent source/drain regions 84 may be merged. An embodiment of a finFET having merged source/drain regions 84 is depicted in FIG. 21, which is taken along the C-C cross-section of FIG. 1. In FIG. 21, two adjacent source/drain regions 84 are merged. In some embodiments, more than two adjacent source/drain regions 84 may be merged.

Figure 22A:
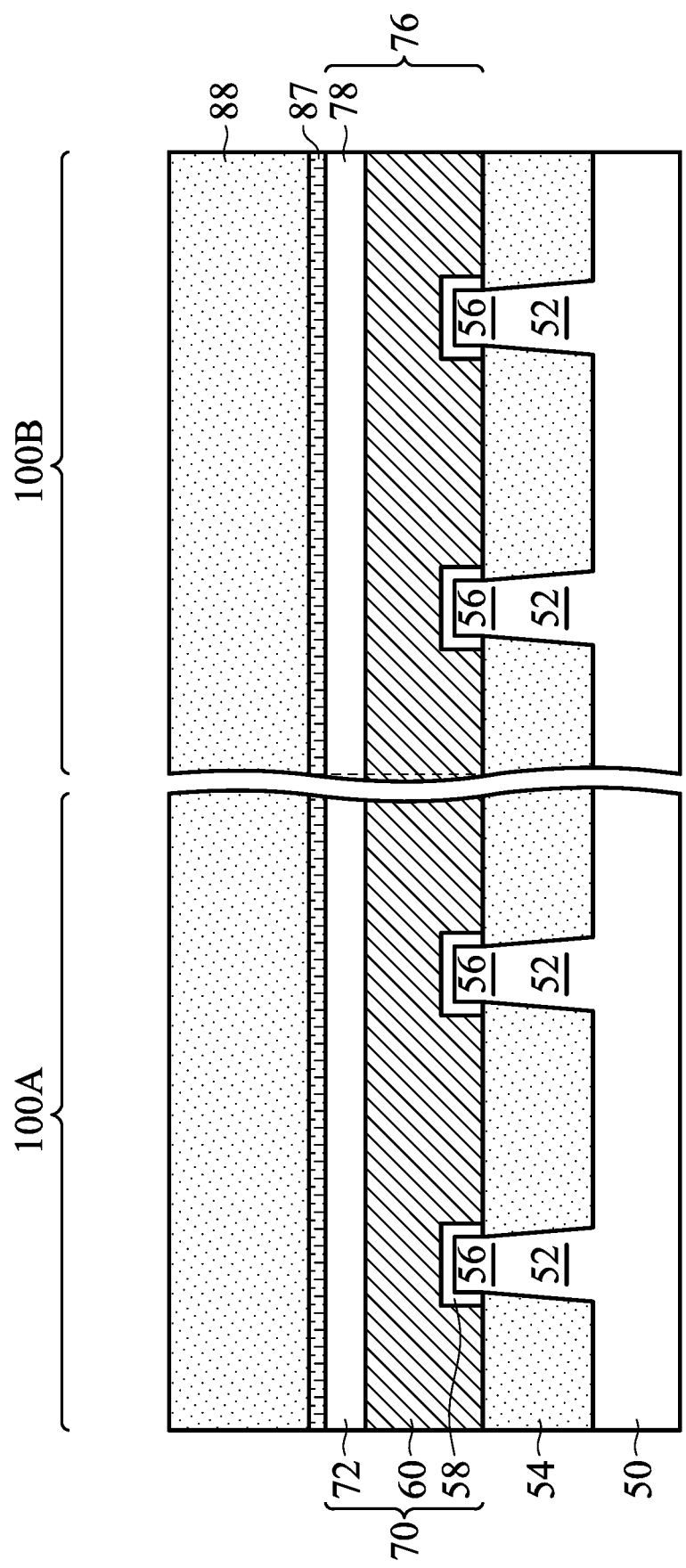
FIGS. 22A, 22B and 22C are cross-sectional views of intermediate stages in the manufacture of a finFET device in accordance with some embodiments.
Figure 22B:
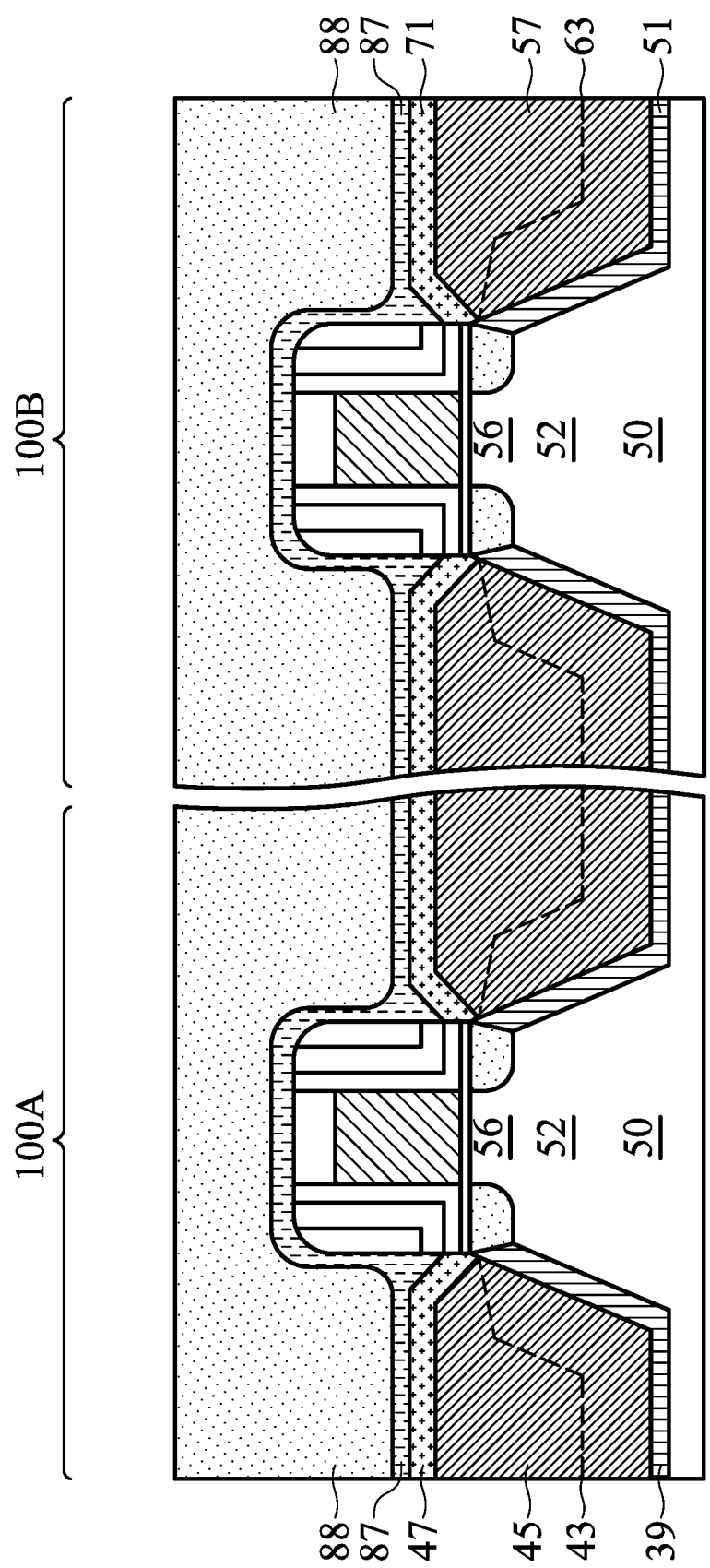
Figure 22C:
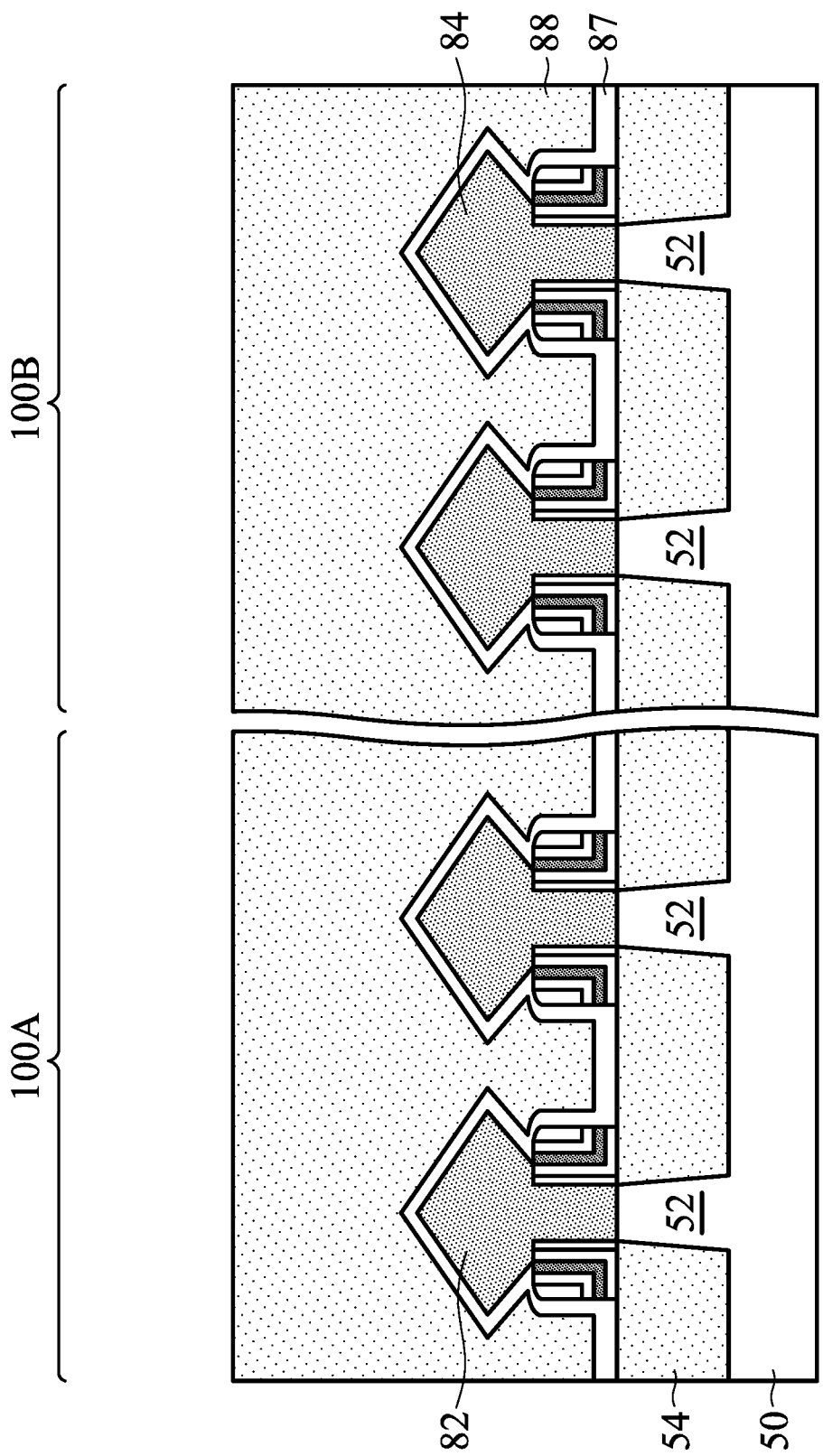

In FIGS. 22A-C, an etch stop layer 87 and an intermediate layer dielectric (ILD) 88 are deposited over the structure illustrated in FIGS. 12A-C through 21. In an embodiment, the ILD 88 is a flowable film formed by a flowable CVD. In some embodiments, the ILD 88 is formed of a dielectric material such as Phospho-Silicate Glass (PSG), Boro-Silicate Glass (BSG), Boron-Doped Phospho-Silicate Glass (BPSG), undoped Silicate Glass (USG), or the like, and may be deposited by any suitable method, such as CVD, or PECVD. The etch stop layer 87 may be formed of any suitable material. In some embodiments, the etch stop layer 87 is formed of silicon nitride or the like, and may be deposited by any suitable method, such as ALD, CVD, PECVD, or the like.

Figure 23A:
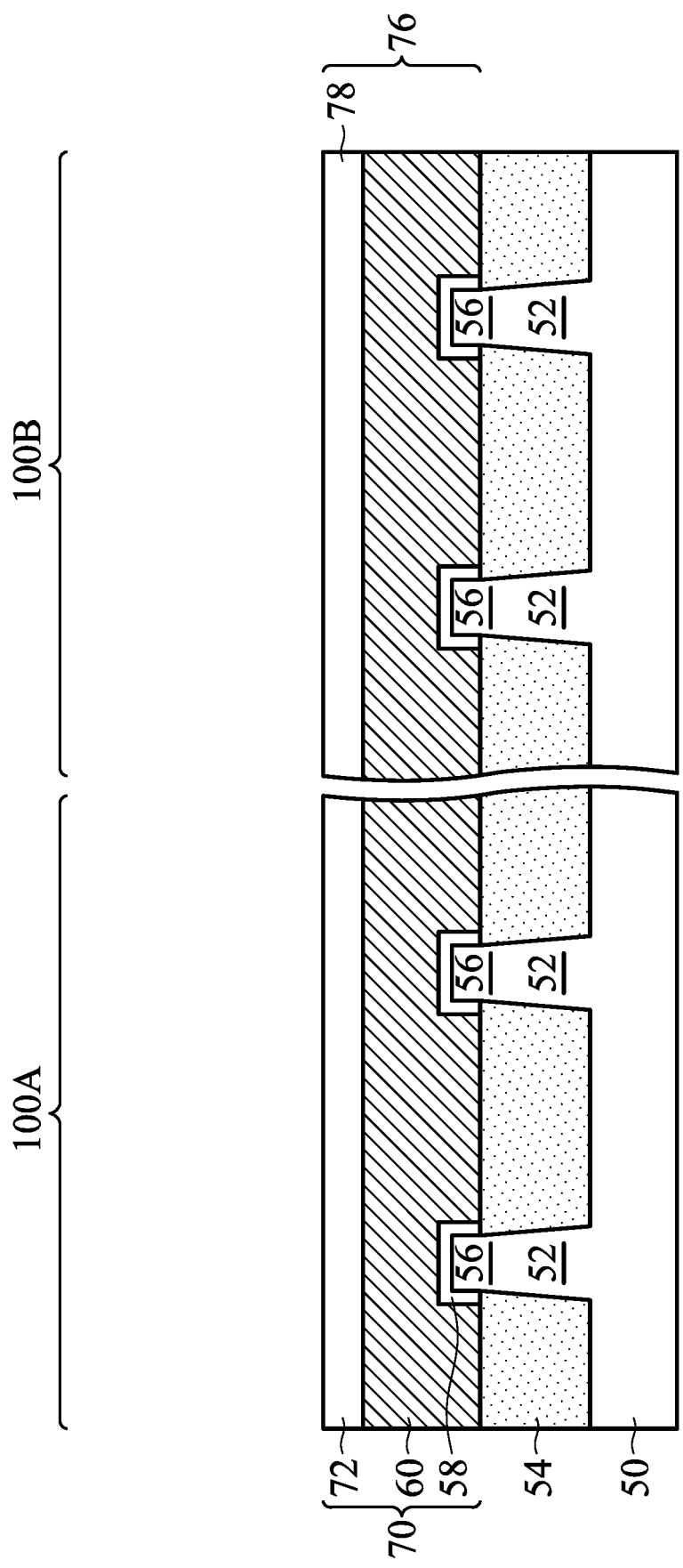
FIGS. 23A, 23B and 23C are cross-sectional views of intermediate stages in the manufacture of a finFET device in accordance with some embodiments.
Figure 23B:
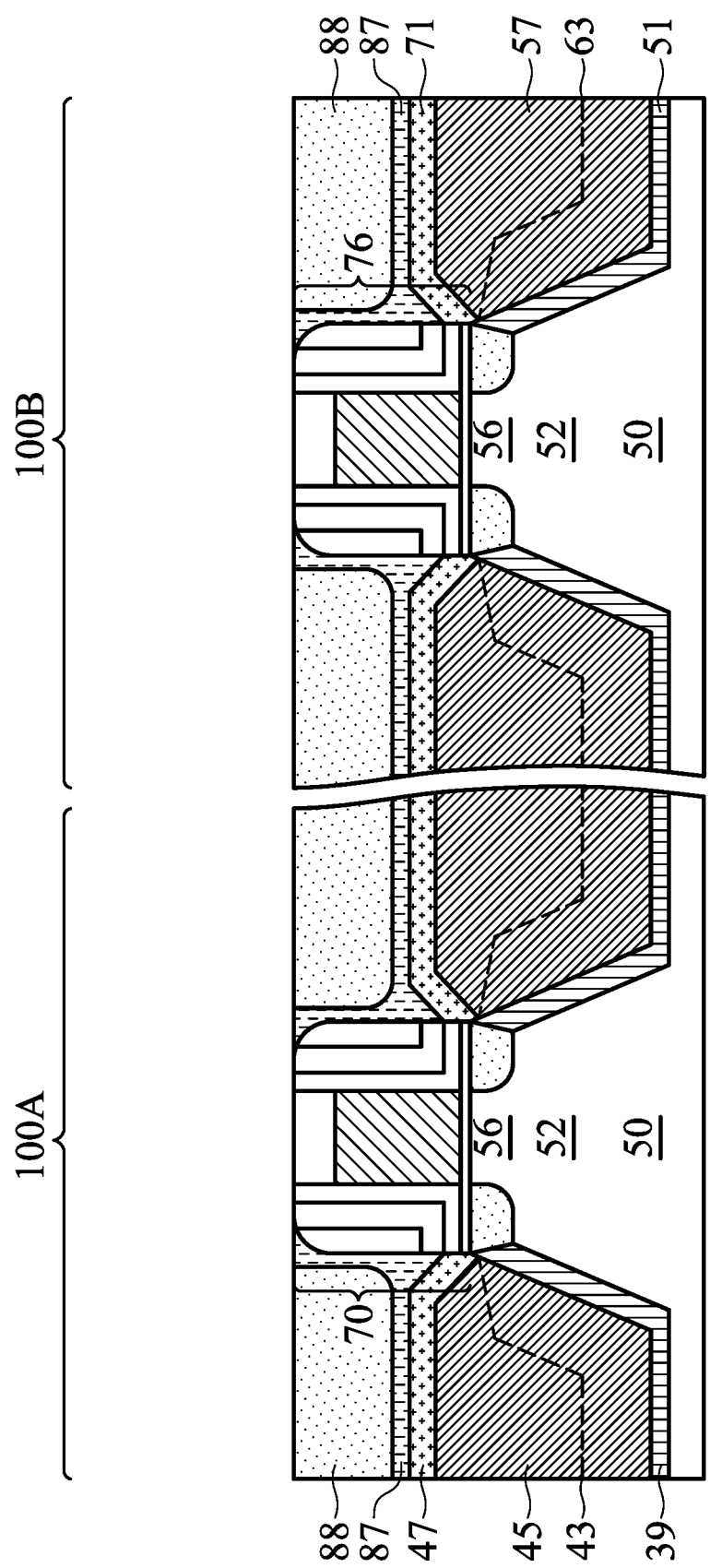
Figure 23C:
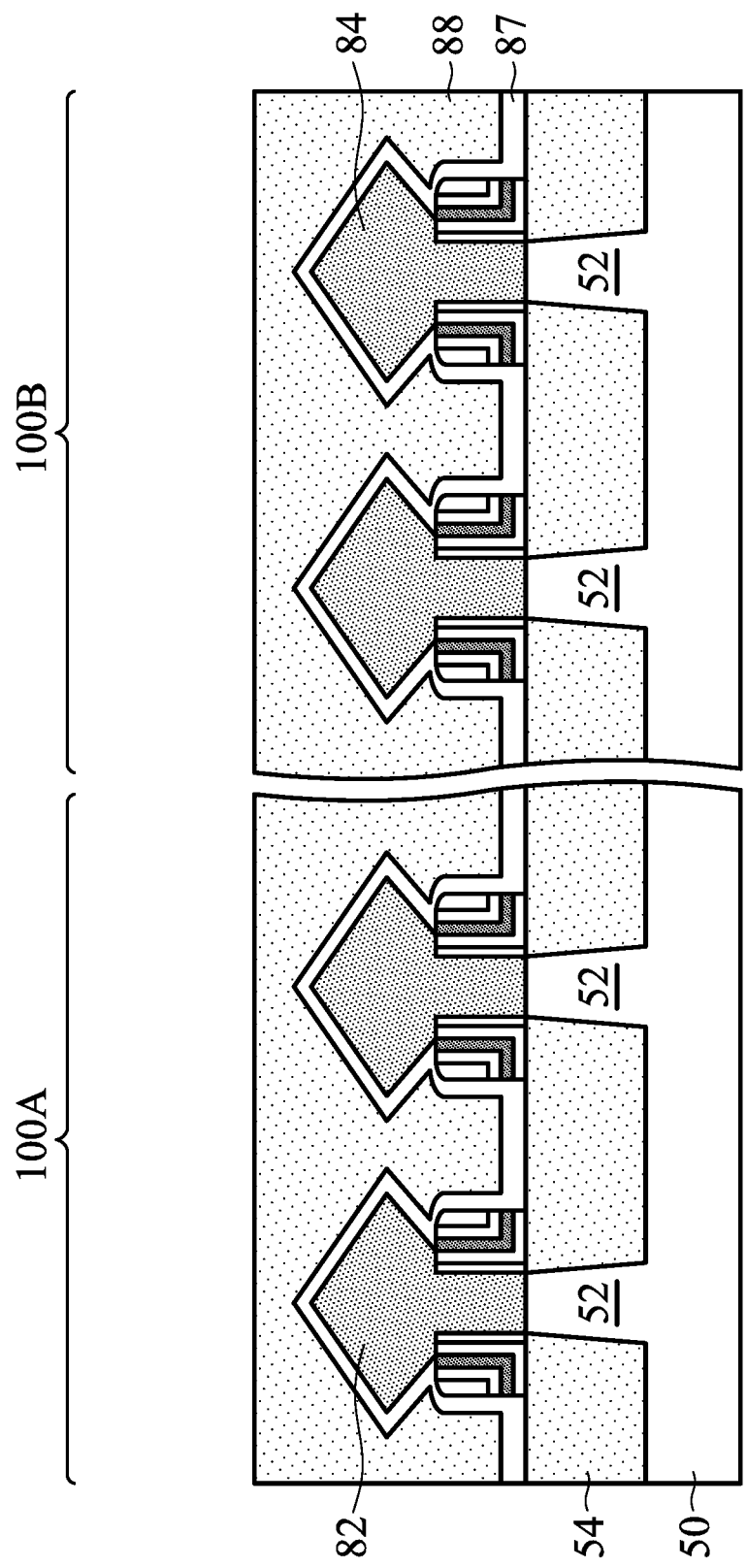

In FIGS. 23A-C, a planarization process, such as a CMP, may be performed to level the top surface of ILD 88 with the top surfaces of the dummy gates 70 and 76. After the planarization process, top surfaces of the dummy gates 70 and 76 are exposed through the ILD 88. In some embodiments, the CMP may remove the masks 72 and 78, or portions thereof, on the dummy gates 70 and 76.

Figure 24A:
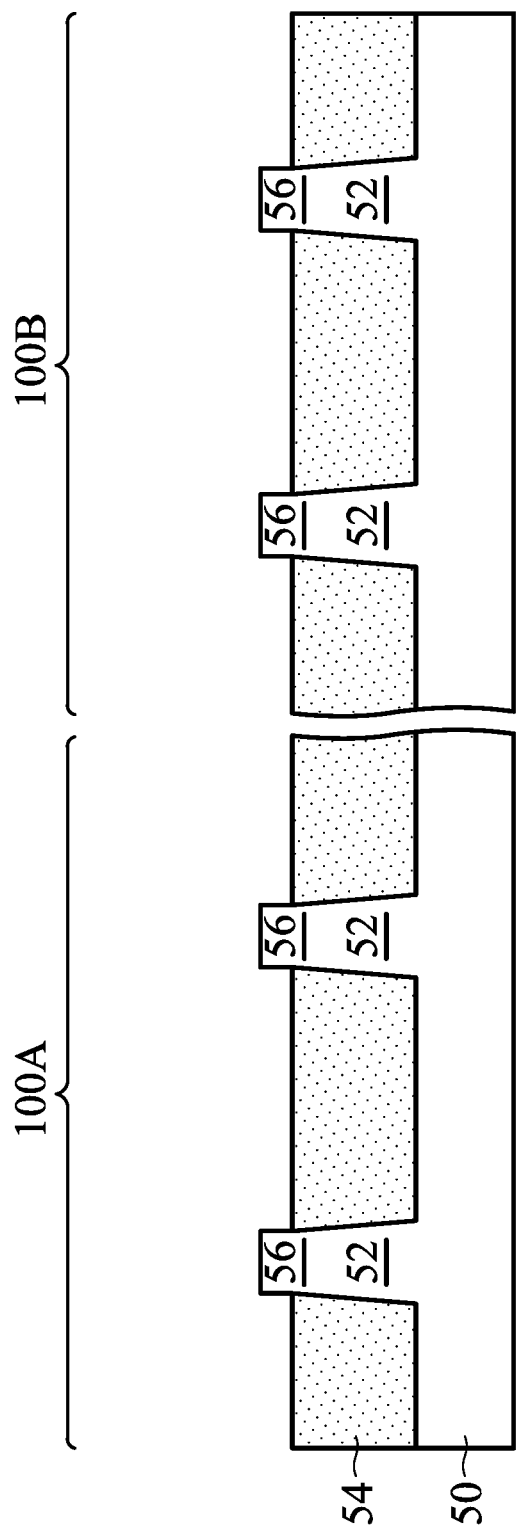
FIGS. 24A, 24B and 24C are cross-sectional views of intermediate stages in the manufacture of a finFET device in accordance with some embodiments.
Figure 24B:
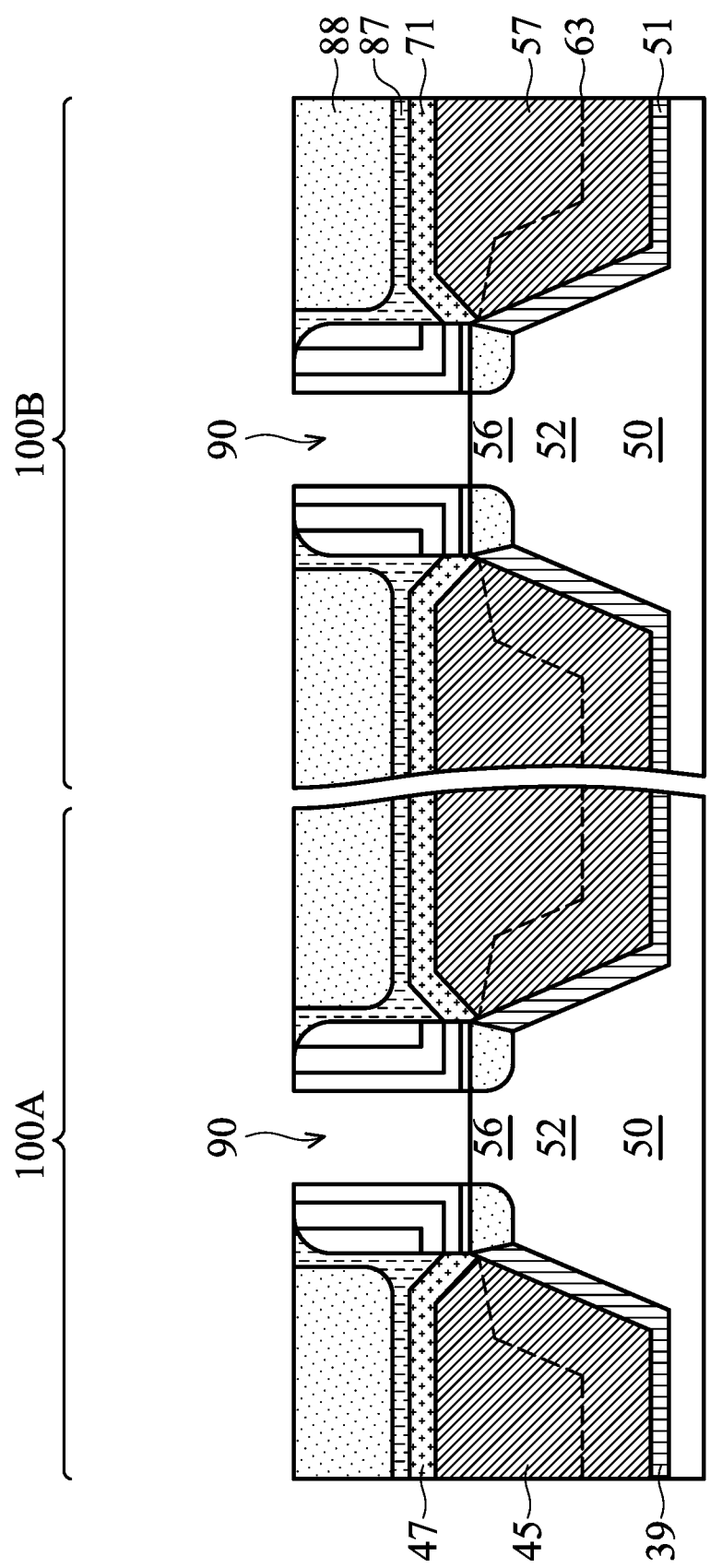
Figure 24C:
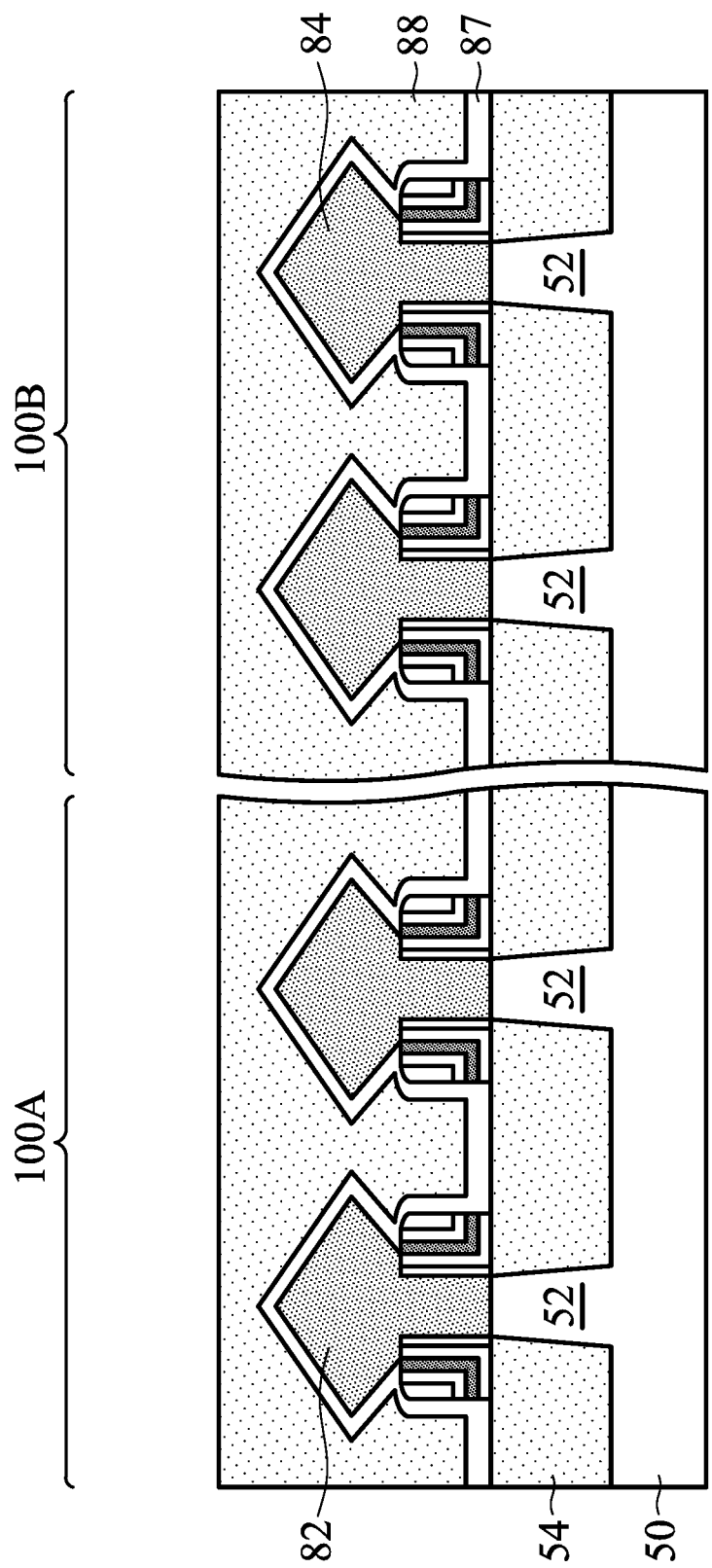

In FIGS. 24A-C, remaining portions of masks 72 and 78 and the dummy gates 70 and 76 are removed in an etching step(s), so that recesses 90 are formed. Each recess 90 exposes a channel region of a respective fin 56. Each channel region is disposed between neighboring pairs of epitaxial source/drain regions 82 and 84. During the removal, the dummy dielectric layer 58 may be used as an etch stop layer when the dummy gates 70 and 76 are etched. The dummy dielectric layer 58 may then be removed after the removal of the dummy gates 70 and 76.

Figure 25A:
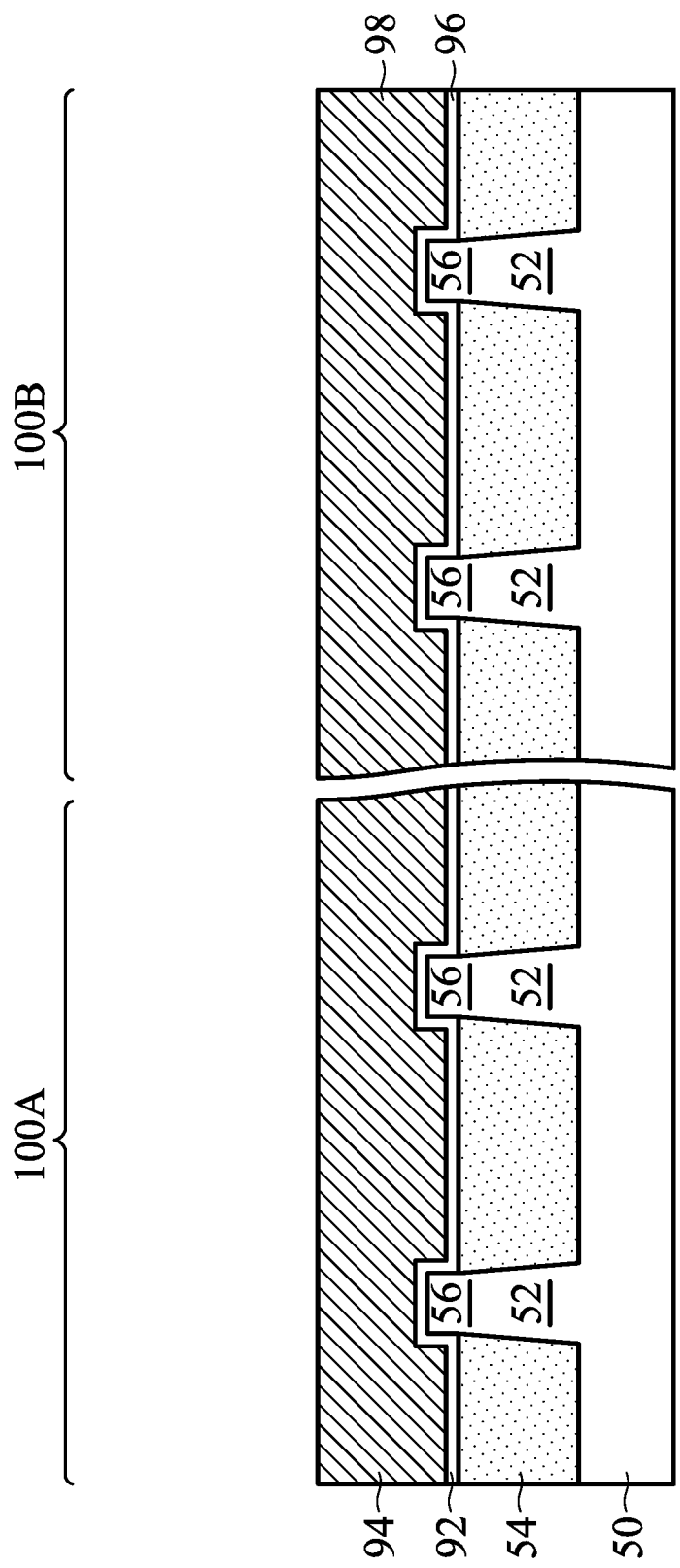
FIGS. 25A and 25B are cross-sectional views of intermediate stages in the manufacture of a finFET device in accordance with some embodiments.
Figure 25B:
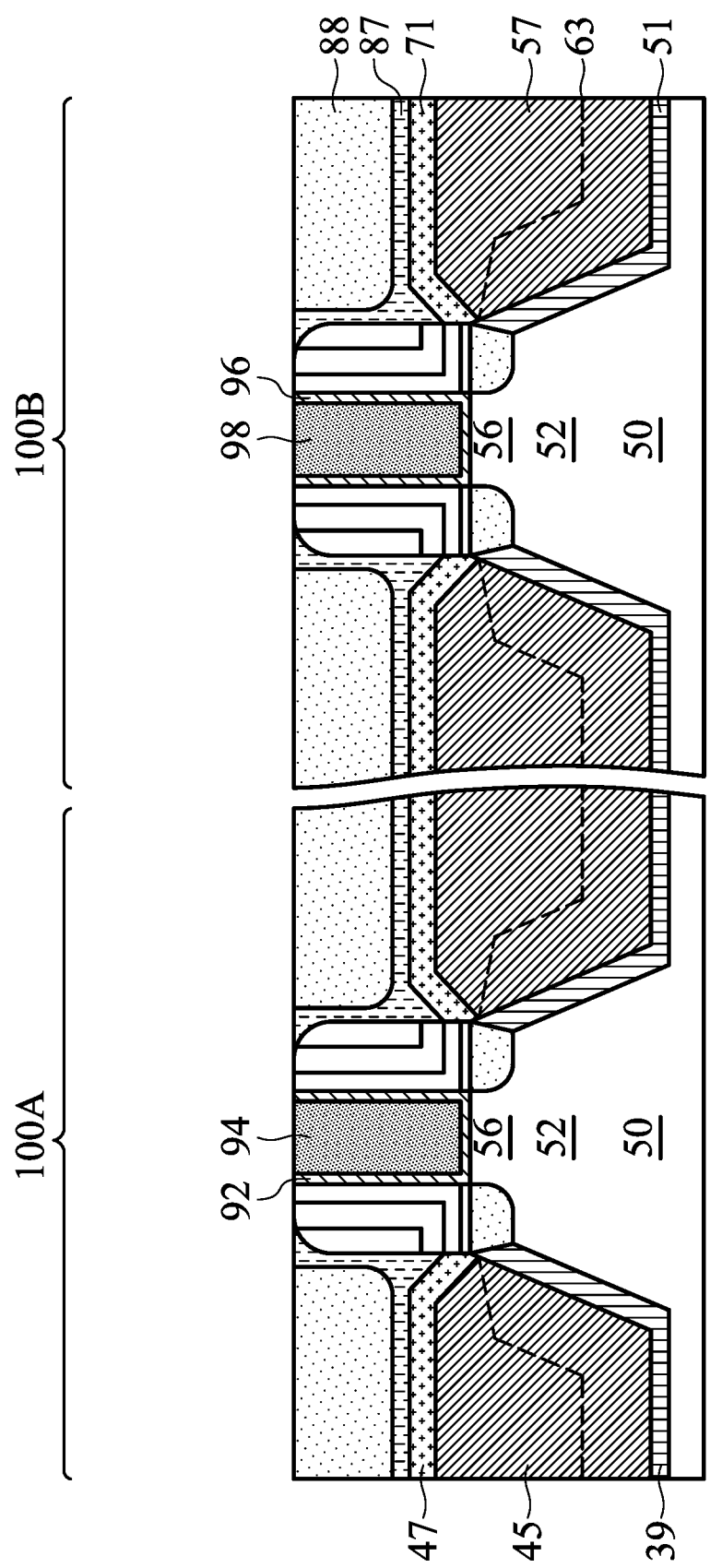

In FIGS. 25A-B, gate dielectric layers 92 and 96 and gate electrodes 94 and 98 are formed for replacement gates. Gate dielectric layers 92 and 96 are deposited in recesses 90, such as on the top surfaces and the sidewalls of the fins 56 and on sidewalls of the gate spacers 80, and on a top surface of the ILD 88. In accordance with some embodiments, gate dielectric layers 92 and 96 comprise silicon oxide, silicon nitride, or multilayers thereof. In other embodiments, gate dielectric layers 92 and 96 include a high-k dielectric material, and in these embodiments, gate dielectric layers 92 and 96 may have a k value greater than about 7.0, and may include a metal oxide or a silicate of Hf, Al, Zr, La, Mg, Ba, Ti, Pb, and combinations thereof. The formation methods of gate dielectric layers 92 and 96 may include Molecular-Beam Deposition (MBD), Atomic Layer Deposition (ALD), PECVD, and the like.

Next, gate electrodes 94 and 98 are deposited over gate dielectric layers 92 and 96, respectively, and fill the remaining portions of the recesses 90. Gate electrodes 94 and 98 may be made of a metal-containing material such as TiN, TaN, TaC, Co, Ru, Al, W, combinations thereof, or multilayers thereof. After the filling of gate electrodes 94 and 98, a planarization process, such as a CMP, may be performed to remove the excess portions of gate dielectric layers 92 and 96 and the material of gate electrodes 94 and 98, which excess portions are over the top surface of ILD 88. The resulting remaining portions of material of gate electrodes 94 and 98 and gate dielectric layers 92 and 96 thus form replacement gates of the resulting finFETs.

The formation of the gate dielectric layers 92 and 96 may occur simultaneously such that the gate dielectric layers 92 and 96 are made of the same materials, and the formation of the gate electrodes 94 and 98 may occur simultaneously such that the gate electrodes 94 and 98 are made of the same materials. However, in other embodiments, the gate dielectric layers 92 and 96 may be formed by distinct processes, such that the gate dielectric layers 92 and 96 may be made of different materials, and the gate electrodes 94 and 98 may be formed by distinct processes, such that the gate electrodes 94 and 98 may be made of different materials. Various masking steps may be used to mask and expose appropriate regions when using distinct processes.

Figure 26A:
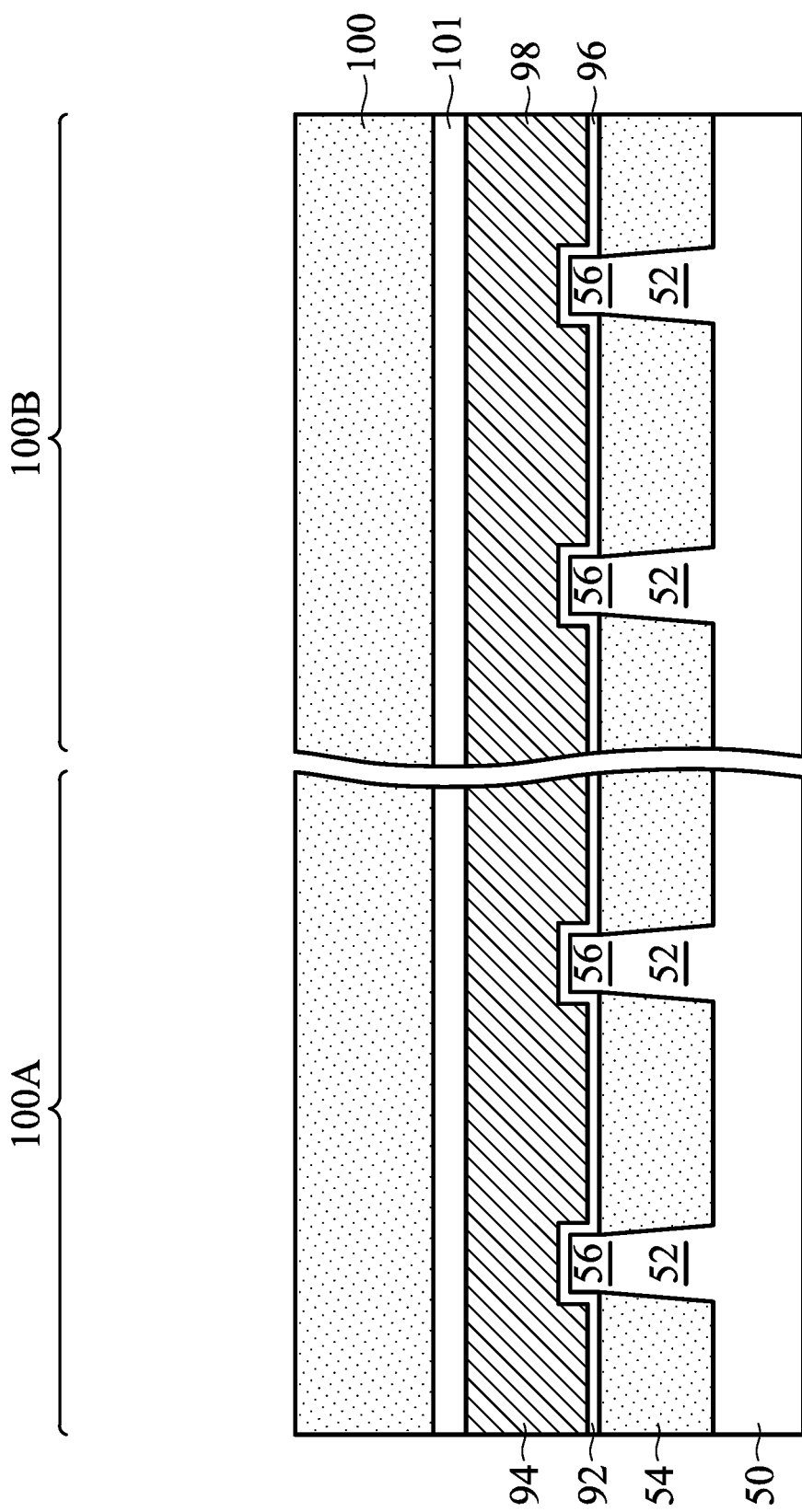
FIGS. 26A and 26B are cross-sectional views of intermediate stages in the manufacture of a finFET device in accordance with some embodiments.
Figure 26B:
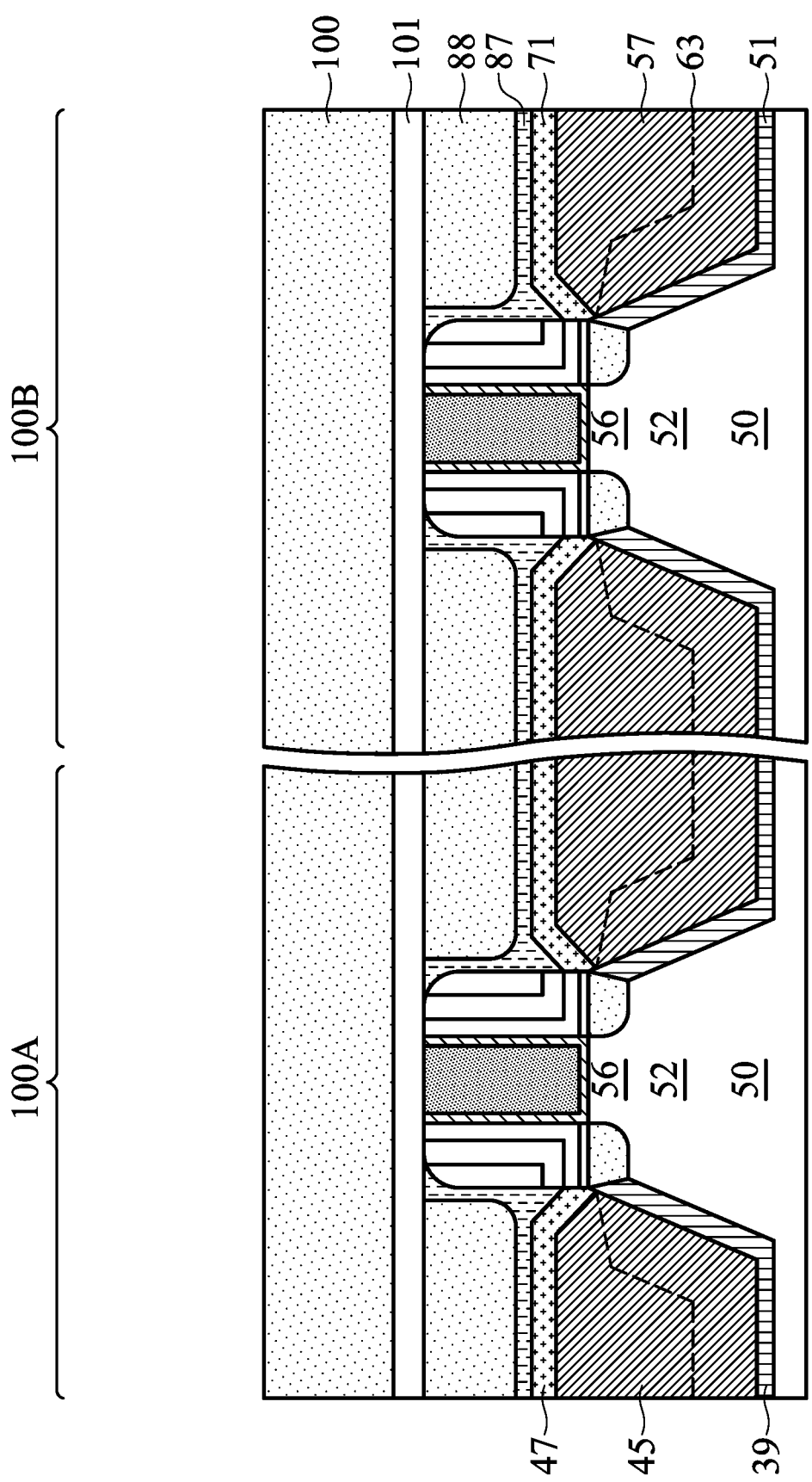

In FIGS. 26A-B, an etch stop layer 101 and an ILD 100 is deposited over ILD 88. In an embodiment, the ILD 100 is a flowable film formed by a flowable CVD. In some embodiments, the ILD 100 is formed of a dielectric material such as Phospho-Silicate Glass (PSG), Boro-Silicate Glass (BSG), Boron-Doped Phospho-Silicate Glass (BPSG), undoped Silicate Glass (USG), or the like, and may be deposited by any suitable method, such as CVD, or PECVD. The etch stop layer 101 may be formed of any suitable material. In some embodiments, the etch stop layer 101 is formed of silicon nitride or the like, and may be deposited by any suitable method, such as ALD, CVD, PECVD, or the like.

Figure 27A:
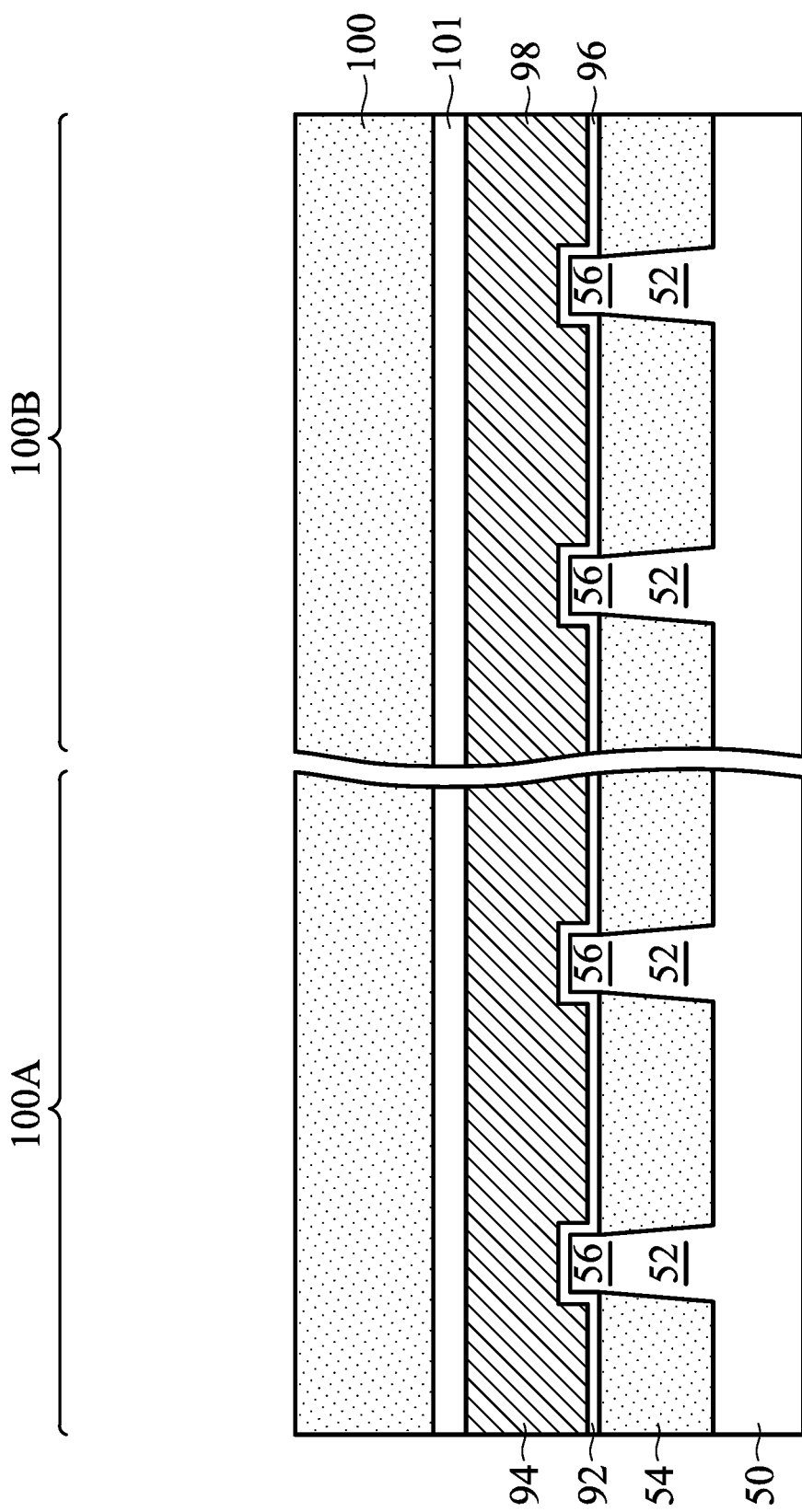
FIGS. 27A and 27B are cross-sectional views of intermediate stages in the manufacture of a finFET device in accordance with some embodiments.
Figure 27B:
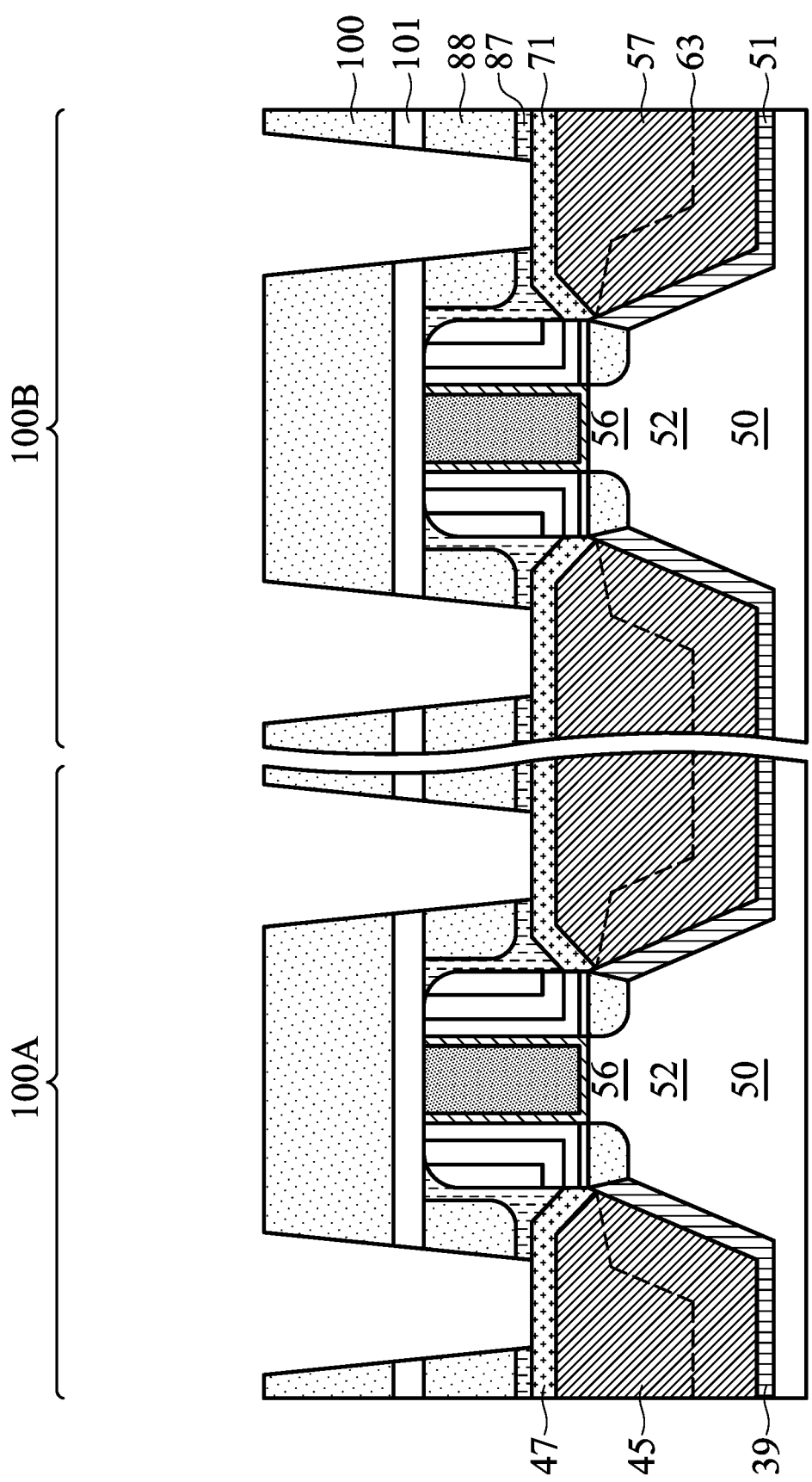

In FIGS. 27A-B, openings are formed in ILD 100, etch stop layer 101 and ILD 88, where the openings expose a section of capping layer 71 in second region 100B and capping layer 47 in first region 100A. The openings may be formed using any suitable method, such as by depositing a mask (not shown), patterning the mask (for example using acceptable lithography techniques), and performing an etching process through the mask, after which openings have been created in ILD 88, ILD 100 and etch stop layer 101 as depicted in FIG. 27B. In some embodiments, sidewalls of the openings may be tapered. In other embodiments, sidewalls of the openings may be substantially perpendicular to a major surface of ILD 100.

FIGS. 28A-B through 30A-B depict the formation of source/drain silicide regions 130. According to some embodiments, electrical connectors may subsequently be formed to connect to the source/drain regions 82 and 84 (See FIGS. 33A-B). Such electrical connectors may be formed by depositing one or more thin metal layers over source/drain regions 82 and 84 and then performing an anneal. The anneal causes a reaction between the thin metal layers and silicon in the source/drain regions, creating a metal silicide regions in the source/drain regions 82 and 84. It is possible to control the parameters of the silicidation to control the distance to which the silicide regions extend into the epitaxially grown capping layers 47 and 71 and epitaxy layers 45 and 57. In some embodiments, the silicidation may be controlled in region 100B, i.e. the PMOS region, so that the source/drain silicide regions consume the capping layer 71 and land on a region of epitaxy layers 57 that have a highest concentration of germanium. In some embodiments, the region of epitaxy layers 57 that have a highest concentration of germanium is the interface of epitaxy layers 57 and capping layer 71. As such, in some embodiments, source/drain silicide regions in the second region 100B are formed to consume the capping layers 71 and land at the interface of the capping layers 71 and epitaxy layers 57. If the source drain metal silicide regions extend past the region with the highest concentration of germanium and into the epitaxy layers 57, the mobility of the source/drain region 84 may be reduced, SiGe strain in the channel region may be damaged, and increased extrusion (i.e. TiGe extrusion) may occur. Controlling the silicidation to have the source drain silicide regions land at the region of highest germanium concentration may increase mobility in the source/drain regions and increase performance of the finFET device.

Figure 28A:
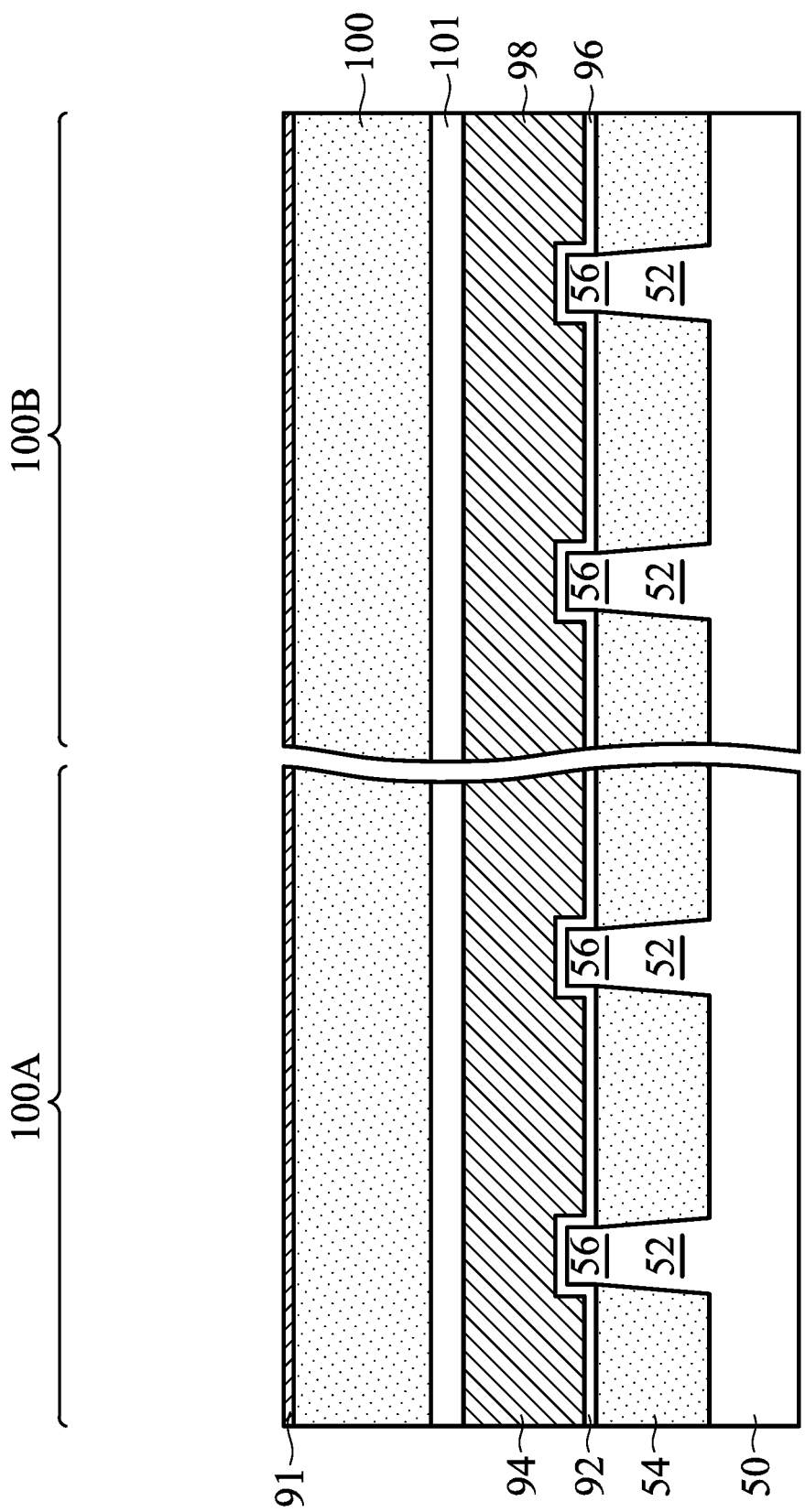
FIGS. 28A and 28B are cross-sectional views of intermediate stages in the manufacture of a finFET device in accordance with some embodiments.
Figure 28B:
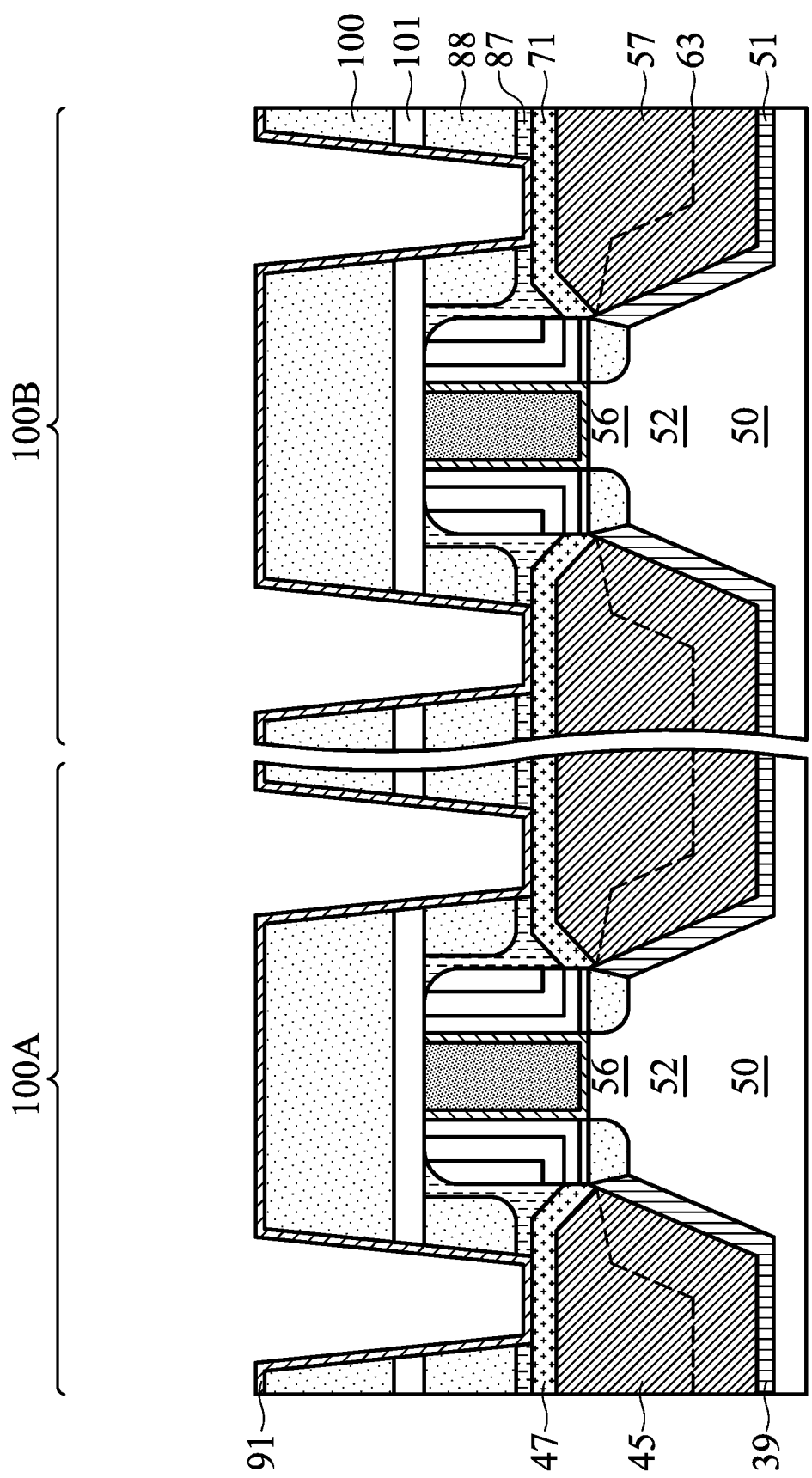

Referring to FIGS. 28A-B, a first metal layer 91 is deposited. First metal layer 91 may include any suitable material, such as titanium, cobalt, nickel, tungsten, or the like. First metal layer 91 may be deposited by any suitable method, such as ALD, CVD, PECVD, or the like. First metal layer 91 extends along the top surfaces of ILD 100 and along the sidewalls of the openings created in ILD 100 and ILD 88. First metal layer 91 also extends along the surfaces of capping layers 71 and 47 exposed through the openings in ILD 100 and ILD 88.

Figure 29A:
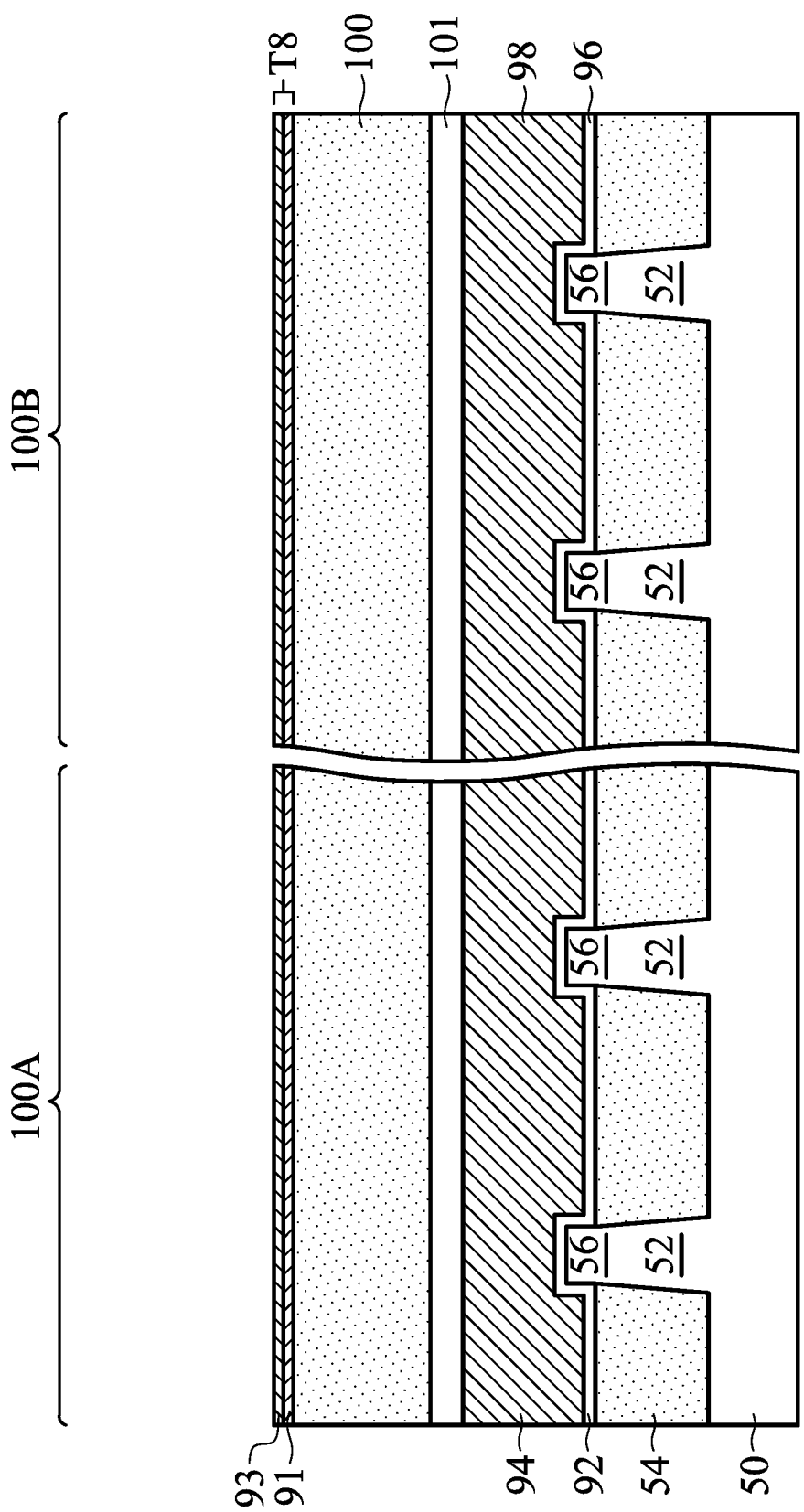
FIGS. 29A and 29B are cross-sectional views of intermediate stages in the manufacture of a finFET device in accordance with some embodiments.
Figure 29B:
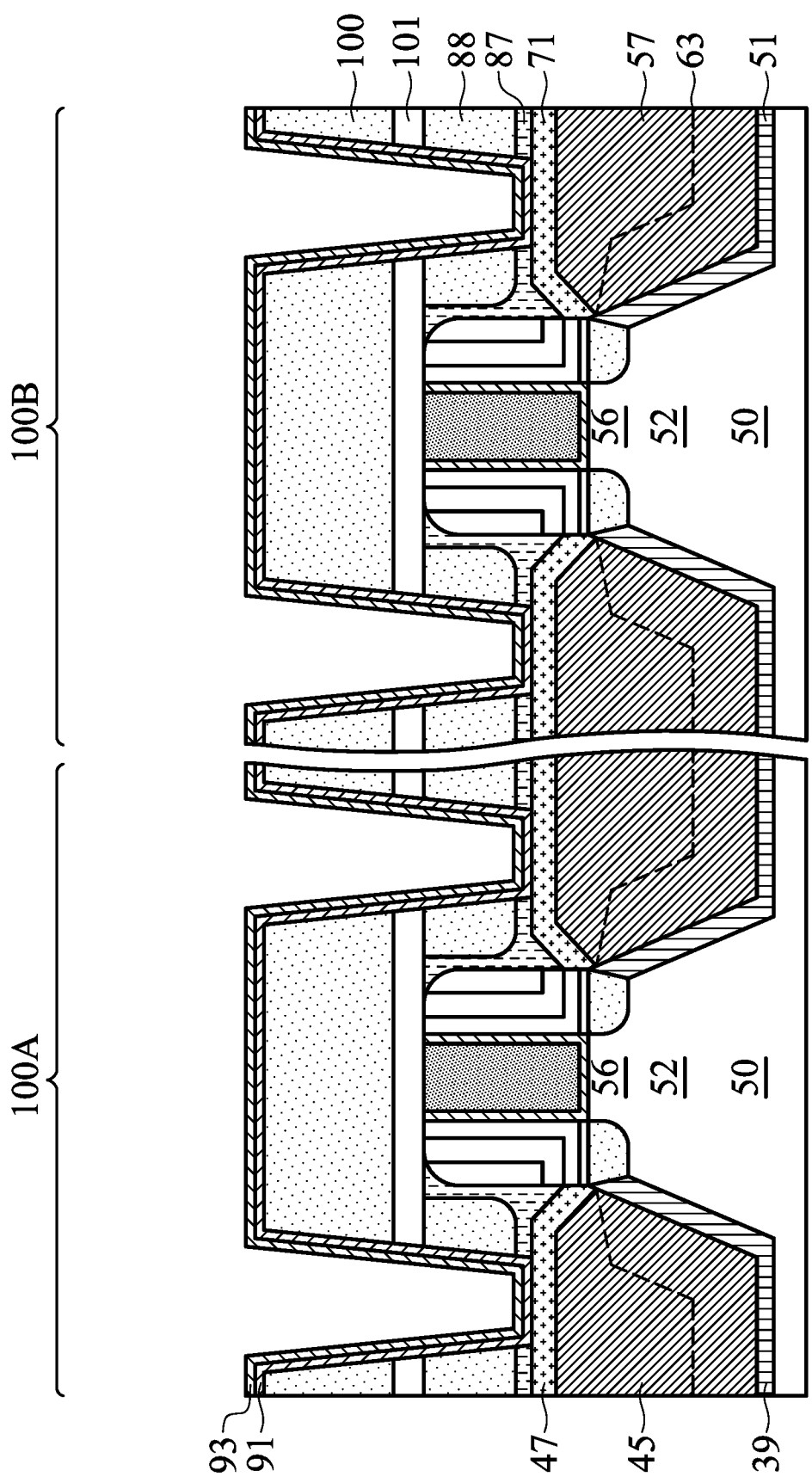

Referring to FIGS. 29A-B, a second metal layer 93 is deposited over first metal layer 91. Second metal layer 93 may include any suitable material. In some embodiments, second metal layer 93 may be a nitride of the material that is used for first metal layer 91. For example, in some embodiments first metal layer 91 may comprise titanium, and second metal layer 93 may comprise titanium nitride. Second metal layer 93 may be deposited by any suitable method, such as ALD, CVD, or PECVD. In some embodiments, a thickness T8 of the first metal layer 91 and the second metal layer 93 combined may be about 50 Å to about 500 Å.

Figure 30A:
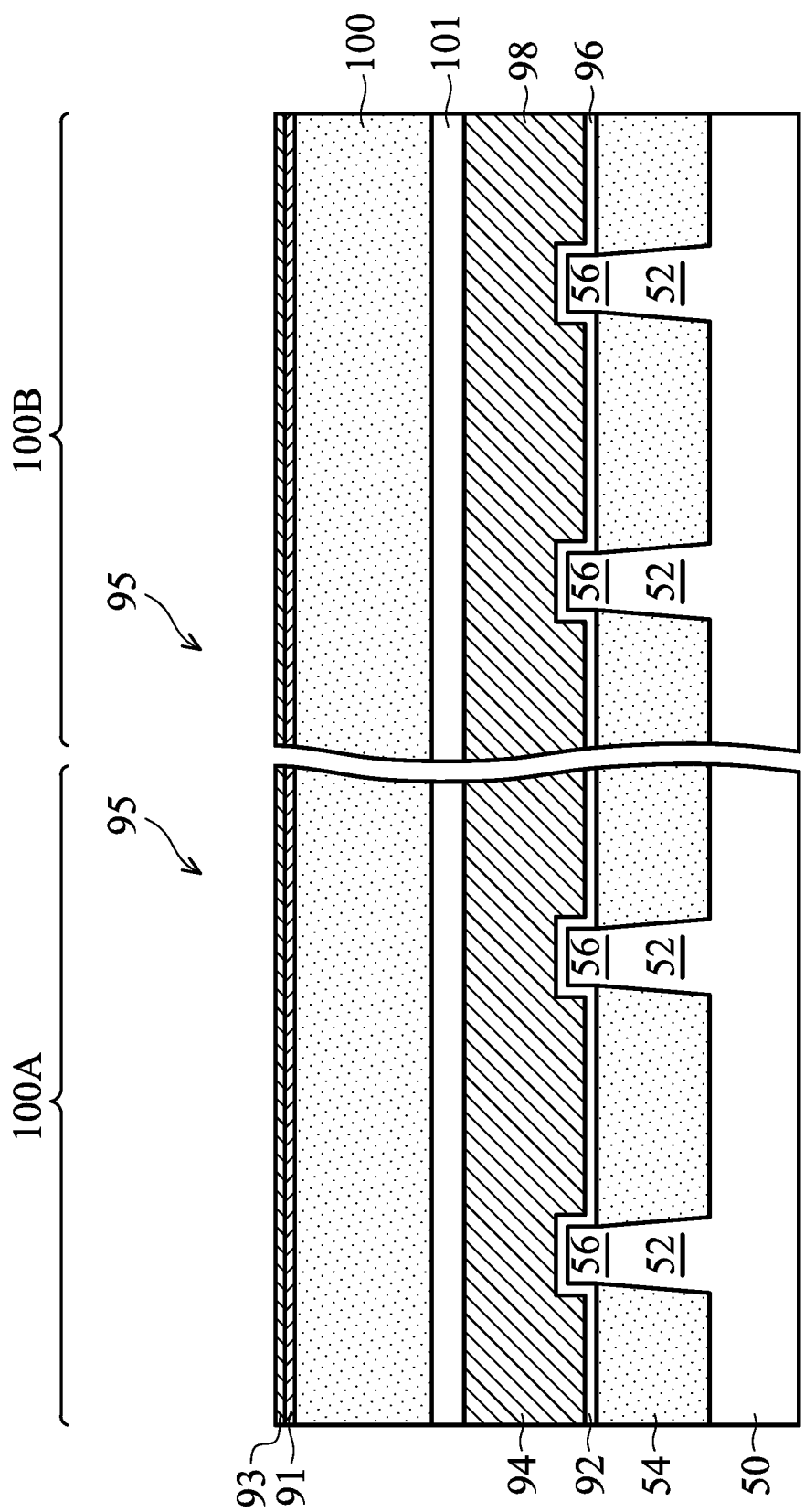
FIGS. 30A and 30B are cross-sectional views of intermediate stages in the manufacture of a finFET device in accordance with some embodiments.
Figure 30B:
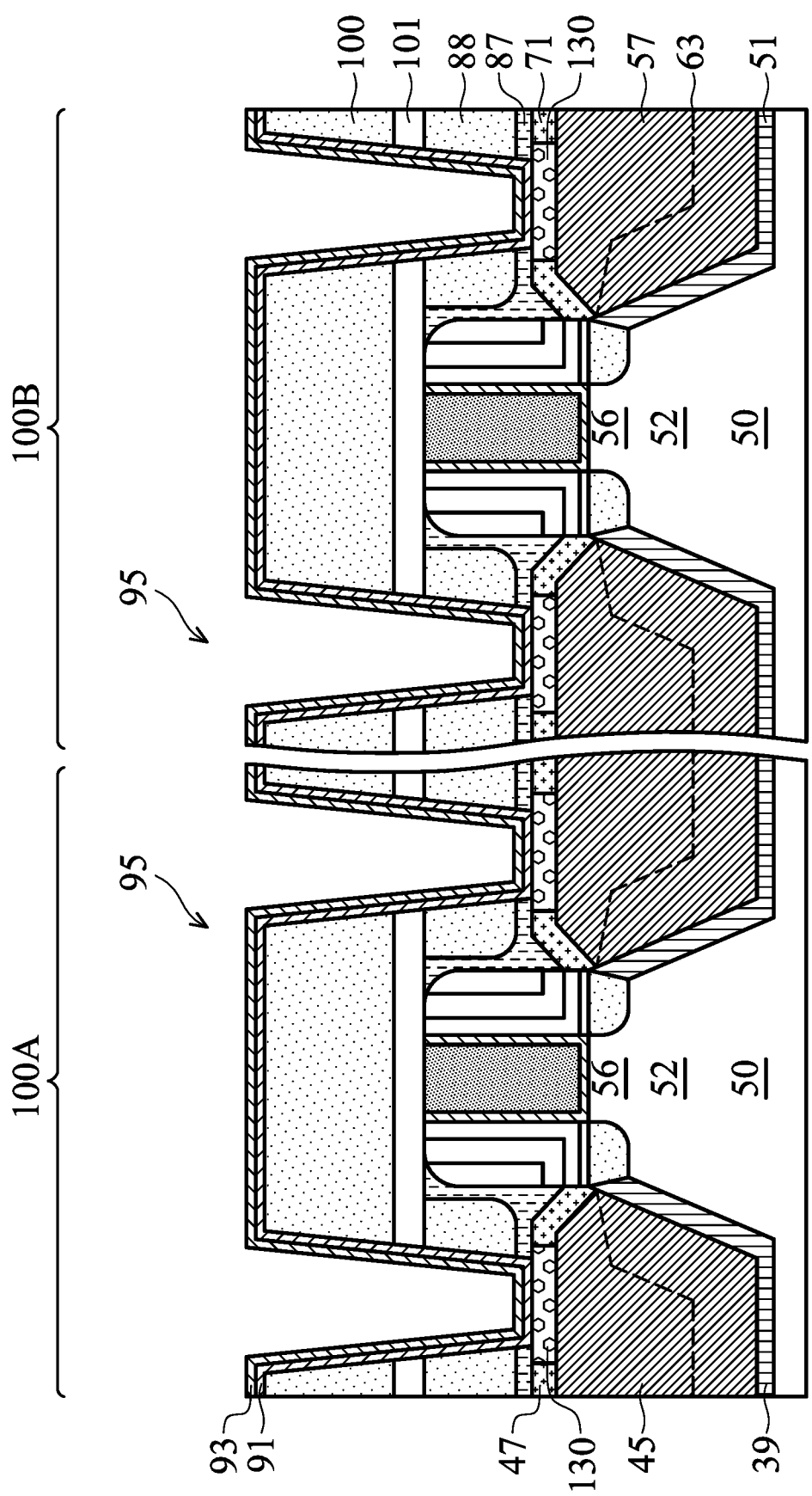

Referring to FIGS. 30A-B, an anneal 95 is performed on the structure shown in FIGS. 29A-B by raising the temperature of the structure to an annealing temperature. In some embodiments the annealing temperature may be about 100° C. to about 2000° C. The anneal causes a reaction between silicon of the capping layers 71 and 47 and the metal of the first metal layer 91 and the second metal layer 93 to create metal silicide regions 130. The parameters of the silicidation are controlled so that, in the second region 100B, the reaction consumes the capping layer 71, such that the source/drain silicide regions 130 extend through the capping layer 71 to contact, but not extend beyond, the interface of capping layers 71 and epitaxy layers 57 where a concentration of germanium is the highest. For example, the deposition time of silicidation is controlled so that the silicidation lands at the interface of capping layers 71 and epitaxy layers 57. As discussed above, when metal silicide regions 130 terminate at the region of highest germanium concentration, which in second region 100B is the interface between capping layer 71 and epitaxy layers 57, mobility may be increased in the source/drain regions 84 and performance of the finFET device may be improved.

Figure 31A:
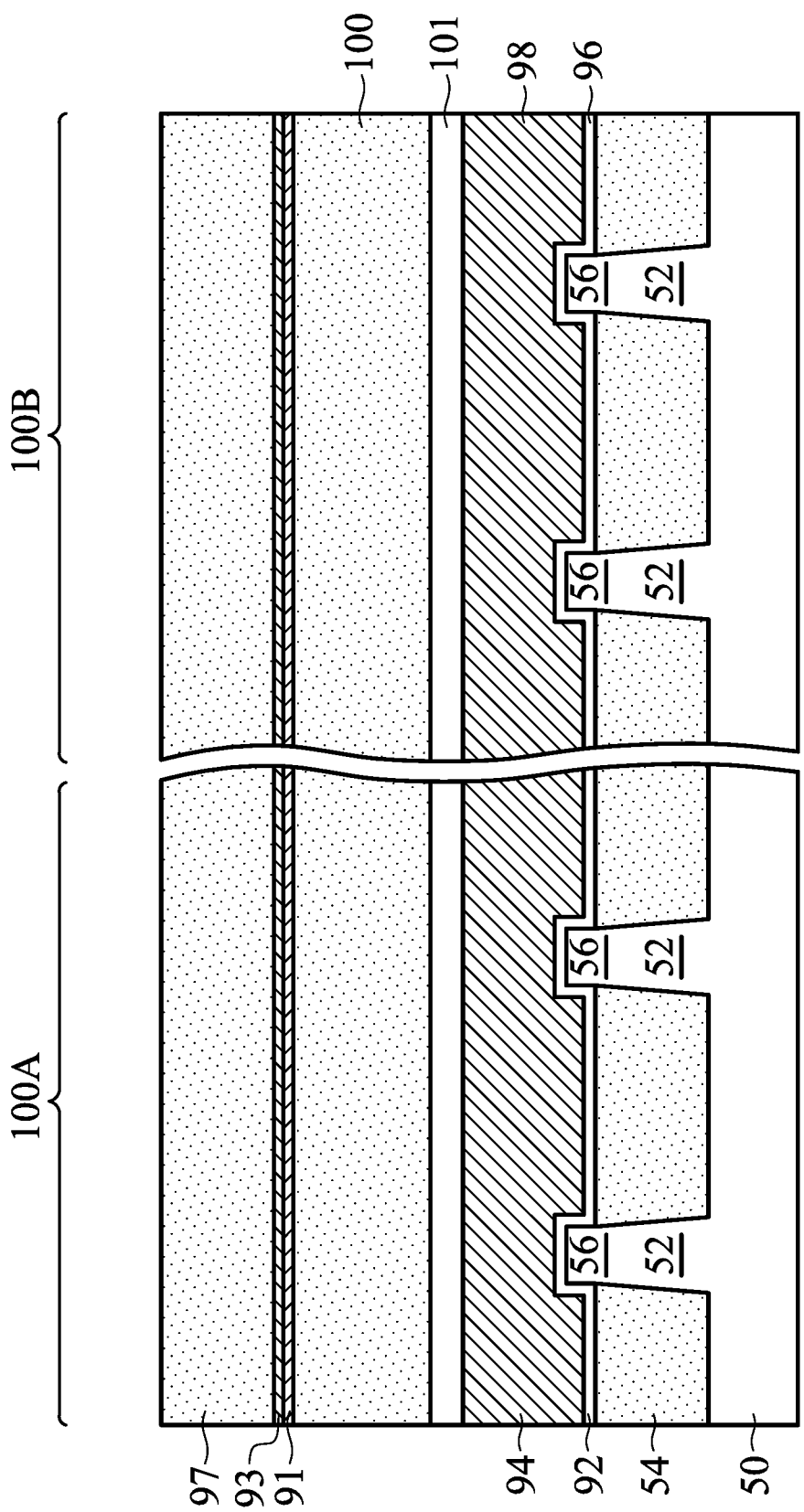
FIGS. 31A and 31B are cross-sectional views of intermediate stages in the manufacture of a finFET device in accordance with some embodiments.
Figure 31B:
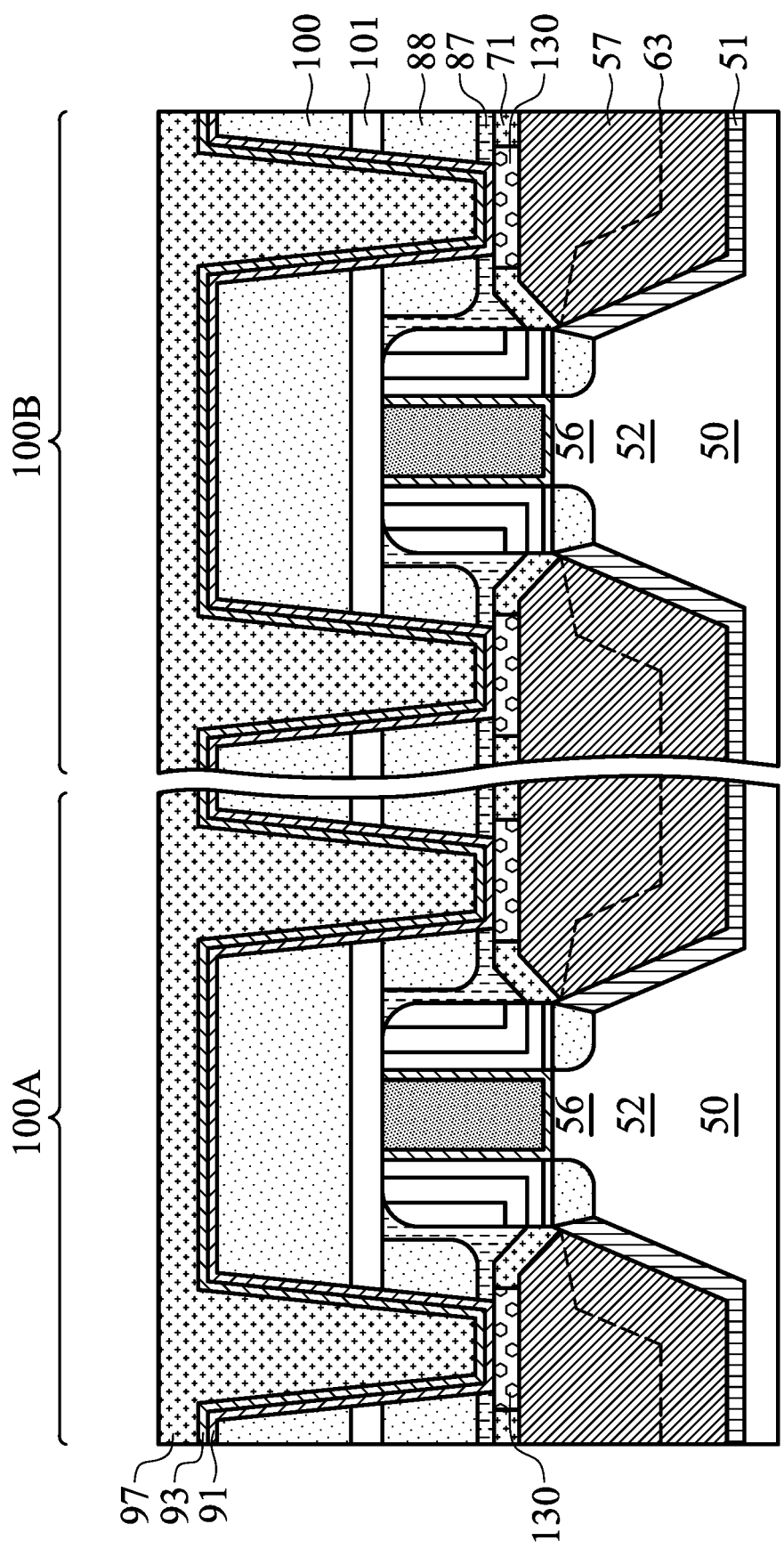

Referring to FIGS. 31A-B, a conductive material 97 such as tungsten, copper, aluminum, titanium, cobalt, silicon, germanium, and/or the like, is formed in openings of ILD 46. In some embodiments, conductive material 97 may be formed using an electroplating process. Conductive material 97 may overflow the openings in ILD 88 and ILD 100.

Figure 32A:
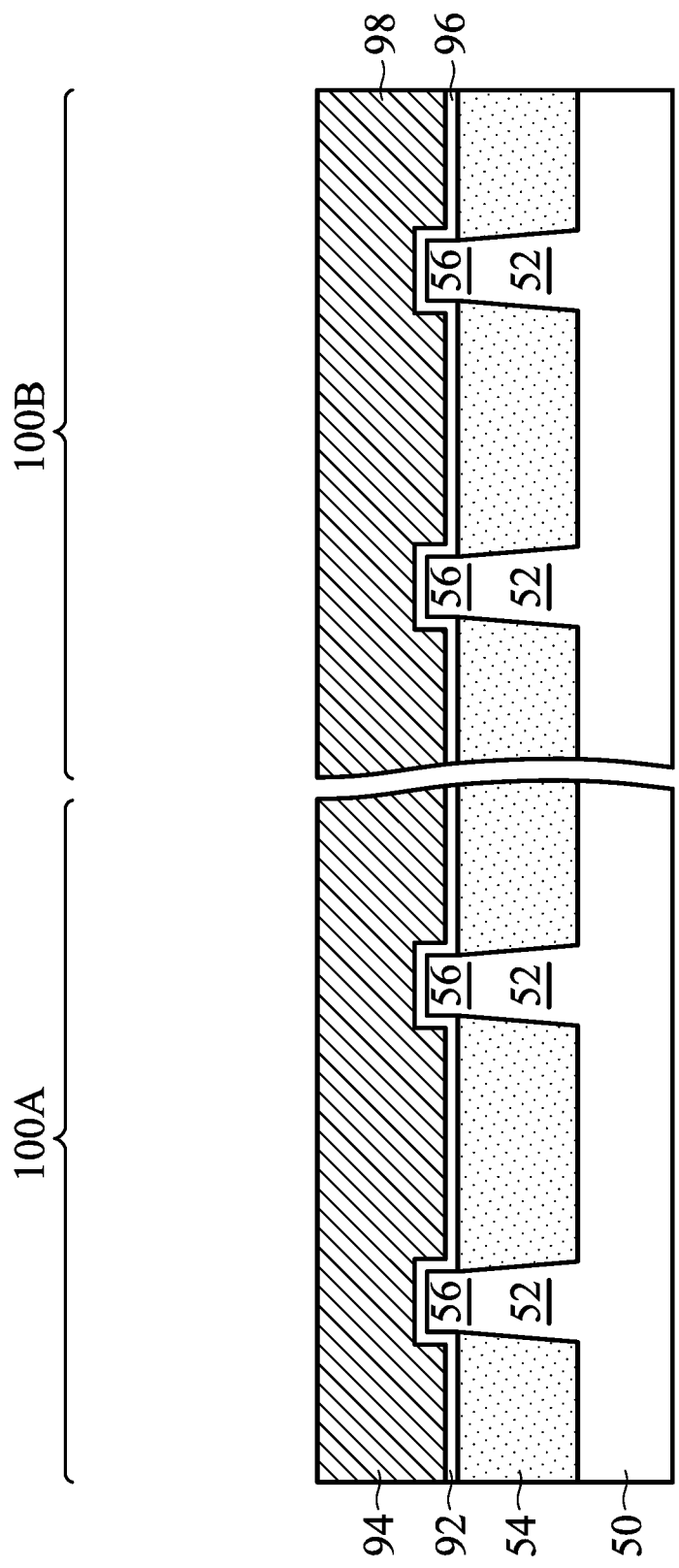
FIGS. 32A and 32B are cross-sectional views of intermediate stages in the manufacture of a finFET device in accordance with some embodiments.
Figure 32B:
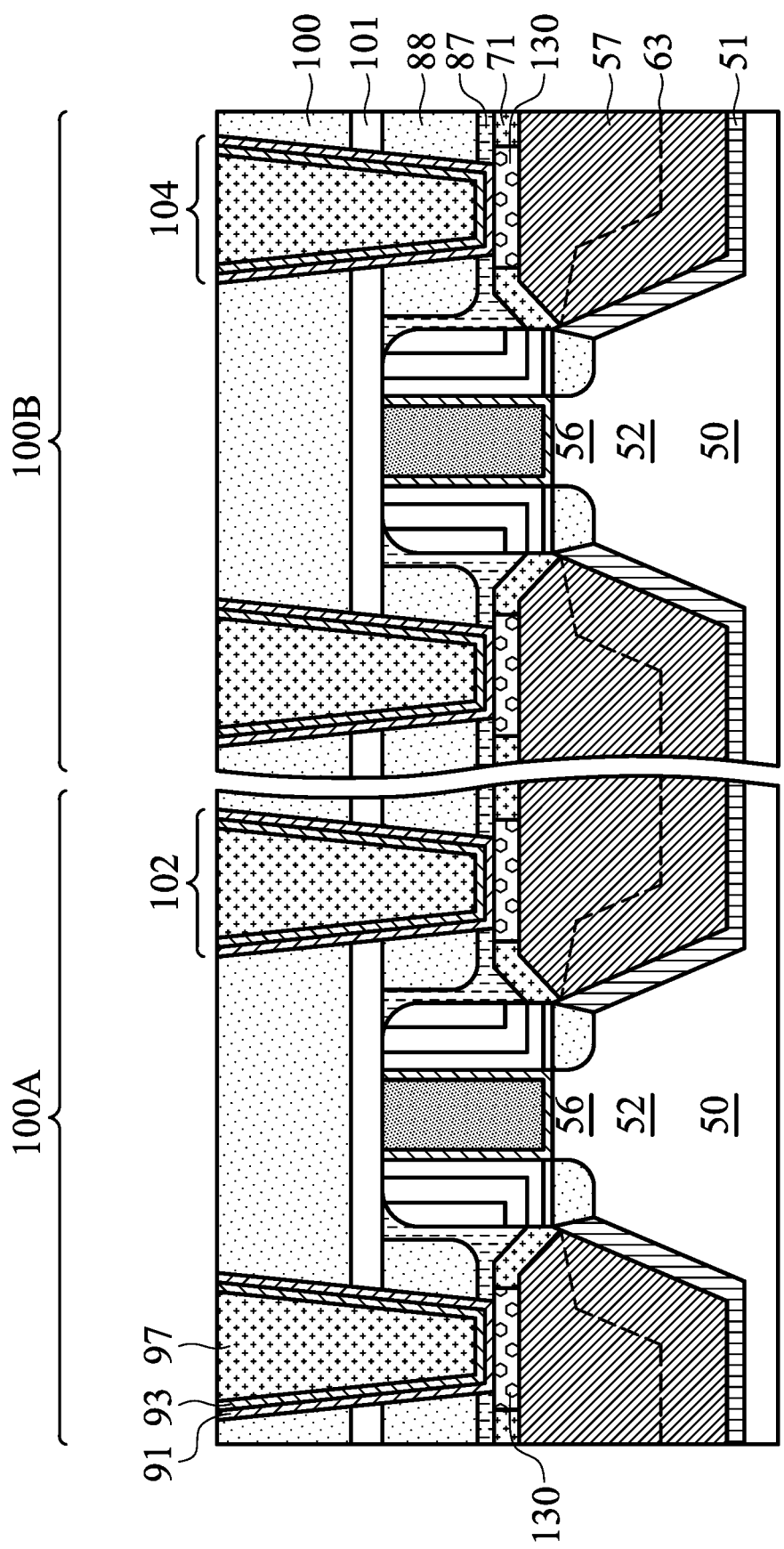

Referring to FIGS. 32A-B, a planarization process may be performed, for example a CMP, to level the top surface of conductive material 97 with the top surface of ILD 100. The remaining conductive material 97, together with first metal layer 91 and second metal layer 93, form contacts 102 in first region 100A and contacts 104 in second region 100B. Contacts 102 and 104 are electrically connected to source/drain regions 82/84 through metal silicide regions 130.

Figure 33A:
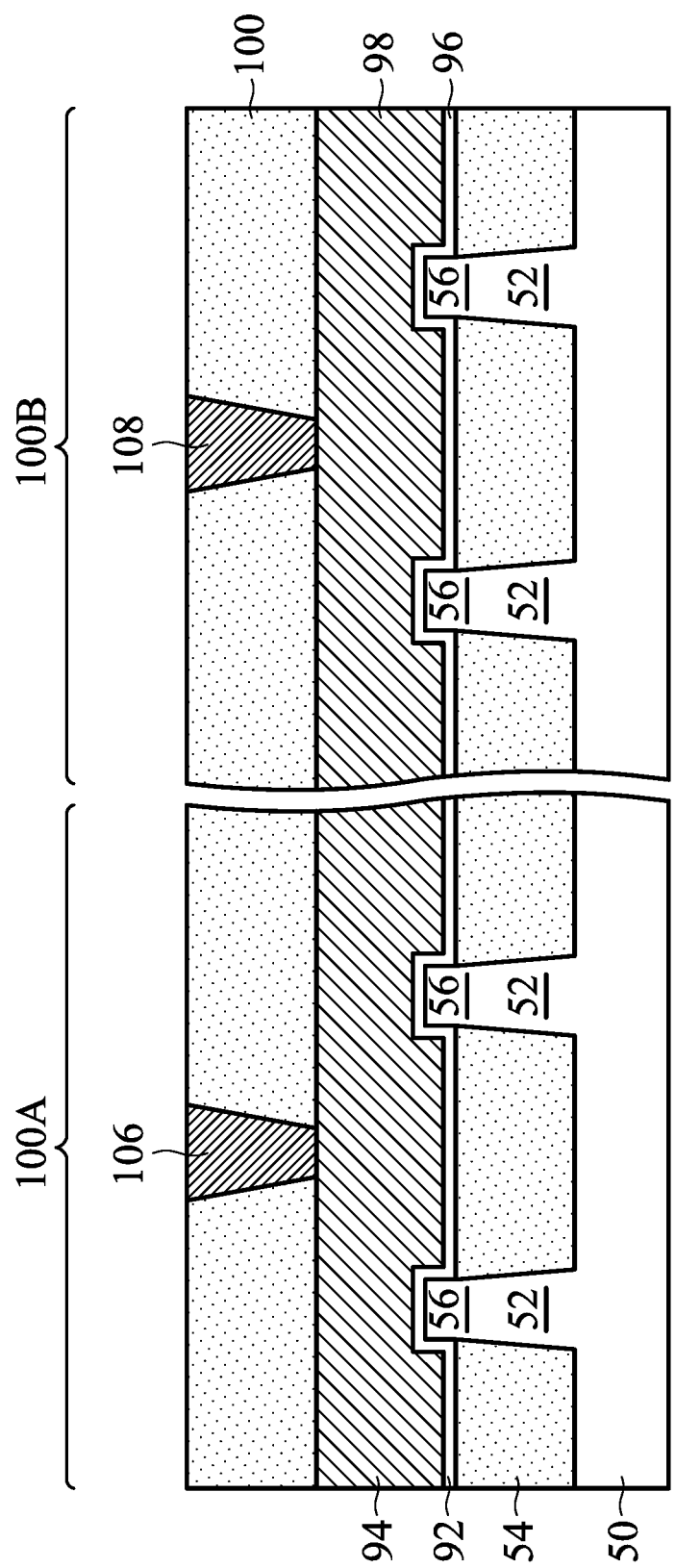
FIGS. 33A and 33B are cross-sectional views of intermediate stages in the manufacture of a finFET device in accordance with some embodiments.
Figure 33B:
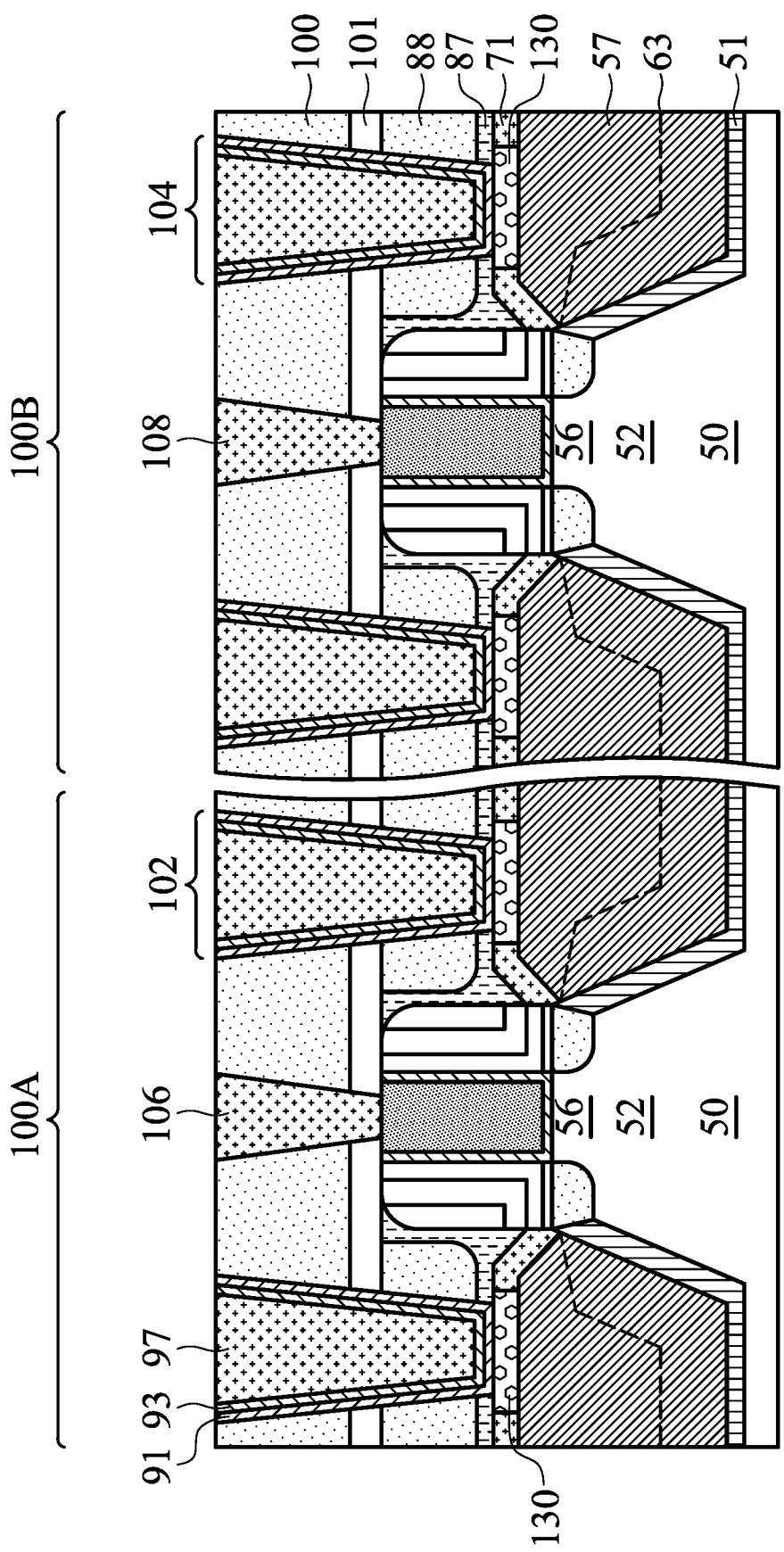

Referring to FIGS. 33A-B, contacts 106 and 108 are formed through ILD 100. In some embodiments, openings may be formed in ILD 100 where contacts 106 and 108 will be formed. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, aluminum, nickel, or the like. A planarization process, such as a CMP, may be performed to remove excess material from a surface of the ILD 100. The remaining liner and conductive material form contacts 106 and 108 in the openings. Contact 106 is physically and electrically coupled to the gate electrode 94, and contact 108 is physically and electrically coupled to the gate electrode 98.

While contacts 102 and 104 are depicted in FIG. 23B in a same cross-section as contacts 106 and 108, this depiction is for purposes of illustration and in some embodiments contacts 102, 104 are disposed in different cross-sections from contacts 106 and 108.

Figure 34:
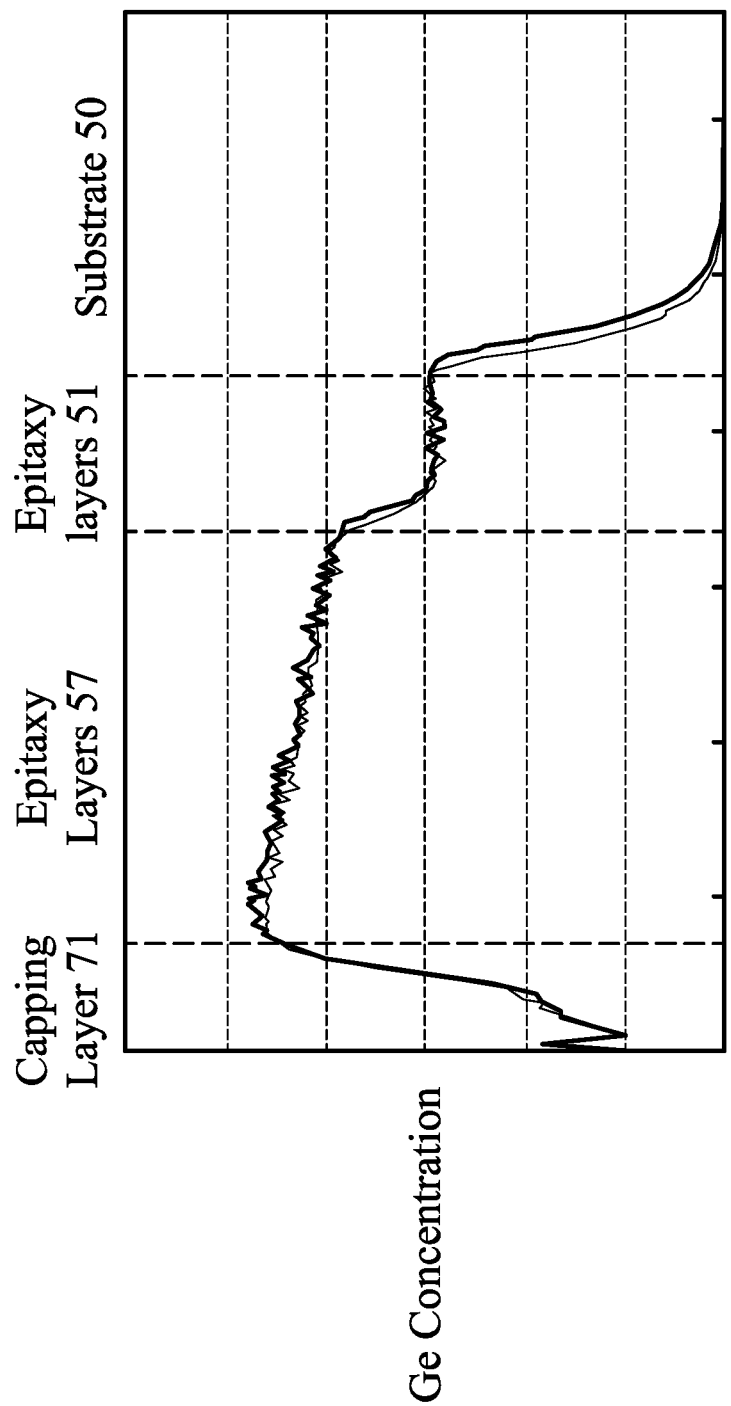
FIG. 34 is a chart illustrating a concentration of germanium in a source/drain region in accordance with some embodiments.

Referring to FIG. 34, a chart is provided depicting a concentration of germanium in a source/drain region of a PMOS device is shown in accordance with some embodiments. For purposes of illustration, the chart of FIG. 34 has been labeled with numerals from the embodiment depicted in FIGS. 33A-B. As shown in FIG. 34, in some embodiments, a concentration of germanium in capping layer 71 may be lowest at a surface of the capping layer 71 that is farthest from substrate 50, and the concentration of germanium in capping layer 71 may increase to be highest at the surface of capping layer 71 that contacts epitaxy layers 57. A concentration of germanium in epitaxy layers 57 may be highest at the surface of epitaxy layers 57 that contact capping layer 71. The concentration of germanium in epitaxy layers 57 may decrease from the surface of epitaxy layers that contact capping layers 71 to a surface of epitaxy layers 57 that contact epitaxy layers 51. A concentration of germanium in epitaxy layers 51 may be highest at the surface of epitaxy layers 51 that contacts epitaxy layers 57 and decrease to a surface of epitaxy layers 51 that contacts substrate 50. As shown in FIG. 34, the concentration of germanium in epitaxy layers 51 may sharply decrease at the interface of epitaxy layers 51 and epitaxy layers 57 and then more gradually decrease, or even slightly increase, as the interface of epitaxy layers 51 and substrate 50 is approached. The concentration of germanium in substrate 50 may be highest at the interface of epitaxy layers 51 and substrate 50 and then decrease to zero. Regarding a concentration of germanium in capping layer 71, epitaxy layers 57 and epitaxy layers 51 combined, the concentration of germanium is highest at the interface of capping layer 71 and epitaxy layers 57 and the concentration of germanium is lowest at the surface of capping layer 71 that is farthest from substrate 50.

As discussed herein, a PMOS device having improved performance is provided. A metal silicidation process is performed to create metal silicide regions connecting the source/drain regions to a conductive feature. The silicidation process is controlled so that the source/drain silicide regions consume a capping layer of the source/drain regions and land on a region of the source/drain regions that have a highest concentration of germanium. In some embodiments, the region of the source/drain region that has a highest concentration of germanium is the interface of the capping layer and the underlying epitaxial region. As such, in some embodiments, source/drain silicide regions in a PMOS device are formed to consume the upper capping layer and land at the interface of the capping layer and the underlying epitaxy layers. If the source drain metal silicide regions extend past the region with the highest concentration of germanium and into the underlying epitaxy layers, the mobility of the source/drain regions may be reduced, SiGe strain in the channel region may be damaged, and increased extrusion (i.e. TiGe extrusion) may occur. Controlling the silicidation to have the source drain silicide regions land at the region of highest germanium concentration may increase mobility in the source/drain regions and increase performance of the finFET device.

A method of forming fin field effect transistor (finFET) is provided in accordance with some embodiments. The method includes forming a gate stack on a substrate. The method also includes etching a plurality of recesses in the substrate, a first recess and a second recess of the plurality of recesses being respectively disposed on opposite sides of the gate stack. The method also includes epitaxially growing a source/drain region in each of the plurality of recesses, where each of the source/drain regions includes a capping layer along a top surface of the respective source/drain region, and where a concentration of a first material in each source/drain region is highest at an interface of the capping layer and an underlying epitaxy layer. The method also includes depositing a plurality of metal-containing layers overlying and contacting each of the source/drain regions. The method also includes performing an anneal, where a metal silicide region is formed in each of the source/drain regions after the anneal, and where each metal silicide region extends through the capping layer and terminates at the surface of the underlying epitaxy layer. In an embodiment, the method also includes depositing an intermediate layer dielectric (ILD) overlying each of the source/drain regions; and forming a plurality of openings in the ILD layer, wherein each opening in the plurality of openings exposes a source/drain region. In an embodiment, the method also includes forming an electrical connector in each opening of the plurality of openings, where each electrical connector contacts and is electrically connected to a metal silicide region. In an embodiment, forming the electrical connector in each opening of the plurality of openings includes performing an electroplating process to deposit tungsten in each opening of the plurality of openings. In an embodiment, the first material includes germanium, and the capping layer includes germanium. In an embodiment, after the anneal each metal silicide region terminates at a location in which the concentration of the first material in the respective source/drain region is highest. In an embodiment, depositing the plurality of metal-containing layers includes depositing a first metal-containing layer and depositing a second metal-containing layer, where the second metal-containing layer is a nitride of a material of the first metal layer. In an embodiment, the first metal-containing layer consists of titanium, and the second metal layer consists of titanium nitride. In an embodiment, a combined thickness of the first metal-containing layer and the second metal layer is about 50 Å to about 500 Å. In an embodiment, the capping layer includes silicon germanium, and the capping layer has a thickness of about 10 Å to about 200 Å. In an embodiment, performing the anneal includes heating the source/drain regions to a temperature of about 100° C. to about 2000° C.

A method is provided in accordance with some embodiments. The method includes forming a gate stack on a substrate. The method also includes forming two source/drain regions in the substrate, where the two source/drain regions are disposed on opposite sides of the gate stack, and forming the two source/drain regions in the substrate includes: etching two recesses in the substrate; epitaxially growing a first region in each of the two recesses, where the first region includes silicon germanium having a first germanium concentration; epitaxially growing a second region in each of the two recesses over the first region, where the second region includes silicon germanium having a second germanium concentration; and epitaxially growing a capping layer over the second region, the capping layer including silicon germanium having a third germanium concentration, where a concentration of germanium in the respective source/drain region is highest an interface of the second region and the capping layer. The method also includes depositing a first metal-containing layer over and contacting each of the two source/drain regions. The method also includes depositing a second metal-containing layer over and contacting the first metal-containing layer. The method also includes annealing the two source/drain regions to form a metal silicide region in each of the source/drain regions, where the metal silicide region of each of the source/drain regions extends through the capping layer and contacts but does not extend beyond the region of highest germanium concentration in the respective source/drain region. In an embodiment the first metal-containing layer includes titanium and the second metal-containing layer includes titanium nitride, and the region of highest germanium concentration in the respective source/drain region corresponds to the interface between the capping layer and the second region prior to the forming of the metal silicide regions. In an embodiment a combined thickness of the first metal layer and the second metal layer is about 50 Å to about 500 Å. In an embodiment the capping layer has a thickness of about 10 Å to about 200 Å. In an embodiment the method also includes forming a first intermediate layer dielectric (ILD) over the two source drain regions; forming a second ILD over the first ILD; forming openings in the first ILD and the second ILD, wherein the openings in the first ILD and the second ILD exposed the metal silicide regions; and electroplating tungsten into each of the openings so that the tungsten contacts the metal silicide regions. In an embodiment the second germanium concentration is higher than the first germanium concentration. In an embodiment the second region includes a bottom layer and an upper layer, where a concentration of germanium in the upper layer is about 45 percent, and where a concentration of germanium in the bottom layer is less than 45 percent.

A fin field effect transistor (finFET) device is provided in accordance with some embodiments. The finFET device includes two source/drain regions disposed on opposite sides of a gate stack, where each source/drain region comprises a capping layer along a top surface of the respective source/drain region, each capping layer overlying a respective epitaxial region, and where a concentration of germanium in each source/drain region is highest at a surface of the respective epitaxial region that contacts the respective capping layer. The finFET device also includes a metal silicide region disposed in each source/drain region, where the metal silicide region in each source/drain region extends through the respective capping layer and contacts but does not extend beyond the surface of the respective epitaxial region. In an embodiment, an intermediate layer dielectric (ILD) is disposed over the two source/drain regions, and a plurality of electrical connectors extends through the ILD in a manner that respective electrical connectors contact one of the metal silicide regions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming fin field effect transistor (FinFET), comprising:
    forming a gate stack over a fin that protrudes above a substrate;
    forming a recess in the fin adjacent to the gate stack;
    forming a source/drain region in the recess, wherein the source/drain region comprises a capping layer and a first epitaxy layer underlying the capping layer, wherein a concentration of a first material in the source/drain region is highest at an interface between the capping layer and the first epitaxy layer; and
    forming a silicide region that extends through the capping layer, wherein the silicide region contacts, but does not extend into, the first epitaxy layer.

2. The method of claim 1, wherein a first surface of the silicide region closest to the substrate is level with a second surface of the capping layer facing the substrate.

3. The method of claim 2, wherein the second surface is laterally adjacent to the first surface and contacts the first surface.

4. The method of claim 1, wherein the first material is germanium, wherein the capping layer and the first epitaxy layer are formed of silicon germanium.

5. The method of claim 1, wherein forming the silicide region comprises:
    depositing a first metal-containing layer and a second metal-containing layer successively over the source/drain region, the second metal-containing layer and the first metal-containing layer comprising different materials; and
    performing an anneal, wherein the first metal-containing layer reacts with the source/drain region to form the silicide region.

6. The method of claim 5, wherein the first metal-containing layer is formed of a metal material, and the second metal-containing layer is formed of a nitride of the metal material.

7. The method of claim 1, wherein the source/drain region further comprises a second epitaxy layer underlying the first epitaxy layer, wherein the first epitaxy layer, the second epitaxy layer, and the capping layer are formed to have different concentrations of the first material.

8. The method of claim 7, wherein the first epitaxy layer has a first concentration of the first material, the second epitaxy layer has a second concentration of the first material, and the capping layer has a third concentration of the first material, wherein the third concentration is lower than the first concentration, and the first concentration is higher than the second concentration.

9. The method of claim 8, further comprising doping the capping layer, the first epitaxy layer, and the second epitaxy layer with a dopant that is a p-type impurity or an n-type impurity, wherein the capping layer has a fourth concentration of the dopant, the first epitaxy layer has a fifth concentration of the dopant, the second epitaxy layer has a sixth concentration of the dopant, wherein the fourth concentration is higher than the fifth concentration, and the fifth concentration is higher than the sixth concentration.

10. The method of claim 1, further comprising:
    depositing an intermediate layer dielectric (ILD) overlying the source/drain region around the gate stack; and
    forming an opening in the ILD to expose the source/drain region, wherein the silicide region is formed at a bottom of the opening.

11. The method of claim 10, further comprising, after forming the silicide region, filling the opening with a metal material to form a source/drain contact.

12. A method of forming a fin field effect transistor (FinFET), comprising:
    forming a gate stack over a fin;
    forming source/drain regions on opposite sides of the gate stack, wherein forming the source/drain regions comprises:
        etching recesses in the fin;
        epitaxially growing a first layer comprising a semiconductor material in the recesses, wherein the first layer has a first concentration of the semiconductor material;
        epitaxially growing a second layer comprising the semiconductor material in the recesses over the first layer, wherein the second layer has a second concentration of the semiconductor material; and
        epitaxially growing a capping layer comprising the semiconductor material over the second layer, the capping layer having a third concentration of the semiconductor material, wherein a concentration of the semiconductor material in the source/drain regions is highest at an interface between the second layer and the capping layer; and
    forming a silicide region in the capping layer over the source/drain regions, wherein a lowermost surface of the silicide region facing the substrate contacts, and is level with, the interface between the second layer and the capping layer.

13. The method of claim 12, wherein the third concentration is lower than the second concentration, and the second concentration is higher than the first concentration.

14. The method of claim 12, further comprising:
    forming a dielectric layer over the source/drain regions and around the gate stack; and
    replacing the gate stack with a metal gate structure.

15. The method of claim 12, wherein the lowermost surface of the silicide region is laterally adjacent to the interface between the second layer and the capping layer.

16. The method of claim 12, wherein forming the silicide region comprises:
    depositing a first metal-containing layer and a second metal-containing layer successively over the source/drain regions, the second metal-containing layer and the first metal-containing layer comprising different materials, wherein the first metal-containing layer is formed of a metal material, and the second metal-containing layer is formed of a nitride of the metal material; and
    performing an anneal, wherein the anneal causes the metal material to react with the source/drain regions to form the silicide region.

17. A method of forming a fin field effect transistor (FinFET), comprising:
    forming a gate over a fin protruding above a substrate;
    etching a trench in the fin adjacent to the gate;
    epitaxially growing a source/drain region in the trench, the source/drain region comprising a first layer, a second layer over the first layer, and a capping layer over the second layer, wherein each of the first layer, the second layer, and the capping layer comprises a first semiconductor material, wherein each of the first layer, the second layer, and the capping layer has a different concentration of the first semiconductor material, wherein a highest concentration of the first semiconductor material is at an interface between the capping layer and the second layer; and forming a silicide region in the capping layer, wherein a first surface of the silicide region closest to the substrate is in contact and level with a second surface of the capping layer facing the substrate.

18. The method of claim 17, wherein forming the silicide region comprise:

forming a dielectric layer over the source/drain region and around the gate;

forming an opening in the dielectric layer to expose the source/drain region;

depositing a first metal-containing layer in the opening on the source/drain region and along sidewalls of the dielectric layer; and performing an anneal process.

19. The method of claim 18, further comprising, after depositing the first metal-containing layer and before performing the anneal process:

depositing a second metal-containing layer over the first metal-containing layer, wherein the first metal-containing layer is formed of a metal, and the second metal-containing layer is formed of a nitride of the metal.

20. The method of claim 17, wherein the first layer comprising germanium and a p-type dopant, the first layer having a first concentration of germanium and a first dopant concentration of the p-type dopant, wherein the second layer comprises germanium and the p-type dopant, the second layer having a second concentration of germanium and a second dopant concentration of the p-type dopant, wherein the capping layer comprises germanium and the p-type dopant, the capping layer having a third concentration of germanium and a third dopant concentration of the p-type dopant, wherein the second concentration of germanium is higher than the first concentration of germanium, and the third concentration of germanium is lower than the second concentration of germanium, wherein the second dopant concentration is higher than the first dopant concentration, and the third dopant concentration is higher than the second dopant concentration.

* * * * *